United States Patent
Ye et al.

(10) Patent No.: US 9,795,001 B2
(45) Date of Patent: Oct. 17, 2017

(54) LED TUBE LAMP WITH OVERCURRENT AND/OR OVERVOLTAGE PROTECTION CAPABILITIES

(71) Applicant: JIAXING SUPER LIGHTING ELECTRIC APPLIANCE CO., LTD, Jiaxing (CN)

(72) Inventors: Qifeng Ye, Jiaxing (CN); Yueqiang Zhang, Jiaxing (CN); Hechen Hu, Jiaxing (CN); Aiming Xiong, Jiaxing (CN)

(73) Assignee: Jiaxing Super Lighting Electric Appliance Co., Ltd., Jiaxing, Zhejiang (CN)

( * ) Notice: Subject to any disclaimer, the term of this patent is extended or adjusted under 35 U.S.C. 154(b) by 5 days.

(21) Appl. No.: 15/054,137

(22) Filed: Feb. 26, 2016

(65) Prior Publication Data

US 2016/0198535 A1   Jul. 7, 2016

Related U.S. Application Data

(63) Continuation-in-part of application No. 14/865,387, filed on Sep. 25, 2015, now Pat. No. 9,609,711.

(30) Foreign Application Priority Data

Sep. 28, 2014   (CN) .......................... 2014 1 0507660
Sep. 28, 2014   (CN) .......................... 2014 1 0508899
(Continued)

(51) Int. Cl.
H05B 37/00   (2006.01)
H05B 41/00   (2006.01)
(Continued)

(52) U.S. Cl.
CPC ........... *H05B 33/089* (2013.01); *F21K 9/278* (2016.08); *F21V 23/006* (2013.01);
(Continued)

(58) Field of Classification Search
None
See application file for complete search history.

(56) References Cited

U.S. PATENT DOCUMENTS 5,575,459 A   11/1996   Anderson
5,921,660 A   7/1999   Yu
(Continued)

FOREIGN PATENT DOCUMENTS

CN   200965185 Y   10/2007
CN   101715265 A   5/2010
(Continued)

OTHER PUBLICATIONS

PCT Search Report for International Application No. PCT/CN2015/090859 dated Jan. 4, 2016.
(Continued)

*Primary Examiner* — Anh Tran
(74) *Attorney, Agent, or Firm* — Muir Patent Law, PLLC

(57) ABSTRACT

A light-emitting diode (LED) tube lamp with overcurrent and/or overvoltage protection capabilities includes a lamp tube, a first rectifying circuit, a filtering circuit, an LED lighting module, and a protection circuit. The lamp tube has pins for receiving an external driving signal. The first rectifying circuit is for rectifying the external driving signal to produce a rectified signal. The filtering circuit is for filtering the rectified signal to produce a filtered signal. The LED lighting module includes an LED module, wherein the LED lighting module is configured to receive the filtered signal to produce a driving signal, and the LED module is for receiving the driving signal for emitting light. The protection
(Continued)

circuit is configured to determine whether to enter a protection state, wherein upon entering the protection state, the protection circuit works to limit or restrain the level of the filtered signal.

29 Claims, 21 Drawing Sheets

(30) Foreign Application Priority Data

| Nov. 6, 2014 | (CN) | 2014 1 0623355 |
|---|---|---|
| Dec. 5, 2014 | (CN) | 2014 1 0734425 |
| Feb. 12, 2015 | (CN) | 2015 1 0075925 |
| Mar. 10, 2015 | (CN) | 2015 1 0104823 |
| Mar. 25, 2015 | (CN) | 2015 1 0133689 |
| Mar. 26, 2015 | (CN) | 2015 1 0134586 |
| Mar. 27, 2015 | (CN) | 2015 1 0136796 |
| Apr. 3, 2015 | (CN) | 2015 1 0155807 |
| Apr. 14, 2015 | (CN) | 2015 1 0173861 |
| Apr. 22, 2015 | (CN) | 2015 1 0193980 |
| May 19, 2015 | (CN) | 2015 1 0259151 |
| May 22, 2015 | (CN) | 2015 1 0268927 |
| May 29, 2015 | (CN) | 2015 1 0284720 |
| Jun. 10, 2015 | (CN) | 2015 1 0315636 |
| Jun. 17, 2015 | (CN) | 2015 1 0338027 |
| Jun. 26, 2015 | (CN) | 2015 1 0364735 |
| Jun. 26, 2015 | (CN) | 2015 1 0372375 |
| Jun. 26, 2015 | (CN) | 2015 1 0373492 |
| Jun. 29, 2015 | (CN) | 2015 1 0378322 |
| Jul. 2, 2015 | (CN) | 2015 1 0391910 |
| Jul. 10, 2015 | (CN) | 2015 1 0406595 |
| Jul. 20, 2015 | (CN) | 2015 1 0428680 |
| Aug. 7, 2015 | (CN) | 2015 1 0482944 |
| Aug. 8, 2015 | (CN) | 2015 1 0483475 |
| Aug. 8, 2015 | (CN) | 2015 1 0486115 |
| Sep. 2, 2015 | (CN) | 2015 1 0555543 |
| Sep. 6, 2015 | (CN) | 2015 1 0557717 |
| Sep. 18, 2015 | (CN) | 2015 1 0595173 |

(51) Int. Cl.

| H05B 33/08 | (2006.01) |
|---|---|
| H05K 1/11 | (2006.01) |
| H05K 3/36 | (2006.01) |
| F21V 23/00 | (2015.01) |
| F21K 9/278 | (2016.01) |
| F21V 29/83 | (2015.01) |
| F21Y 103/10 | (2016.01) |
| F21Y 115/10 | (2016.01) |
| H05K 1/18 | (2006.01) |

(52) U.S. Cl.
CPC ......... *H05B 33/0809* (2013.01); *H05K 1/118* (2013.01); *H05K 3/363* (2013.01); *F21V 29/83* (2015.01); *F21Y 2103/10* (2016.08); *F21Y 2115/10* (2016.08); *H05K 1/189* (2013.01); *H05K 2201/09181* (2013.01); *H05K 2201/10106* (2013.01)

(56) References Cited

U.S. PATENT DOCUMENTS

| 5,936,599 | A | 8/1999 | Reymond |
|---|---|---|---|
| 6,127,783 | A | 10/2000 | Pashley |
| 6,609,813 | B1 | 8/2003 | Showers |
| 6,796,680 | B1 | 9/2004 | Showers |
| 7,033,239 | B2 | 4/2006 | Cunkelman |
| 7,380,961 | B2 | 6/2008 | Moriyama |
| 8,360,599 | B2 | 1/2013 | Ivey |
| 8,525,427 | B2 | 9/2013 | Samoilenko et al. |
| 8,579,463 | B2 | 11/2013 | Clough |
| 8,648,542 | B2 | 2/2014 | Kim et al. |
| 8,749,167 | B2 | 6/2014 | Hsia et al. |
| 8,796,943 | B2 | 8/2014 | Miyamichi |
| 9,210,744 | B2 | 12/2015 | Carmen et al. |
| D761,216 | S | 7/2016 | Jiang |
| 9,447,929 | B2 | 9/2016 | Jiang |
| D768,891 | S | 10/2016 | Jiang et al. |
| 9,521,718 | B2 | 12/2016 | Xiong et al. |
| 2002/0044456 | A1 | 4/2002 | Balestriero |
| 2002/0176262 | A1 | 11/2002 | Tripathi |
| 2003/0102819 | A1 | 6/2003 | Min |
| 2003/0231485 | A1 | 12/2003 | Chien |
| 2004/0095078 | A1 | 5/2004 | Leong |
| 2004/0189218 | A1 | 9/2004 | Leong |
| 2005/0128751 | A1 | 6/2005 | Roberge |
| 2005/0162850 | A1 | 7/2005 | Luk |
| 2005/0207166 | A1 | 9/2005 | Kan |
| 2005/0213321 | A1 | 9/2005 | Lin |
| 2007/0001709 | A1 | 1/2007 | Shen |
| 2007/0127242 | A1 | 6/2007 | Allen et al. |
| 2007/0145915 | A1 | 6/2007 | Roberge |
| 2007/0210687 | A1 | 9/2007 | Axelsson |
| 2007/0274084 | A1 | 11/2007 | Kan |
| 2008/0030981 | A1 | 2/2008 | Mrakovich |
| 2008/0192476 | A1 | 8/2008 | Hiratsuka |
| 2008/0278941 | A1 | 11/2008 | Logan |
| 2009/0161359 | A1 | 6/2009 | Siemiet |
| 2010/0096976 | A1 | 4/2010 | Park |
| 2010/0102729 | A1 | 4/2010 | Katzir |
| 2010/0181925 | A1 | 7/2010 | Ivey et al. |
| 2010/0220469 | A1 | 9/2010 | Ivey et al. |
| 2010/0253226 | A1 | 10/2010 | Oki |
| 2011/0038146 | A1 | 2/2011 | Chen |
| 2011/0057572 | A1* | 3/2011 | Kit ............... H05B 33/0809 315/185 R |
| 2011/0090684 | A1 | 4/2011 | Logan |
| 2011/0121756 | A1* | 5/2011 | Thomas ......... H05B 33/0809 315/294 |
| 2011/0148313 | A1 | 6/2011 | Ramaker |
| 2011/0149563 | A1 | 6/2011 | Hsia et al. |
| 2011/0176297 | A1 | 7/2011 | Hsia et al. |
| 2011/0181190 | A1 | 7/2011 | Lin et al. |
| 2011/0216538 | A1 | 9/2011 | Logan |
| 2011/0260614 | A1 | 10/2011 | Hartikka et al. |
| 2012/0069556 | A1 | 3/2012 | Bertram |
| 2012/0106157 | A1 | 5/2012 | Simon |
| 2012/0153873 | A1 | 6/2012 | Hayashi |
| 2012/0181952 | A1 | 7/2012 | Rooer |
| 2012/0235578 | A1 | 9/2012 | Miller |
| 2012/0299501 | A1 | 11/2012 | Kost et al. |
| 2012/0300445 | A1 | 11/2012 | Chu et al. |
| 2012/0313540 | A1 | 12/2012 | Lin |
| 2013/0050998 | A1 | 2/2013 | Chu |
| 2013/0170245 | A1 | 7/2013 | Hong |
| 2013/0182425 | A1 | 7/2013 | Seki |
| 2013/0200797 | A1 | 8/2013 | Timmermans |
| 2013/0320869 | A1 | 12/2013 | Jans |
| 2014/0035463 | A1 | 2/2014 | Miyamichi |
| 2014/0055029 | A1 | 2/2014 | Jans |
| 2014/0071667 | A1 | 3/2014 | Hayashi |
| 2014/0153231 | A1 | 6/2014 | Bittmann |
| 2014/0226320 | A1 | 8/2014 | Halliwell |
| 2014/0239827 | A1 | 8/2014 | Park |
| 2014/0265900 | A1 | 9/2014 | Sadwick et al. |
| 2015/0009688 | A1 | 1/2015 | Timmermans |
| 2015/0077001 | A1 | 3/2015 | Takahashi |
| 2015/0173138 | A1 | 6/2015 | Roberts |
| 2015/0176770 | A1 | 6/2015 | Wilcox et al. |
| 2015/0351171 | A1 | 12/2015 | Tao et al. |
| 2016/0081147 | A1 | 3/2016 | Guang |
| 2016/0091147 | A1 | 3/2016 | Jiang et al. |
| 2016/0091156 | A1 | 3/2016 | Li et al. |
| 2016/0091179 | A1 | 3/2016 | Jiang et al. |
| 2016/0102813 | A1 | 4/2016 | Ye et al. |
| 2016/0178135 | A1 | 6/2016 | Xu et al. |

(56) References Cited

U.S. PATENT DOCUMENTS

| | | |
|---|---|---|
| 2016/0178137 A1 | 6/2016 | Jiang |
| 2016/0178138 A1 | 6/2016 | Jiang |
| 2016/0198535 A1 | 7/2016 | Ye et al. |
| 2016/0212809 A1 | 7/2016 | Xiong et al. |
| 2016/0215936 A1 | 7/2016 | Jiang |
| 2016/0215937 A1 | 7/2016 | Jiang |
| 2016/0219658 A1 | 7/2016 | Xiong et al. |
| 2016/0219666 A1 | 7/2016 | Xiong et al. |
| 2016/0219672 A1 | 7/2016 | Liu |
| 2016/0223180 A1 | 8/2016 | Jiang |
| 2016/0223182 A1 | 8/2016 | Jiang |
| 2016/0229621 A1 | 8/2016 | Jiang et al. |
| 2016/0255694 A1 | 9/2016 | Jiang et al. |
| 2016/0255699 A1 | 9/2016 | Ye et al. |
| 2016/0270163 A1 | 9/2016 | Hu et al. |
| 2016/0270164 A1 | 9/2016 | Xiong et al. |
| 2016/0270165 A1 | 9/2016 | Xiong et al. |
| 2016/0270166 A1 | 9/2016 | Xiong et al. |
| 2016/0270173 A1 | 9/2016 | Xiong |
| 2016/0270184 A1 | 9/2016 | Xiong et al. |
| 2016/0290566 A1 | 10/2016 | Jiang et al. |
| 2016/0290567 A1 | 10/2016 | Jiang et al. |
| 2016/0290568 A1 | 10/2016 | Jiang et al. |
| 2016/0290569 A1 | 10/2016 | Jiang et al. |
| 2016/0290570 A1 | 10/2016 | Jiang et al. |
| 2016/0290598 A1 | 10/2016 | Jiang |
| 2016/0290609 A1 | 10/2016 | Jiang et al. |
| 2016/0295706 A1 | 10/2016 | Jiang |
| 2016/0309550 A1 | 10/2016 | Xiong et al. |
| 2016/0323948 A1 | 11/2016 | Xiong et al. |
| 2016/0341414 A1 | 11/2016 | Jiang |
| 2016/0356472 A1 | 12/2016 | Liu et al. |
| 2016/0363267 A1 | 12/2016 | Jiang et al. |
| 2016/0381746 A1 | 12/2016 | Ye et al. |
| 2016/0381760 A1 | 12/2016 | Xiong et al. |
| 2017/0001793 A1 | 1/2017 | Jiang et al. |
| 2017/0094746 A1 | 3/2017 | Xiong et al. |
| 2017/0102114 A1 | 4/2017 | Xiong et al. |
| 2017/0105263 A1 | 4/2017 | Xiong et al. |

FOREIGN PATENT DOCUMENTS

| | | | |
|---|---|---|---|
| CN | 102155642 A | 8/2011 | |
| CN | 202125774 U | 1/2012 | |
| CN | 102355780 A | 2/2012 | |
| CN | 102518972 A | 6/2012 | |
| CN | 102932997 A | 2/2013 | |
| CN | 203240337 | 10/2013 | |
| CN | 203240337 U | 10/2013 | |
| CN | 203384716 U | 1/2014 | |
| CN | 203413396 U | 1/2014 | |
| CN | 203453866 U | 2/2014 | |
| CN | 203585876 U | 5/2014 | |
| CN | 203927469 | 11/2014 | |
| CN | 204268162 | 4/2015 | |
| CN | 204300737 U | 4/2015 | |
| CN | 104595765 A | 5/2015 | |
| CN | 104735873 | 6/2015 | |
| CN | 204420636 U | 6/2015 | |
| EP | 2914065 | 9/2015 | |
| GB | 2533683 | 6/2016 | |
| NL | WO 2014206785 A1 * | 12/2014 | ......... H05B 33/0884 |
| WO | WO2011/132120 A1 | 10/2011 | |
| WO | WO2012139691 | 10/2012 | |
| WO | WO2013/125803 A1 | 8/2013 | |
| WO | WO2014/001475 A1 | 1/2014 | |
| WO | WO2015/036478 A1 | 3/2015 | |

OTHER PUBLICATIONS

PCT Search Report for International Application No. PCT/CN2015/090814 dated Dec. 30, 2015.

* cited by examiner

LED TUBE LAMP WITH OVERCURRENT AND/OR OVERVOLTAGE PROTECTION CAPABILITIES

This application is a continuation-in-part application of U.S. patent application Ser. No. 14/865,387, filed Sep. 25, 2015, which application claims priority to Chinese Patent Applications No. CN 201410507660.9 filed on 2014 Sep. 28; CN 201410508899.8 filed on 2014 Sep. 28; CN 201410623355.6 filed on 2014 Nov. 6; CN 201410734425.5 filed on 2014 Dec. 5; CN 201510075925.7 filed on 2015 Feb. 12; CN 201510104823.3 filed on 2015 Mar. 10; CN 201510134586.5 filed on 2015 Mar. 26; CN 201510133689.x filed on 2015 Mar. 25; CN 201510136796.8 filed on 2015 Mar. 27; CN 201510173861.4 filed on 2015 Apr. 14; CN 201510155807.7 filed on 2015 Apr. 3; CN 201510193980.6 filed on 2015 Apr. 22; CN 201510372375.5 filed on 2015 Jun. 26; CN 201510259151.3 filed on 2015 May 19; CN 201510268927.8 filed on 2015 May 22; CN 201510284720.x filed on 2015 May 29; CN 201510338027.6 filed on 2015 Jun. 17; CN 201510315636.x filed on 2015 Jun. 10; CN 201510373492.3 filed on 2015 Jun. 26; CN 201510364735.7 filed on 2015 Jun. 26; CN 201510378322.4 filed on 2015 Jun. 29; CN 201510391910.1 filed on 2015 Jul. 2; CN 201510406595.5 filed on 2015 Jul. 10; CN 201510482944.1 filed on 2015 Aug. 7; CN 201510486115.0 filed on 2015 Aug. 8; CN 201510428680.1 filed on 2015 Jul. 20; CN 201510483475.5 filed on 2015 Aug. 8; CN 201510555543.4 filed on 2015 Sep. 2; CN 201510557717.0 filed on 2015 Sep. 6; and CN 201510595173.7 filed on 2015 Sep. 18, the contents of each of which are incorporated herein by reference in their entirety.

FIELD OF THE INVENTION

The present disclosure relates to illumination devices, and more particularly to an LED tube lamp with overcurrent and/or overvoltage protection capabilities.

BACKGROUND

LED (light emitting diode) lighting technology is rapidly developing to replace traditional incandescent and fluorescent lightings. LED tube lamps are mercury-free in comparison with fluorescent tube lamps that need to be filled with inert gas and mercury. Thus, it is not surprising that LED tube lamps are becoming a highly desired illumination option among different available lighting systems used in homes and workplaces, which used to be dominated by traditional lighting options such as compact fluorescent light bulbs (CFLs) and fluorescent tube lamps. Benefits of LED tube lamps include improved durability and longevity and far less energy consumption; therefore, when taking into account all factors, they would typically be considered as a cost effective lighting option.

Typical LED tube lamps have a lamp tube, a circuit board disposed inside the lamp tube with light sources being mounted on the circuit board, and end caps accompanying a power supply provided at two ends of the lamp tube with the electricity from the power supply transmitting to the light sources through the circuit board. However, existing LED tube lamps have certain drawbacks.

Further, circuit design of current LED tube lamps mostly doesn't provide suitable solutions for complying with relevant certification standards and for better compatibility with the driving structure using an electronic ballast originally for a fluorescent lamp. For example, since there are usually no electronic components in a fluorescent lamp, it's fairly easy for a fluorescent lamp to be certified under EMI (electromagnetic interference) standards and safety standards for lighting equipment as provided by Underwriters Laboratories (UL). However, there are a considerable number of electronic components in an LED tube lamp, and therefore consideration of the impacts caused by the layout (structure) of the electronic components is important, resulting in difficulties in complying with such standards.

Common main types of electronic ballast include instant-start ballast and program-start ballast. Electronic ballast typically includes a resonant circuit and is designed to match the loading characteristics of a fluorescent lamp in driving the fluorescent lamp. For example, for properly starting a fluorescent lamp, the electronic ballast provides driving methods respectively corresponding to the fluorescent lamp working as a capacitive device before emitting light, and working as a resistive device upon emitting light. But an LED is a nonlinear component with significantly different characteristics from a fluorescent lamp. Therefore, using an LED tube lamp with an electronic ballast impacts the resonant circuit design of the electronic ballast, causing a compatibility problem. Generally, a program-start ballast will detect the presence of a filament in a fluorescent lamp, but traditional LED driving circuits cannot support the detection and may cause a failure of the filament detection and thus failure of the starting of the LED tube lamp. Further, electronic ballast is in effect a current source, and when it acts as a power supply of a DC-to-DC converter circuit in an LED tube lamp, problems of overvoltage and overcurrent or undervoltage and undercurrent are likely to occur, resulting in damaging of electronic components in the LED tube lamp or unstable provision of lighting by the LED tube lamp. One such problem is the LED driving circuit may sometimes be damaged due to an excessively high level of an external driving voltage of, or of a current through, the LED tube lamp, or may not light the LED tube lamp due to an excessively low level of an external driving voltage of the LED tube lamp. In fact, an overvoltage might occur due to different types of driving signals provided by different electronic ballasts to the LED tube lamp.

Further, the driving of an LED uses a DC driving signal, but the driving signal for a fluorescent lamp is a low-frequency, low-voltage AC signal as provided by an AC powerline, a high-frequency, high-voltage AC signal provided by a ballast, or even a DC signal provided by a battery for emergency lighting applications. Since the voltages and frequency spectrums of these types of signals differ significantly, simply performing a rectification to produce the required DC driving signal in an LED tube lamp is typically not competent at achieving the LED tube lamp's compatibility with traditional driving systems of a fluorescent lamp.

Accordingly, the present disclosure and its embodiments are herein provided.

SUMMARY OF THE INVENTION

It's specially noted that the present disclosure may actually include one or more inventions claimed currently or not yet claimed, and for avoiding confusion due to unnecessarily distinguishing between those possible inventions at the stage of preparing the specification, the possible plurality of inventions herein may be collectively referred to as "the (present) invention" herein.

Various embodiments are summarized in this section, and are described with respect to the "present invention," which terminology is used to describe certain presently disclosed embodiments, whether claimed or not, and is not necessarily an exhaustive description of all possible embodiments, but rather is merely a summary of certain embodiments. Certain of the embodiments described below as various aspects of the "present invention" can be combined in different manners to form an LED tube lamp or a portion thereof. As such, the term "present invention" used in this specification is not intended to limit the claims in any way or to indicate that any particular embodiment or component is required to be included in a particular claim, and is intended to be synonymous with the "present disclosure."

The present invention provides a novel LED tube lamp, and aspects thereof.

The present disclosure provides, in some embodiments, an LED tube lamp with overcurrent and/or overvoltage protection capabilities, which LED tube lamp includes a lamp tube, a first rectifying circuit, a filtering circuit, an LED lighting module, and a protection circuit. The lamp tube may have a first pin and a second pin for receiving an external driving signal. The first rectifying circuit may be coupled to the first and second pins, for rectifying the external driving signal to produce a rectified signal. The filtering circuit may be coupled to the first rectifying circuit, for filtering the rectified signal to produce a filtered signal, and the filtering circuit may have a first filtering output terminal and a second filtering output terminal. In certain embodiments, the LED lighting module is coupled to the filtering circuit and includes an LED module, wherein the LED lighting module is configured to receive the filtered signal to produce a driving signal, and the LED module is for receiving the driving signal for emitting light. The protection circuit may be coupled to the filtering circuit, and may be configured to determine whether to enter a protection state, wherein upon entering the protection state, the protection circuit works to limit or restrain the level of the filtered signal. The protection circuit may include a voltage clamping circuit and a voltage division circuit. For example, the voltage clamping circuit may be coupled to the first filtering output terminal and the second filtering output terminal. The voltage division circuit may be coupled to the voltage clamping circuit and the second filtering output terminal. In certain embodiments, the voltage division circuit is also coupled to a positive terminal of the LED module to detect a voltage of the LED module, and is configured to receive a current detection signal, which represents a magnitude of current through the LED module.

The present disclosure also provides an LED tube lamp with overcurrent and/or overvoltage protection capabilities, which LED tube lamp includes a lamp tube, a first rectifying circuit, a filtering circuit, an LED lighting module, and a protection circuit. In certain embodiments, the lamp tube has a first pin and a second pin, also referred to as first and second external terminals for receiving an external driving signal. The first rectifying circuit may be coupled to the first and second pins, for rectifying the external driving signal to produce a rectified signal. The filtering circuit may be coupled to the first rectifying circuit, for filtering the rectified signal to produce a filtered signal. The LED lighting module may be coupled to the filtering circuit and includes an LED module, wherein the LED lighting module is configured to receive the filtered signal to produce a driving signal, and the LED module is for receiving the driving signal for emitting light. The protection circuit may be coupled to the filtering circuit, and may be configured to determine whether to enter a protection state, wherein upon entering the protection state, the protection circuit works to limit or restrain the level of the filtered signal.

An embodiment hereof provides the LED tube lamp comprising a protection circuit, which is configured to detect a voltage or/and current of the LED module and enters into a protection state to restrain or clamp down on the voltage of the LED module when the voltage of the LED module is higher than an overvoltage value and/or the current of the LED module is higher than an overcurrent value.

With the various circuit designs described herein, damaging of the LED driving circuit due to an excessively high or low level of the external driving voltage or current (as when an overvoltage might occur due to different types of driving signals provided by different electronic ballasts) can be prevented or reduced.

DETAILED DESCRIPTION

Figure 1:
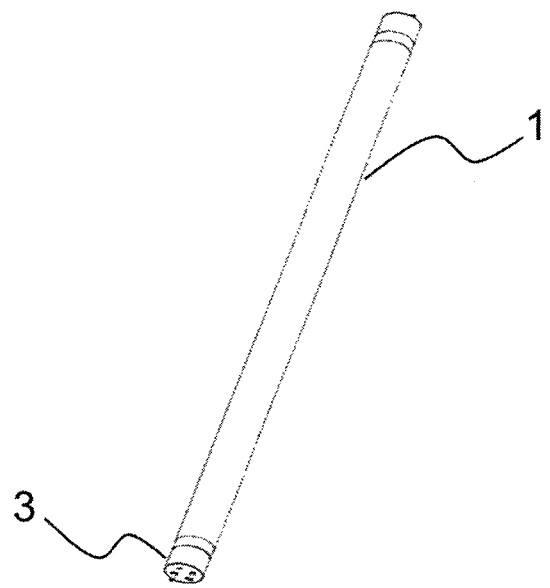
FIG. 1 is a perspective view schematically illustrating an LED tube lamp according to one embodiment of the present invention.

The present disclosure provides a novel LED tube lamp. The present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled," or "immediately connected" or "immediately coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, resistors, etc. As such, directly electrically connected components do not include components electrically connected through active elements, such as transistors or diodes. Two immediately adjacent conductive components may be described as directly electrically connected and directly physically connected.

Components described as thermally connected or in thermal communication are arranged such that heat will follow a path between the components to allow the heat to transfer from the first component to the second component. Simply because two components are part of the same device or board does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to any material that provides incidental heat conduction, but are intended to refer to materials that are typically known as good heat conductors or known to have utility for transferring heat, or components having similar heat conducting properties as those materials.

Figure 1A:
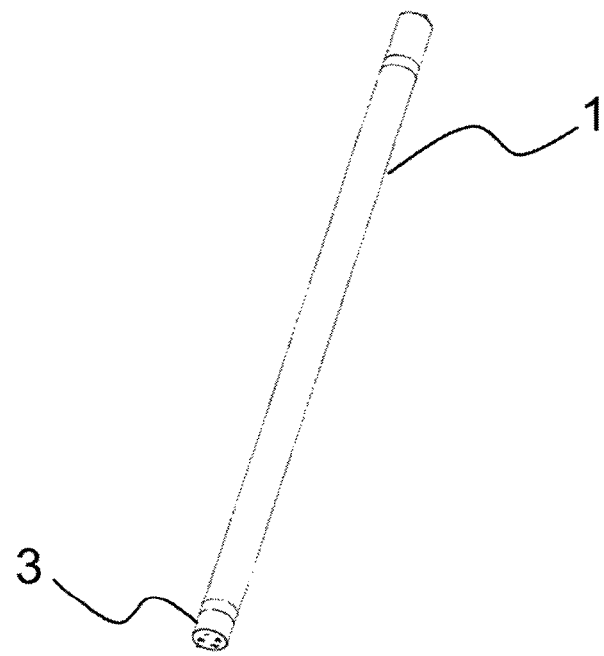
FIG. 1A is a perspective view schematically illustrating the different sized end caps of an LED tube lamp according to another embodiment of the present invention to illustrate.
Figure 2:
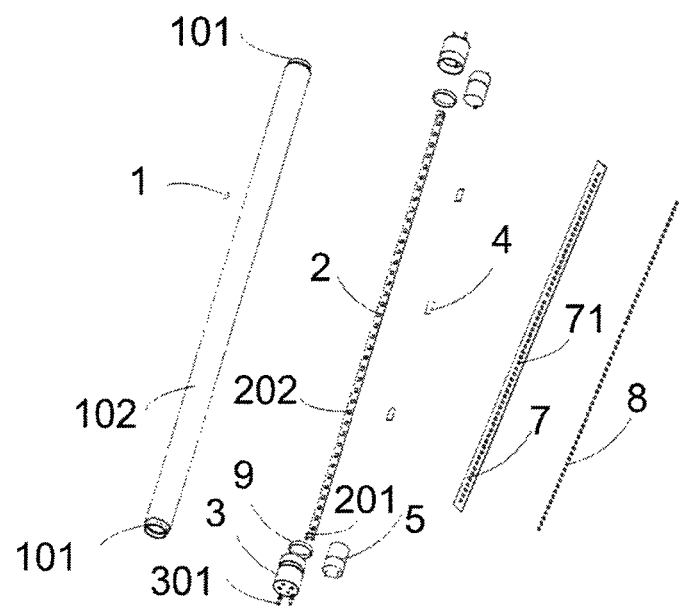
FIG. 2 is an exemplary exploded view schematically illustrating the LED tube lamp shown in FIG. 1.

Referring to FIGS. 1 and 2, an LED tube lamp of one embodiment of the present invention includes a lamp tube 1, an LED light strip 2 disposed inside the lamp tube 1, and two end caps 3 respectively disposed at two ends of the lamp tube 1. The lamp tube 1 may be made of plastic or glass. The lamp tube 1 may extend in a first direction along a length of the lamp tube 1. The LED light strip 2 may also extend in the first direction. The sizes of the two end caps 3 may be same or different. Referring to FIG. 1A, the size of one end cap may in some embodiments be about 30% to about 80% times the size of the other end cap. For example, both end caps may have a similar diameter, but one end cap may extend 30% to 80% longer in the first direction.

In one embodiment, the lamp tube 1 is made of glass with strengthened or tempered structure to avoid being easily broken and incurring electrical shock that often occurs in conventional glass made tube lamps, and to avoid the fast aging process that often occurs in plastic made tube lamps. The glass made lamp tube 1 may be additionally strengthened or tempered by a chemical tempering method or a physical tempering method in various embodiments of the present invention.

An exemplary chemical tempering method is accomplished, for example, by exchanging the Na ions or K ions on the glass surface with other alkali metal ions and therefore changes composition of the glass surface. The sodium (Na) ions or potassium (K) ions and other alkali metal ions on the glass surface are exchanged to form an ion exchange layer on the glass surface. The glass is then under tension on the inside while under compression on the outside when cooled to room temperature, so as to achieve the purpose of increased strength. The chemical tempering method includes but is not limited to the following glass tempering methods: high temperature type ion exchange method, the low temperature type ion exchange method, dealkalization, surface crystallization, and/or sodium silicate strengthening methods, further explained as follows.

An exemplary embodiment of the high temperature type ion exchange method includes the following steps: Inserting glass containing sodium oxide ($Na_2O$) or potassium oxide ($K_2O$) in the temperature range of the softening point and glass transition point into molten salt of lithium, so that the Na ions in the glass are exchanged for Li ions in the molten salt. Later, the glass is then cooled to room temperature, since the surface layer containing Li ions has a different thermal expansion coefficient with respect to the inner layer containing Na ions or K ions, thus the surface produces residual stress and is reinforced. Meanwhile, the glass containing $Al_2O_3$, $TiO_2$ and other components, by performing ion exchange, can produce glass crystals having an extremely low coefficient of thermal expansion. The crystallized glass surface after cooling produces a significant amount of pressure, up to 700 MPa, which can enhance the strength of glass.

An exemplary embodiment of the low-temperature ion exchange method includes the following steps: First, a monovalent cation (e.g., K ions) undergoes ion exchange with the alkali ions (e.g. Na ion) on the surface layer at a temperature range that is lower than the strain point temperature, so as to allow the K ions to penetrate the surface. For example, for manufacturing a $Na_2O+CaO+SiO_2$ system glass, the glass can be impregnated for about ten hours at more than four hundred degrees in the molten salt. The low temperature ion exchange method can easily obtain glass of higher strength, and the processing method is simple, does not damage the transparent nature of the glass surface, and does not undergo shape distortion.

An exemplary embodiment of dealkalization includes treating glass using platinum (Pt) catalyst along with sulfurous acid gas and water in a high temperature atmosphere. The $Na^+$ ions are migrated out and bleed from the glass surface to be reacted with the Pt catalyst, so that the surface layer becomes a $SiO_2$ enriched layer, which results in a low expansion glass and produces compressive stress upon cooling.

The surface crystallization method and the high temperature type ion exchange method are different, but only the surface layer is treated by heat treatment to form low expansion coefficient microcrystals on the glass surface, thus reinforcing the glass.

An exemplary embodiment of the sodium silicate glass strengthening method is a tempering method using sodium silicate (water glass) in water solution at 100 degrees Celsius and several atmospheres of pressure treatment, where a stronger/higher strength glass surface that is harder to scratch is thereby produced.

An exemplary embodiment of the physical tempering method includes but is not limited to applying a coating to or changing the structure of an object such as to strengthen the easily broken position. The applied coating can be, for example, a ceramic coating, an acrylic coating, or a glass coating depending on the material used. The coating can be performed in a liquid phase or gaseous phase.

The above glass tempering methods described including physical tempering methods and chemical tempering methods can be accomplished singly or combined together in any fashion.

Figure 3:
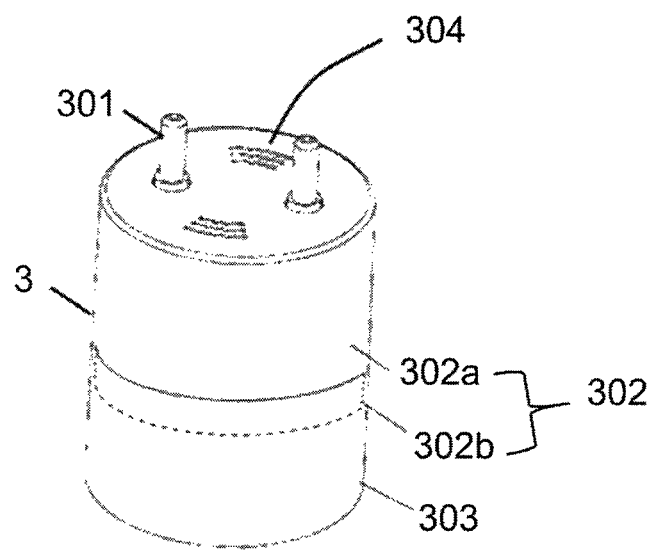
FIG. 3 is a perspective view schematically illustrating a front and top of an end cap of the LED tube lamp according to one embodiment of the present invention.
Figure 4:
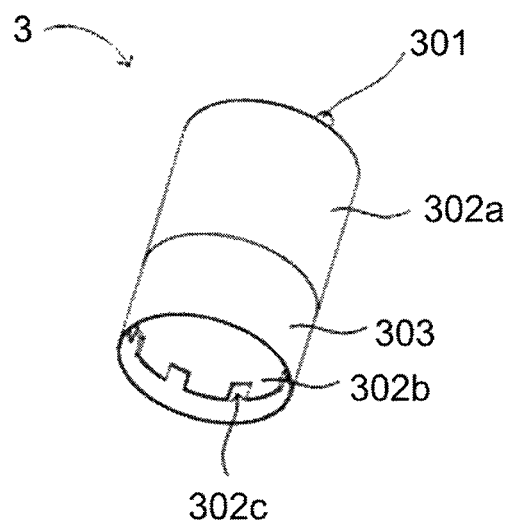
FIG. 4 is an exemplary perspective view schematically illustrating a bottom of the end cap as shown in FIG. 3.

Referring to FIGS. 3 and 4, in one embodiment of the invention, each end cap 3 includes an electrically insulating tube 302, a thermal conductive member 303 sleeving over the electrically insulating tube 302, and two hollow conductive pins 301 disposed on the electrically insulating tube 302. For example, the thermal conductive member 303 can be a metal ring that is tubular in shape.

Figure 5:
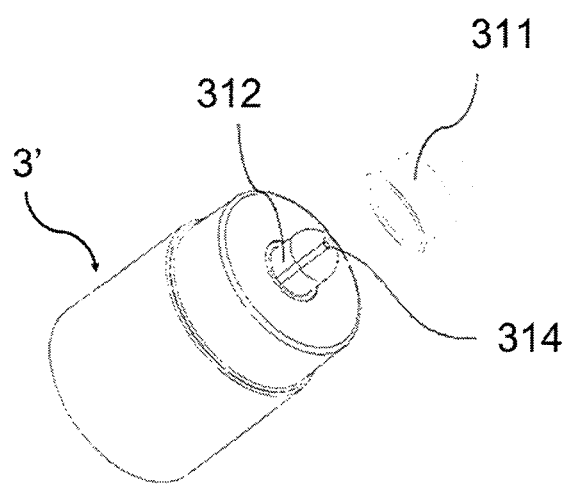
FIG. 5 is a perspective view schematically illustrating still another end cap of an LED tube lamp according to still another embodiment of the prevent invention.
Figure 22:
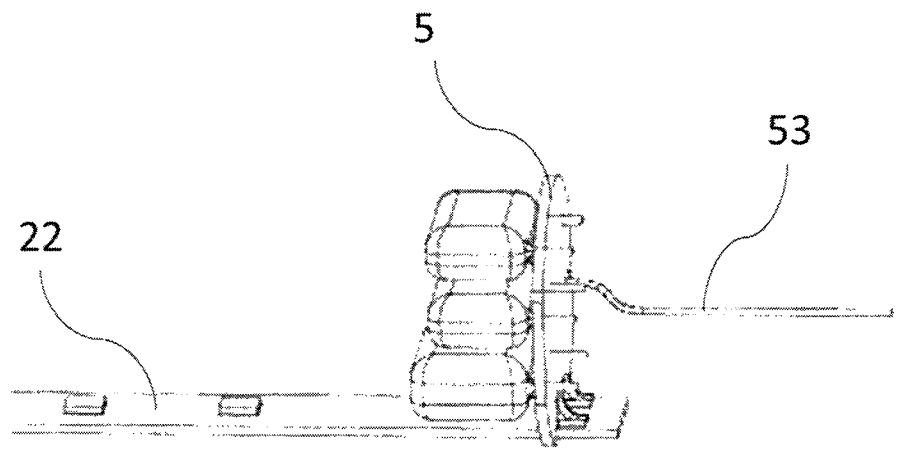
FIG. 22 is a perspective view schematically illustrating the printed circuit board of the power supply, which is perpendicularly adhered to a hard circuit board made of aluminum via soldering according to another embodiment of the present invention.

Referring to FIGS. 5 and 22, in one embodiment, an end cap 3' has a pillar 312 at one end, the top end of the pillar 312 is provided with an opening having a groove 314 of, for example 0.1±1% mm depth at the periphery thereof for positioning a conductive lead 53 as shown in FIG. 22. The conductive lead 53 (e.g., wire) passes through the opening on top of the pillar 312 and has its end bent to be disposed in the groove 314. For example, the groove 314 may be a bent, or curved groove (e.g., bent along a length direction of the lamp tube 1). After that, a conductive metallic cap 311 covers the pillar 312 such that the conductive lead 53 is fixed between the pillar 312 and the conductive metallic cap 311. In some embodiments, the inner diameter of the conductive metallic cap 311 is 7.56±5% mm, the outer diameter of the pillar 312 is 7.23±5% mm, and the outer diameter of the conductive lead 53 is 0.5±1% mm. Nevertheless, the mentioned sizes are not limited to these amounts. In some embodiments, the conductive metallic cap 311 closely covers the pillar 312 without using extra adhesives and therefore completes the electrical connection between the power supply 5 and the conductive metallic cap 311 (e.g., through the pillar).

Referring again to FIG. 2, the LED tube lamp according to some embodiments of present invention also includes an adhesive sheet 4, an insulation adhesive sheet 7, and an optical adhesive sheet 8. The LED light strip 2 is fixed by the adhesive sheet 4 to an inner circumferential surface of the lamp tube 1. The adhesive sheet 4 may be but is not limited to a silicone adhesive. The adhesive sheet 4 may be in form of several short pieces or a long piece. Various kinds of the adhesive sheet 4, the insulation adhesive sheet 7, and the optical adhesive sheet 8 can be combined to constitute various embodiments of the present invention.

The insulation adhesive sheet 7 is coated on the surface of the LED light strip 2 that faces the LED light sources 202 so that the LED light strip 2 is not exposed and thus electrically insulated from the outside environment. In application of the insulation adhesive sheet 7, a plurality of through holes 71 on the insulation adhesive sheet 7 are reserved to correspondingly accommodate the LED light sources 202 such that the LED light sources 202 are mounted in the through holes 701. The material composition of the insulation adhesive sheet 7 may include, for example vinyl silicone, hydrogen polysiloxane and aluminum oxide. The insulation adhesive sheet 7 has a thickness, for example, ranging from about 100 μm to about 140 μm (micrometers). An insulation adhesive sheet having a thickness less than 100 μm typically does not produce sufficient insulating effect, while an insulation adhesive sheet having a thickness more than 140 μm may result in material waste. Thus, a thickness of insulation adhesive sheet 7 between 100 μm and 140 μm may be used.

The optical adhesive sheet 8, which is a clear or transparent material, is applied or coated on the surface of the LED light source 202 in order to ensure optimal light transmittance. After being applied to the LED light sources 202, the optical adhesive sheet 8 may have a granular, strip-like or sheet-like shape. The performance of the optical adhesive sheet 8 depends on its refractive index and thickness. The refractive index of the optical adhesive sheet 8 is in some embodiments between 1.22 and 1.6. In some embodiments, it is better for the optical adhesive sheet 8 to have a refractive index being a square root of the refractive index of the housing or casing of the LED light source 202, or the square root of the refractive index of the housing or casing of the LED light source 202 plus or minus 15%, to contribute better light transmittance. The housing/casing of the LED light sources 202 is a structure to accommodate and carry the LED dies (or chips) such as an LED lead frame. In some embodiments, the refractive index of the optical adhesive sheet 8 may be selected from a range between 1.225 and 1.253. In some embodiments, the thickness of the optical adhesive sheet 8 may be a thickness in a range from 1.1 mm to 1.3 mm. An optical adhesive sheet having a thickness less than 1.1 mm may not be able to cover the LED light sources 202, while an optical adhesive sheet having a thickness more than 1.3 mm may reduce light transmittance and increases material cost.

Figure 6:
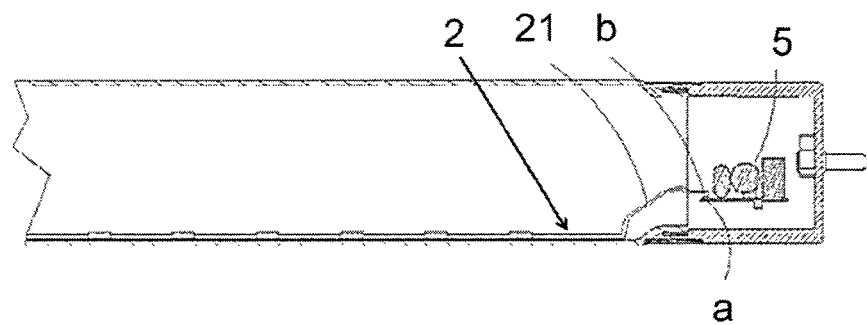
FIG. 6 is a sectional view schematically illustrating the LED light strip is a bendable circuit sheet with ends thereof passing across the transition region of the lamp tube of the LED tube lamp to be soldering bonded to the output terminals of the power supply according to one embodiment of the present invention.

In some embodiments, in the process of assembling the LED light sources to the LED light strip, the optical adhesive sheet 8 is first applied on the LED light sources 202; then the insulation adhesive sheet 7 is coated on one side of the LED light strip 2; then the LED light sources 202 are fixed or mounted on the LED light strip 2; the other side of the LED light strip 2 being opposite to the side of mounting the LED light sources 202 and insulation adhesive sheet 7 is bonded and affixed to the inner surface of the lamp tube 1 by the adhesive sheet 4; finally, the end cap 3 is fixed to the end portion of the lamp tube 1, and the LED light sources 202 and the power supply 5 are electrically connected by the LED light strip 2. As shown in the embodiment of FIG. 6, the bendable circuit sheet 2 passes a transition region to be soldered or traditionally wire-bonded with the power supply 5, and then the end cap 3 having the structure as shown in FIG. 3 or 4 is adhered to the transition region, respectively to form a complete LED tube lamp.

In this embodiment, the LED light strip 2 is fixed by the adhesive sheet 4 to an inner circumferential surface of the lamp tube 1, so as to increase the light illumination angle of the LED tube lamp and broaden the viewing angle to be greater than 330 degrees. By means of applying the insulation adhesive sheet 7 and the optical adhesive sheet 8, electrical insulation of the entire light strip 2 is accomplished such that electrical shock would not occur even when the lamp tube 1 is broken and therefore safety could be improved.

Furthermore, the inner peripheral surface or the outer circumferential surface of the glass made lamp tube 1 may be covered or coated with an adhesive film (not shown) to isolate the inside from the outside of the glass made lamp tube 1 when the glass made lamp tube 1 is broken. In this embodiment, the adhesive film is coated on the inner peripheral surface of the lamp tube 1. The material for the coated adhesive film includes, for example, methyl vinyl silicone oil, hydro silicone oil, xylene, and calcium carbonate, wherein xylene is used as an auxiliary material. The xylene will be volatilized and removed when the coated adhesive film on the inner surface of the lamp tube 1 solidifies or hardens. The xylene is mainly used to adjust the capability of adhesion and therefore to control the thickness of the coated adhesive film.

In one embodiment, the thickness of the coated adhesive film is preferably between about 100 and about 140 micrometers (μm). The adhesive film having a thickness being less than 100 micrometers may not have sufficient shatterproof capability for the glass tube, and the glass tube is thus prone to crack or shatter. The adhesive film having a thickness being larger than 140 micrometers may reduce the light transmittance and also increase material cost. In certain embodiments, the thickness of the coated adhesive film may be between about 10 and about 800 micrometers (μm) when the shatterproof capability and the light transmittance are not strictly demanded.

In one embodiment, the inner peripheral surface or the outer circumferential surface of the glass made lamp tube 1 is coated with an adhesive film such that the broken pieces are adhered to the adhesive film when the glass made lamp tube is broken. Therefore, the lamp tube 1 would not be penetrated to form a through hole connecting the inside and outside of the lamp tube 1 and thus prevents a user from touching any charged object inside the lamp tube 1 to avoid electrical shock. In addition, the adhesive film is able to diffuse light and allows the light to transmit such that the light uniformity and the light transmittance of the entire LED tube lamp increases. The adhesive film can be used in combination with the adhesive sheet 4, the insulation adhesive sheet 7 and the optical adhesive sheet 8 to constitute various embodiments of the present invention. As the LED light strip 2 is configured to be a bendable circuit sheet, no coated adhesive film is thereby required.

Furthermore, the light strip 2 may be an elongated aluminum plate, FR 4 board, or a bendable circuit sheet. When the lamp tube 1 is made of glass, adopting a rigid aluminum plate or FR4 board would make a broken lamp tube, e.g., broken into two parts, remain a straight shape so that a user may be under a false impression that the LED tube lamp is still usable and fully functional, and it is easy for him to incur electric shock upon handling or installation of the LED tube lamp. Because of added flexibility and bendability of the flexible substrate for the LED light strip 2, the problem faced by the aluminum plate, FR4 board, or conventional 3-layered flexible board having inadequate flexibility and bendability, are thereby addressed. In certain embodiments, a bendable circuit sheet is adopted as the LED light strip 2 because such an LED light strip 2 would not allow a ruptured or broken lamp tube to maintain a straight shape and therefore instantly inform the user of the disability of the LED tube lamp and avoid possibly incurred electrical shock. The following are further descriptions of the bendable circuit sheet used as the LED light strip 2.

Figure 7:
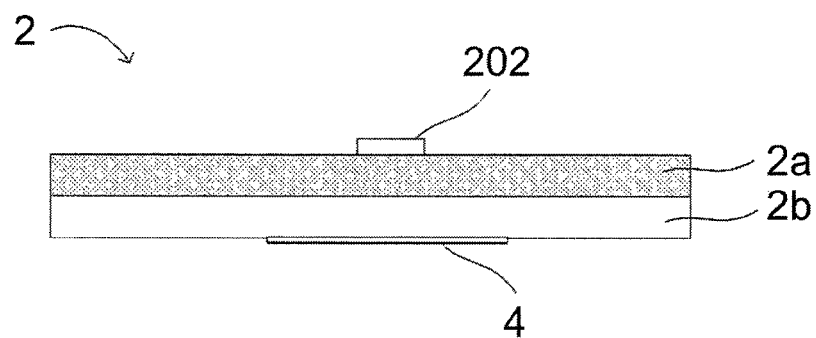
FIG. 7 is a cross-sectional view schematically illustrating a bi-layered structure of the bendable circuit sheet of the LED light strip of the LED tube lamp according to an embodiment of the present invention.

Referring to FIG. 7, in one embodiment, the LED light strip 2 includes a bendable circuit sheet having a conductive wiring layer 2a and a dielectric layer 2b that are arranged in a stacked manner, wherein the wiring layer 2a and the dielectric layer 2b have same areas. The LED light source 202 is disposed on one surface of the wiring layer 2a, the dielectric layer 2b is disposed on the other surface of the wiring layer 2a that is away from the LED light sources 202 (e.g., a second, opposite surface from the first surface on which the LED light source 202 is disposed). The wiring layer 2a is electrically connected to the power supply 5 to carry direct current (DC) signals. Meanwhile, the surface of the dielectric layer 2b away from the wiring layer 2a (e.g., a second surface of the dielectric layer 2b opposite a first surface facing the wiring layer 2a) is fixed to the inner circumferential surface of the lamp tube 1 by means of the adhesive sheet 4. The portion of the dielectric layer 2b fixed to the inner circumferential surface of the lamp tube 1 may substantially conform to the shape of the inner circumferential surface of the lamp tube 1. The wiring layer 2a can be a metal layer or a power supply layer including wires such as copper wires.

In another embodiment, the outer surface of the wiring layer 2a or the dielectric layer 2b may be covered with a circuit protective layer made of an ink with function of resisting soldering and increasing reflectivity. Alternatively, the dielectric layer can be omitted and the wiring layer can be directly bonded to the inner circumferential surface of the lamp tube, and the outer surface of the wiring layer 2a may be coated with the circuit protective layer. Whether the wiring layer 2a has a one-layered, or two-layered structure, the circuit protective layer can be adopted. In some embodiments, the circuit protective layer is disposed only on one side/surface of the LED light strip 2, such as the surface having the LED light source 202. In some embodiments, the bendable circuit sheet is a one-layered structure made of just one wiring layer 2a, or a two-layered structure made of one wiring layer 2a and one dielectric layer 2b, and thus is more bendable or flexible to curl when compared with the conventional three-layered flexible substrate (one dielectric layer sandwiched with two wiring layers). As a result, the bendable circuit sheet of the LED light strip 2 can be installed in a lamp tube with a customized shape or non-tubular shape, and fitly mounted to the inner surface of the lamp tube. The bendable circuit sheet closely mounted to the inner surface of the lamp tube is preferable in some cases. In addition, using fewer layers of the bendable circuit sheet improves the heat dissipation and lowers the material cost.

Nevertheless, the bendable circuit sheet is not limited to being one-layered or two-layered; in other embodiments, the bendable circuit sheet may include multiple layers of the wiring layers 2a and multiple layers of the dielectric layers 2b, in which the dielectric layers 2b and the wiring layers 2a are sequentially stacked in a staggered manner, respectively. These stacked layers may be between the outermost wiring layer 2a (with respect to the inner circumferential surface of the lamp tube), which has the LED light source 202 disposed thereon, and the inner circumferential surface of the lamp tube, and may be electrically connected to the power supply 5. Moreover, in some embodiments, the length of the bendable circuit sheet is greater than the length of the lamp tube, or at least greater than a central portion of the lamp tube between two transition regions (e.g., where the circumference of the lamp tube narrows) on either end.

Figure 23:
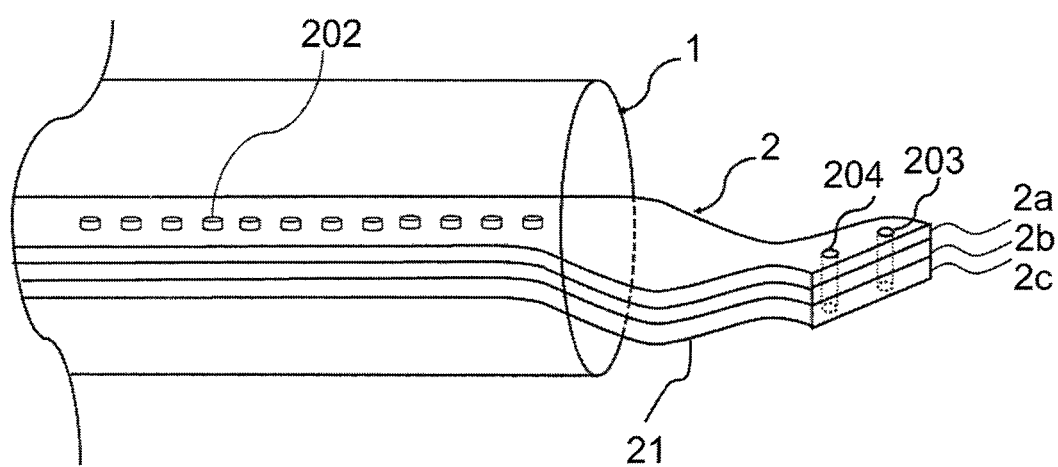
FIG. 23 is a perspective view schematically illustrating the bendable circuit sheet of the LED light strip is formed with two conductive wiring layers according to another embodiment of the present invention.

Referring to FIG. 23, in one embodiment, the LED light strip 2 includes a bendable circuit sheet having in sequence a first wiring layer 2a, a dielectric layer 2b, and a second wiring layer 2c. The thickness of the second wiring layer 2c (e.g., in a direction in which the layers 2a through 2c are stacked) is greater than that of the first wiring layer 2a, and the length of the LED light strip 2 is greater than that of the lamp tube 1, or at least greater than a central portion of the lamp tube between two transition regions (e.g., where the circumference of the lamp tube narrows) on either end. The end region of the light strip 2 extending beyond the end portion of the lamp tube 1 without disposition of the light source 202 (e.g., an end portion without light sources 202 disposed thereon) may be formed with two separate through holes 203 and 204 to respectively electrically communicate the first wiring layer 2a and the second wiring layer 2c. The through holes 203 and 204 are not communicated to each other to avoid short.

In this way, the greater thickness of the second wiring layer 2c allows the second wiring layer 2c to support the first wiring layer 2a and the dielectric layer 2b, and meanwhile allow the LED light strip 2 to be mounted onto the inner circumferential surface without being liable to shift or deform, and thus the yield rate of product can be improved. In addition, the first wiring layer 2a and the second wiring layer 2c are in electrical communication such that the circuit layout of the first wiring later 2a can be extended downward to the second wiring layer 2c to reach the circuit layout of the entire LED light strip 2. Moreover, since the land for the circuit layout becomes two-layered, the area of each single layer and therefore the width of the LED light strip 2 can be reduced such that more LED light strips 2 can be put on a production line to increase productivity.

Furthermore, the first wiring layer 2a and the second wiring layer 2c of the end region of the LED light strip 2 that extends beyond the end portion of the lamp tube 1 without disposition of the light source 202 can be used to accomplish the circuit layout of a power supply module so that the power supply module can be directly disposed on the bendable circuit sheet of the LED light strip 2.

Referring to FIG. 2, in one embodiment, the LED light strip 2 has a plurality of LED light sources 202 mounted thereon, and the end cap 3 has a power supply 5 installed therein. The LED light sources 202 and the power supply 5 are electrically connected by the LED light strip 2. The power supply 5 may be a single integrated unit (i.e., all of the power supply components are integrated into one module unit) installed in one end cap 3. Alternatively, the power supply 5 may be divided into two separate units (i.e. the power supply components are divided into two parts) installed in two end caps 3, respectively. When only one end of the lamp tube 1 is strengthened by a glass tempering process, it may be preferable that the power supply 5 is a single integrated unit and installed in the end cap 3 corresponding to the strengthened end of the lamp tube 1.

The power supply 5 can be fabricated by various ways. For example, the power supply 5 may be an encapsulation body formed by injection molding a silica gel with high thermal conductivity such as being greater than 0.7 w/m·k. This kind of power supply has advantages of high electrical insulation, high heat dissipation, and regular shape to match other components in an assembly. Alternatively, the power supply 5 in the end caps may be a printed circuit board having components that are directly exposed or packaged by a conventional heat shrink sleeve. The power supply 5 according to some embodiments of the present invention can be a single printed circuit board provided with a power supply module as shown in FIG. 6 or a single integrated unit as shown in FIG. 21.

Figure 21:
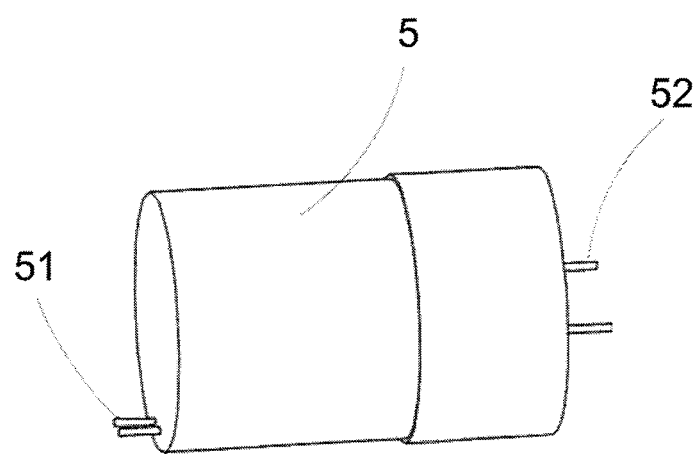
FIG. 21 is a perspective view schematically illustrating a power supply of the LED tube lamp according to one embodiment of the present invention.

Referring to FIGS. 2 and 21, in one embodiment of the present invention, the power supply 5 is provided with a male plug 51 at one end and a metal pin 52 at the other end, one end of the LED light strip 2 is correspondingly provided with a female plug 201, and the end cap 3 is provided with a hollow conductive pin 301 to be connected with an outer electrical power source. Specifically, the male plug 51 is fittingly inserted into the female plug 201 of the LED light strip 2, while the metal pins 52 are fittingly inserted into the hollow conductive pins 301 of the end cap 3. The male plug 51 and the female plug 201 function as a connector between the power supply 5 and the LED light strip 2. Upon insertion of the metal pin 502, the hollow conductive pin 301 is punched with an external punching tool to slightly deform such that the metal pin 502 of the power supply 5 is secured and electrically connected to the hollow conductive pin 301. Upon turning on the electrical power, the electrical current passes in sequence through the hollow conductive pin 301, the metal pin 502, the male plug 501, and the female plug 201 to reach the LED light strip 2 and go to the LED light sources 202. However, the power supply 5 of the present invention is not limited to the modular type as shown in FIG. 21. The power supply 5 may be a printed circuit board provided with a power supply module and electrically connected to the LED light strip 2 via the abovementioned the male plug 51 and female plug 52 combination.

In another embodiment, a traditional wire bonding technique can be used instead of the male plug 51 and the female plug 52 for connecting any kind of the power supply 5 and the light strip 2. Furthermore, the wires may be wrapped with an electrically insulating tube to protect a user from being electrically shocked. However, the bonded wires tend to be easily broken during transportation and can therefore cause quality issues.

In still another embodiment, the connection between the power supply 5 and the LED light strip 2 may be accomplished via tin soldering, rivet bonding, or welding. One way to secure the LED light strip 2 is to provide the adhesive sheet 4 at one side thereof and adhere the LED light strip 2 to the inner surface of the lamp tube 1 via the adhesive sheet 4. Two ends of the LED light strip 2 can be either fixed to or detached from the inner surface of the lamp tube 1.

In case that two ends of the LED light strip 2 are fixed to the inner surface of the lamp tube 1, it may be preferable that the bendable circuit sheet of the LED light strip 2 is provided with the female plug 201 and the power supply is provided with the male plug 51 to accomplish the connection between the LED light strip 2 and the power supply 5. In this case, the male plug 51 of the power supply 5 is inserted into the female plug 201 to establish electrical connection.

In case that two ends of the LED light strip 2 are detached from the inner surface of the lamp tube and that the LED light strip 2 is connected to the power supply 5 via wire-bonding, any movement in subsequent transportation is likely to cause the bonded wires to break. Therefore, a useful option for the connection between the light strip 2 and the power supply 5 could be soldering. Specifically, referring to FIG. 6, the ends of the LED light strip 2 including the bendable circuit sheet are arranged to pass over the strengthened transition region 103 and be directly solder bonded to an output terminal of the power supply 5. This may improve the product quality by avoiding using wires and/or wire bonding. Also, according to this embodiment, the female plug 201 and the male plug 51 respectively provided for the LED light strip 2 and the power supply 5 are no longer needed.

Figure 8:
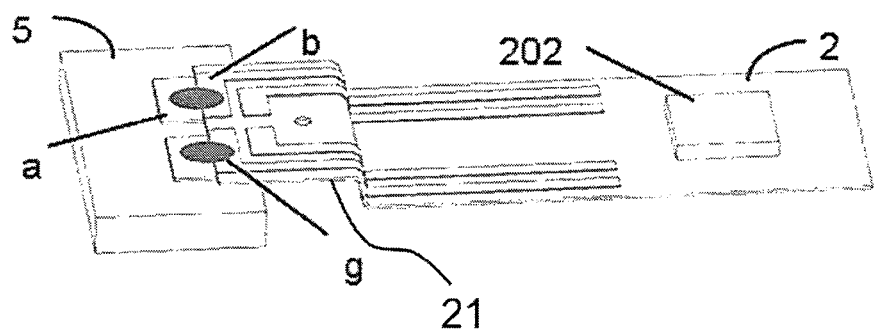
FIG. 8 is a perspective view schematically illustrating the soldering pad of the bendable circuit sheet of the LED light strip for soldering connection with the printed circuit board of the power supply of the LED tube lamp according to one embodiment of the present invention.
Figure 14:
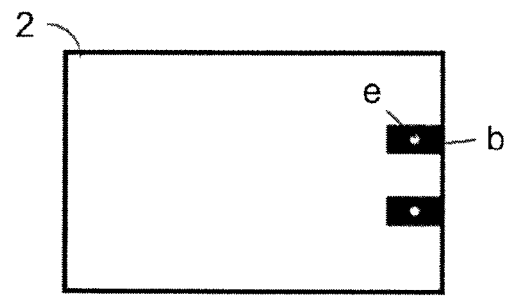
FIG. 14 is a plan view schematically illustrating through holes are formed on the soldering pads of the bendable circuit sheet of the LED light strip of the LED tube lamp according to one embodiment of the present invention.

Referring to FIG. 8, an output terminal of the printed circuit board of the power supply 5 may have soldering pads "a" provided with an amount of solder (e.g., tin solder) with a thickness sufficient to later form a solder joint. Correspondingly, the ends of the LED light strip 2 may have soldering pads "b". The soldering pads "a" on the output terminal of the printed circuit board of the power supply 5 are soldered to the soldering pads "b" on the LED light strip 2 via the tin solder on the soldering pads "a". The soldering pads "a" and the soldering pads "b" may be face to face during soldering such that the connection between the LED light strip 2 and the printed circuit board of the power supply 5 is the most firm. However, this kind of soldering typically includes that a thermo-compression head presses on the rear surface of the LED light strip 2 and heats the tin solder, i.e. the LED light strip 2 intervenes between the thermo-compression head and the tin solder, and therefore may easily cause reliability problems. Referring to FIG. 14, a through hole may be formed in each of the soldering pads "b" on the LED light strip 2 to allow the soldering pads "b" overlay the soldering pads "b" without being face-to-face (e.g., both soldering pads "a" and soldering pads "b" can have surfaces that face the same direction) and the thermo-compression head directly presses tin solders on the soldering pads "a" on surface of the printed circuit board of the power supply 5 when the soldering pads "a" and the soldering pads "b" are vertically aligned. This is an easy way to accomplish in practice.

Referring again to FIG. 8, two ends of the LED light strip 2 detached from the inner surface of the lamp tube 1 are formed as freely extending portions 21, while most of the LED light strip 2 is attached and secured to the inner surface of the lamp tube 1. One of the freely extending portions 21 has the soldering pads "b" as mentioned above. Upon assembling of the LED tube lamp, the freely extending end portions 21 along with the soldered connection of the printed circuit board of the power supply 5 and the LED light strip 2 would be coiled, curled up or deformed to be fittingly accommodated inside the lamp tube 1. When the bendable circuit sheet of the LED light strip 2 includes in sequence the first wiring layer 2a, the dielectric layer 2b, and the second wiring layer 2c as shown in FIG. 23, the freely extending end portions 21 can be used to accomplish the connection between the first wiring layer 2a and the second wiring layer 2c and arrange the circuit layout of the power supply 5.

In this embodiment, during the connection of the LED light strip 2 and the power supply 5, the soldering pads "b" and the soldering pads "a" and the LED light sources 202 are on surfaces facing toward the same direction and the soldering pads "b" on the LED light strip 2 are each formed with a through hole "e" as shown in FIG. 14 such that the soldering pads "b" and the soldering pads "a" communicate with each other via the through holes "e". When the freely extending end portions 21 are deformed due to contraction or curling up, the soldered connection of the printed circuit board of the power supply 5 and the LED light strip 2 exerts a lateral tension on the power supply 5. Furthermore, the soldered connection of the printed circuit board of the power supply 5 and the LED light strip 2 also exerts a downward tension on the power supply 5 when compared with the situation where the soldering pads "a" of the power supply 5 and the soldering pads "b" of the LED light strip 2 are face to face. This downward tension on the power supply 5 comes from the tin solders inside the through holes "e" and forms a stronger and more secure electrical connection between the LED light strip 2 and the power supply 5. As described above, the freely extending portions 21 may be different from a fixed portion of the LED light strip 2 in that they fixed portion may conform to the shape of the inner surface of the lamp tube 1 and may be fixed thereto, while the freely extending portion 21 may have a shape that does not conform to the shape of the lamp tube 1. For example, there may be a space between an inner surface of the lamp tube 1 and the freely extending portion 21. As shown in FIG. 8, the freely extending portion 21 may be bent along the length direction of the lamp tube 1.

Figure 9:
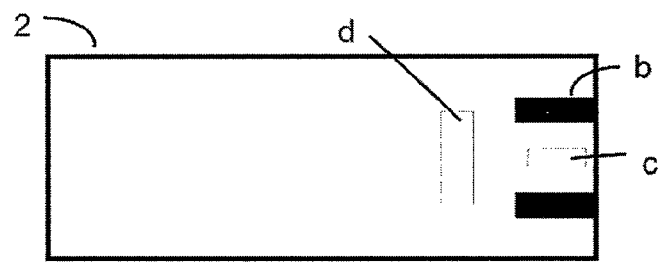
FIG. 9 is a plan view schematically illustrating the arrangement of the soldering pads of the bendable circuit sheet of the LED light strip of the LED tube lamp according to one embodiment of the present invention.

Referring to FIG. 9, in one embodiment, the soldering pads "b" of the LED light strip 2 are two separate pads to electrically connect the positive and negative electrodes of the bendable circuit sheet of the LED light strip 2, respectively. The size of the soldering pads "b" may be, for example, about 3.5×2 mm$^2$. In certain embodiments, the printed circuit board of the power supply 5 is correspondingly provided with soldering pads "a" having reserved tin solders, and the height of the tin solders suitable for subsequent automatic soldering bonding process is generally, for example, about 0.1 to 0.7 mm, in some preferable embodiments about 0.3 to about 0.5 mm, and in some even more preferable embodiments about 0.4 mm. An electrically insulating through hole "c" may be formed between the two soldering pads "b" to isolate and prevent the two soldering pads from electrically shorting during soldering. Furthermore, an extra positioning opening "d" may also be provided behind the electrically insulating through hole "c" to allow an automatic soldering machine to quickly recognize the position of the soldering pads "b".

Figure 10:
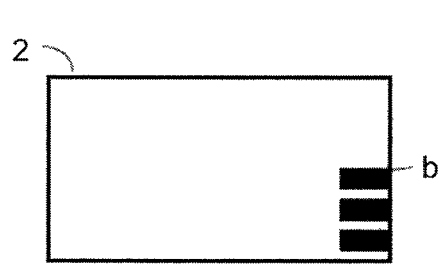
FIG. 10 is a plan view schematically illustrating a row of three soldering pads of the bendable circuit sheet of the LED light strip of the LED tube lamp according to another embodiment of the present invention.
Figure 11:
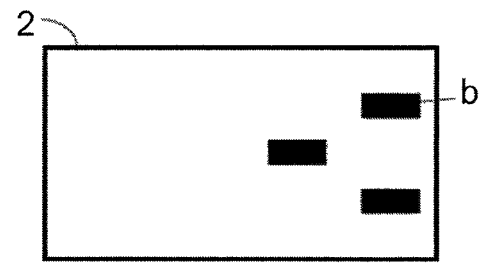
FIG. 11 is a plan view schematically illustrating two rows of soldering pads of the bendable circuit sheet of the LED light strip of the LED tube lamp according to still another embodiment of the present invention.
Figure 12:
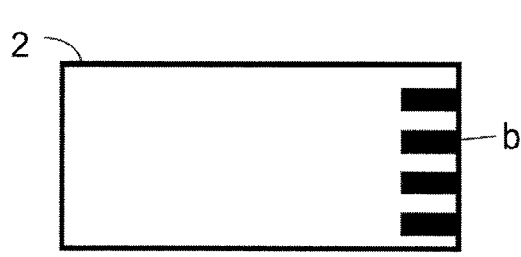
FIG. 12 is a plan view schematically illustrating a row of four soldering pads of the bendable circuit sheet of the LED light strip of the LED tube lamp according to yet another embodiment of the present invention.
Figure 13:
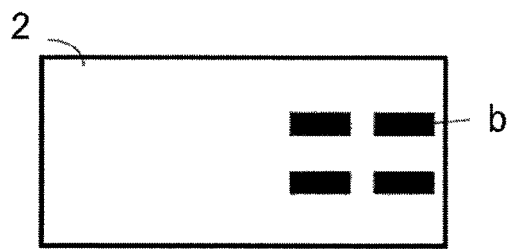
FIG. 13 is a plan view schematically illustrating two rows of two soldering pads of the bendable circuit sheet of the LED light strip of the LED tube lamp according to yet still another embodiment of the present invention.

For the sake of achieving scalability and compatibility, the amount of the soldering pads "b" on each end of the LED light strip 2 may be more than one such as two, three, four, or more than four. When there is only one soldering pad "b" provided at each end of the LED light strip 2, the two ends of the LED light strip 2 are electrically connected to the power supply 5 to form a loop, and various electrical components can be used. For example, a capacitance may be replaced by an inductance to perform current regulation. Referring to FIGS. 10 to 12, when each end of the LED light strip 2 has three soldering pads, the third soldering pad can be grounded; when each end of the LED light strip 2 has four soldering pads, the fourth soldering pad can be used as a signal input terminal. Correspondingly, in some embodiments, the power supply 5 should have same amount of soldering pads "a" as that of the soldering pads "b" on the LED light strip 2. In some embodiments, as long as electrical short between the soldering pads "b" can be prevented, the soldering pads "b" should be arranged according to the dimension of the actual area for disposition, for example, three soldering pads can be arranged in a row or two rows. In other embodiments, the amount of the soldering pads "b" on the bendable circuit sheet of the LED light strip 2 may be reduced by rearranging the circuits on the bendable circuit sheet of the LED light strip 2. The lesser the amount of the soldering pads, the easier the fabrication process becomes. On the other hand, a greater number of soldering pads may improve and secure the electrical connection between the LED light strip 2 and the output terminal of the power supply 5.

Referring to FIG. 14, in another embodiment, each of the soldering pads "b" is formed with a through hole "e" having a diameter generally of about 1 to 2 mm, in some preferred embodiments of about 1.2 to 1.8 mm, and in yet further preferred embodiments of about 1.5 mm. The through hole "e" communicates the soldering pad "a" with the soldering pad "b" so that the tin solder on the soldering pads "a" passes through the through holes "e" and finally reach the soldering pads "b". A smaller through hole "e" would make it difficult for the tin solder to pass. The tin solder accumulates around the through holes "e" upon exiting the through holes "e" and condense to form a solder ball "g" with a larger diameter than that of the through holes "e" upon condensing. Such a solder ball "g" functions as a rivet to further increase the stability of the electrical connection between the soldering pads "a" on the power supply 5 and the soldering pads "b" on the LED light strip 2.

Figure 15:
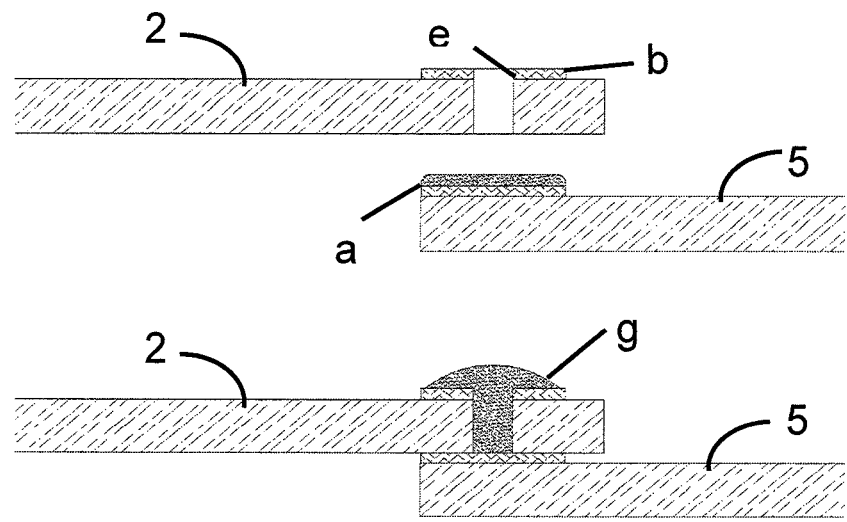
FIG. 15 is a cross-sectional view schematically illustrating soldering bonding process utilizing the soldering pads of the bendable circuit sheet of the LED light strip of FIG. 14 taken from side view and the printed circuit board of the power supply according to one embodiment of the present invention.
Figure 16:
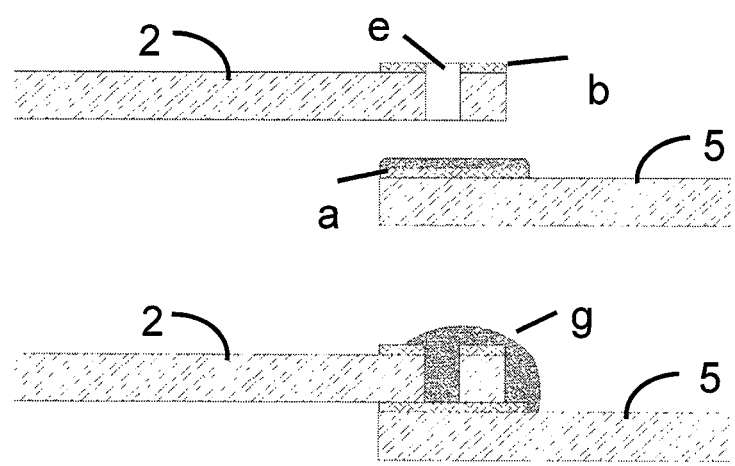
FIG. 16 is a cross-sectional view schematically illustrating soldering bonding process utilizing the soldering pads of the bendable circuit sheet of the LED light strip of FIG. 14 taken from side view and the printed circuit board of the power supply according to another embodiment of the present invention, wherein the through hole of the soldering pads is near the edge of the bendable circuit sheet.
Figure 17:
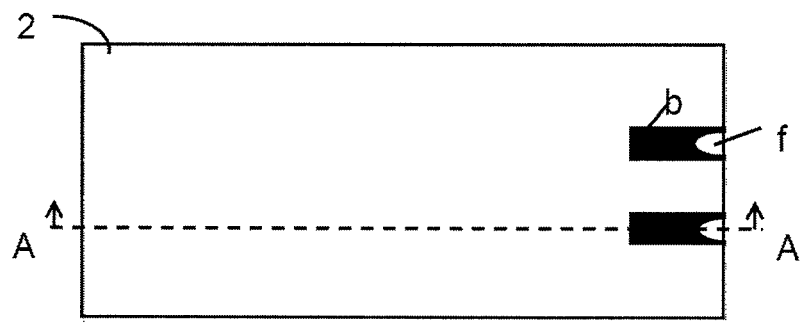
FIG. 17 is a plan view schematically illustrating notches formed on the soldering pads of the bendable circuit sheet of the LED light strip of the LED tube lamp according to one embodiment of the present invention.
Figure 18:
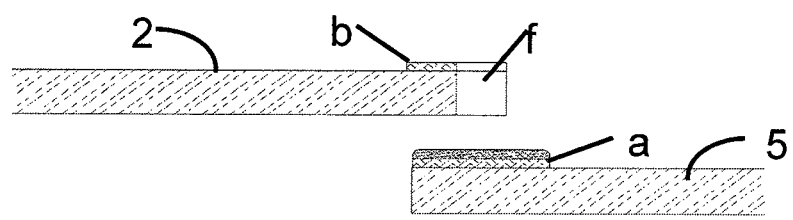
FIG. 18 is an exemplary cross-sectional view of FIG. 17 taken along a line A-A'.
Figure 18:
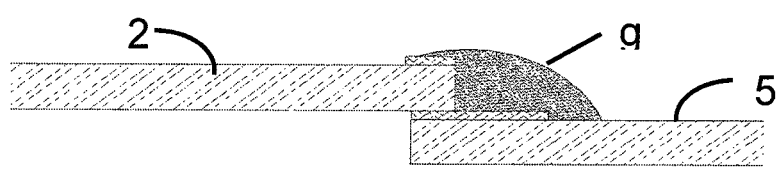

Referring to FIGS. 15 to 16, in other embodiments, when a distance from the through hole "e" to the side edge of the LED light strip 2 is less than a particular distance (e.g., 1 mm), the tin solder may pass through the through hole "e" to accumulate on the periphery of the through hole "e", and extra tin solder may spill over the soldering pads "b" to reflow along the side edge of the LED light strip 2 and join the tin solder on the soldering pads "a" of the power supply 5. The tin solder then condenses to form a structure like a rivet to firmly secure the LED light strip 2 onto the printed circuit board of the power supply 5 such that reliable electric connection is achieved. Referring to FIGS. 17 and 18, in another embodiment, the through hole "e" can be replaced by a notch "f" formed at the side edge of the soldering pads "b" for the tin solder to easily pass through the notch "f" and accumulate on the periphery of the notch "f" and to form a solder ball with a larger diameter than that of the notch "e" upon condensing. Such a solder ball may be formed like a C-shape rivet to enhance the secure capability of the electrically connecting structure.

The abovementioned through hole "e" or notch "f" might be formed in advance of soldering or formed by direct punching with a thermo-compression head during soldering. The portion of the thermo-compression head for touching the tin solder may be flat, concave, or convex, or any combination thereof. The portion of the thermo-compression head for restraining the object to be soldered such as the LED light strip 2 may be strip-like or grid-like. The portion of the thermo-compression head for touching the tin solder does not completely cover the through hole "e" or the notch "f" to make sure that the tin solder is able to pass through the through hole "e" or the notch "f". The portion of the thermo-compression head being concave may function as a room to receive the solder ball.

Referring to FIG. 9, soldering pads corresponding to the soldering pads of the LED light strip are formed on the printed circuit board of the power supply 5 and tin solder is reserved on the soldering pads on the printed circuit board of the power supply 5 for subsequent solder bonding performed by an automatic soldering bonding machine. The tin solder in some embodiments has a thickness of about 0.3 mm to about 0.5 mm such that the LED light strip 2 can be firmly soldered to the printed circuit board of the power supply 5.

Figure 19:
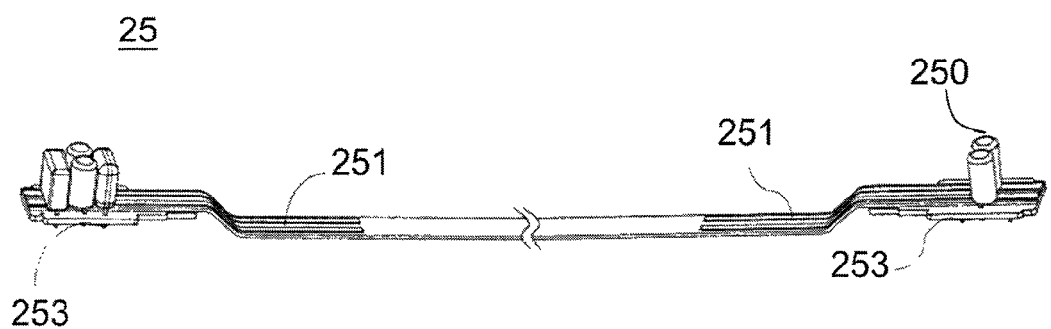
FIG. 19 is a perspective view schematically illustrating a circuit board assembly composed of the bendable circuit sheet of the LED light strip and the printed circuit board of the power supply according to another embodiment of the present invention.
Figure 20:
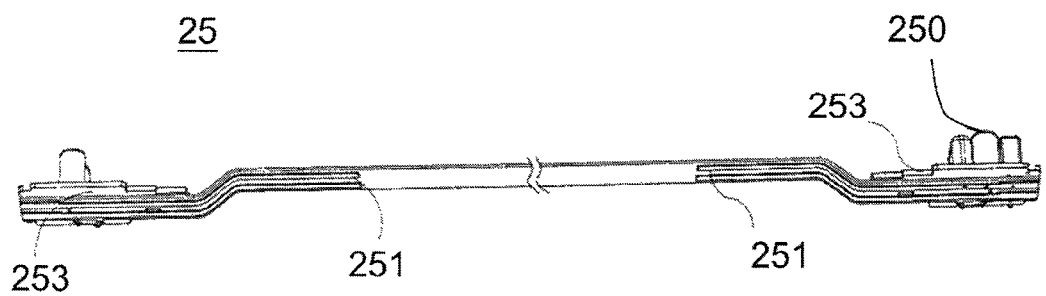
FIG. 20 is a perspective view schematically illustrating another exemplary arrangement of the circuit board assembly of FIG. 19.

Referring to FIGS. 19 and 20, in another embodiment, the LED light strip 2 and the power supply 5 may be connected by utilizing a circuit board assembly 25 instead of solder bonding. The circuit board assembly 25 has a long circuit sheet 251 and a short circuit board 253 that are adhered to each other with the short circuit board 253 being adjacent to the side edge of the long circuit sheet 251. The short circuit board 253 may be provided with power supply module 250 to form the power supply 5. The short circuit board 253 is stiffer or more rigid than the long circuit sheet 251 to be able to support the power supply module 250.

The long circuit sheet 251 may be the bendable circuit sheet of the LED light strip including a wiring layer 2a as shown in FIG. 7. The wiring layer 2a of the long circuit sheet 251 and the power supply module 250 may be electrically connected in various manners depending on the demand in practice. As shown in FIG. 19, the power supply module 250 and the long circuit sheet 251 having the wiring layer 2a on one surface are on the same side of the short circuit board 253 such that the power supply module 250 is directly connected to the long circuit sheet 251. As shown in FIG. 20, alternatively, the power supply module 250 and the long circuit sheet 251 including the wiring layer 2a on one surface are on opposite sides of the short circuit board 253 such that the power supply module 250 is directly connected to the short circuit board 253 and indirectly connected to the wiring layer 2a of the LED light strip 2 by way of the short circuit board 253.

As shown in FIG. 19, in one embodiment, the long circuit sheet 251 and the short circuit board 253 are adhered together first, and the power supply module 250 is subsequently mounted on the wiring layer 2a of the long circuit sheet 251 serving as the LED light strip 2. The long circuit sheet 251 of the LED light strip 2 herein is not limited to include only one wiring layer 2a and may further include another wiring layer such as the wiring layer 2c shown in FIG. 23. The light sources 202 are disposed on the wiring layer 2a of the LED light strip 2 and electrically connected to the power supply 5 by way of the wiring layer 2a. As shown in FIG. 20, in another embodiment, the long circuit sheet 251 of the LED light strip 2 may include a wiring layer 2a and a dielectric layer 2b. The dielectric layer 2b may be adhered to the short circuit board 253 first and the wiring layer 2a is subsequently adhered to the dielectric layer 2b and extends to the short circuit board 253. All these embodiments are within the scope of applying the circuit board assembly concept of the present invention.

In the above-mentioned embodiments, the short circuit board 253 may have a length generally of about 15 mm to about 40 mm and in some preferable embodiments about 19 mm to about 36 mm, while the long circuit sheet 251 may have a length generally of about 800 mm to about 2800 mm and in some embodiments of about 1200 mm to about 2400 mm. A ratio of the length of the short circuit board 253 to the length of the long circuit sheet 251 ranges from, for example, about 1:20 to about 1:200.

When the ends of the LED light strip 2 are not fixed on the inner surface of the lamp tube 1, the connection between the LED light strip 2 and the power supply 5 via soldering bonding would likely not firmly support the power supply 5, and it may be necessary to dispose the power supply 5 inside the end cap 3. For example, a longer end cap to have enough space for receiving the power supply 5 may be used. However, this will reduce the length of the lamp tube under the prerequisite that the total length of the LED tube lamp is fixed according to the product standard, and may therefore decrease the effective illuminating areas.

Referring to FIG. 22, in one embodiment, a hard circuit board 22 made of aluminum is used instead of the bendable circuit sheet, such that the ends or terminals of the hard circuit board 22 can be mounted at ends of the lamp tube 1, and the power supply 5 is solder bonded to one of the ends or terminals of the hard circuit board 22 in a manner such that the printed circuit board of the power supply 5 is not parallel but may be perpendicular to the hard circuit board 22 to save space in the longitudinal direction used for the end cap. This solder bonding technique may be more convenient to accomplish and the effective illuminating areas of the LED tube lamp could also remain. Moreover, a conductive lead 53 for electrical connection with the end cap 3 could be formed directly on the power supply 5 without soldering other metal wires between the power supply 5 and the hollow conductive pin 301 as shown in FIG. 3, and which facilitates the manufacturing of the LED tube lamp.

Next, examples of the circuit design and using of the power supply module 250 are described as follows.

Figure 24A:
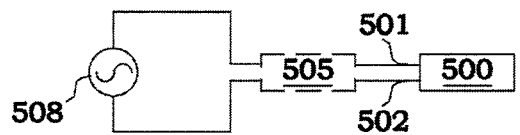
FIG. 24A is a block diagram of an exemplary power supply system for an LED tube lamp according to some embodiments of the present invention.

FIG. 24A is a block diagram of a power supply system for an LED tube lamp according to an embodiment of the present invention.

Referring to FIG. 24A, an AC power supply 508 is used to supply an AC supply signal, and may be an AC powerline with a voltage rating, for example, in 100-277 volts and a frequency rating, for example, of 50 or 60 Hz. A lamp driving circuit 505 receives and then converts the AC supply signal into an AC driving signal as an external driving signal (external, in that it is external to the LED tube lamp). Lamp driving circuit 505 may be for example an electronic ballast used to convert the AC powerline into a high-frequency high-voltage AC driving signal. Common types of electronic ballast include instant-start ballast, program-start or rapid-start ballast, etc., which may all be applicable to the LED tube lamp of the present disclosure. The voltage of the AC driving signal is in some embodiments higher than 300 volts, and is in some embodiments in the range of about 400-700 volts. The frequency of the AC driving signal is in some embodiments higher than 10 k Hz, and is in some embodiments in the range of about 20 k-50 k Hz. The LED tube lamp 500 receives an external driving signal and is thus driven to emit light via the LED light sources 202. In one embodiment, the external driving signal comprises the AC driving signal from lamp driving circuit 505. In one embodiment, LED tube lamp 500 is in a driving environment in which it is power-supplied at only one end cap having two conductive pins 501 and 502, which are coupled to lamp driving circuit 505 to receive the AC driving signal. The two conductive pins 501 and 502 may be electrically connected to, either directly or indirectly, the lamp driving circuit 505.

It is worth noting that lamp driving circuit 505 may be omitted and is therefore depicted by a dotted line. In one embodiment, if lamp driving circuit 505 is omitted, AC power supply 508 is directly connected to pins 501 and 502, which then receive the AC supply signal as an external driving signal.

Figure 24B:
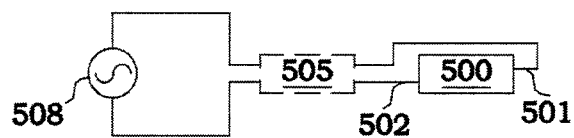
FIG. 24B is a block diagram of an exemplary power supply system for an LED tube lamp according to some embodiments of the present invention.

In addition to the above use with a single-end power supply, LED tube lamp 500 may instead be used with a dual-end power supply to one pin at each of the two ends of an LED lamp tube. FIG. 24B is a block diagram of a power supply system for an LED tube lamp according to one embodiment of the present invention. Referring to FIG. 24B, compared to that shown in FIG. 24A, pins 501 and 502 are respectively disposed at the two opposite end caps of LED tube lamp 500, forming a single pin at each end of LED tube lamp 500, with other components and their functions being the same as those in FIG. 24A.

Figure 24C:
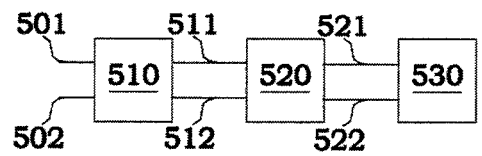
FIG. 24C is a block diagram showing elements of an exemplary LED lamp according to some embodiments of the present invention.

FIG. 24C is a block diagram showing elements of an LED lamp according to one embodiment of the present invention. Referring to FIG. 24C, the power supply module 250 of the LED lamp may include a rectifying circuit 510 and a filtering circuit 520, and may also include some components of an LED lighting module 530. Rectifying circuit 510 is coupled to pins 501 and 502 to receive and then rectify an external driving signal, so as to output a rectified signal at output terminals 511 and 512. The external driving signal may be the AC driving signal or the AC supply signal described with reference to FIGS. 24A and 24B, or may even be a DC signal, which in some embodiments does not alter the LED lamp of the present invention. Filtering circuit 520 is coupled to the first rectifying circuit for filtering the rectified signal to produce a filtered signal. For instance, filtering circuit 520 is coupled to terminals 511 and 512 to receive and then filter the rectified signal, so as to output a filtered signal at output terminals 521 and 522. LED lighting module 530 is coupled to filtering circuit 520, to receive the filtered signal for emitting light. For instance, LED lighting module 530 may include a circuit coupled to terminals 521 and 522 to receive the filtered signal and thereby to drive an LED unit (e.g., LED light sources 202 on an LED light strip 2, as discussed above, and not shown in FIG. 24C). For example, as described in more detail below, LED lighting module 530 may include a driving circuit coupled to an LED module to emit light. Details of these operations are described in below descriptions of certain embodiments.

It is worth noting that although there are two output terminals 511 and 512 and two output terminals 521 and 522 in embodiments of these Figs., in practice the number of ports or terminals for coupling between rectifying circuit 510, filtering circuit 520, and LED lighting module 530 may be one or more depending on the needs of signal transmission between the circuits or devices.

In addition, the power supply module of the LED lamp described in FIG. 24C, and embodiments of the power supply module of an LED lamp described below, may each be used in the LED tube lamp 500 in FIGS. 24A and 24B, and may instead be used in any other type of LED lighting structure having two conductive pins used to conduct power, such as LED light bulbs, personal area lights (PAL), plug-in LED lamps with different types of bases (such as types of PL-S, PL-D, PL-T, PL-L, etc.), etc.

Figure 24D:
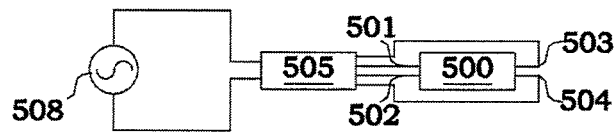
FIG. 24D is a block diagram of an exemplary power supply system for an LED tube lamp according to some embodiments of the present invention.

FIG. 24D is a block diagram of a power supply system for an LED tube lamp according to an embodiment of the present invention. Referring to FIG. 24D, an AC power supply 508 is used to supply an AC supply signal. A lamp driving circuit 505 receives and then converts the AC supply signal into an AC driving signal. An LED tube lamp 500 receives an AC driving signal from lamp driving circuit 505 and is thus driven to emit light. In this embodiment, LED tube lamp 500 is power-supplied at its both end caps respectively having two pins 501 and 502 and two pins 503 and 504, which are coupled to lamp driving circuit 505 to concurrently receive the AC driving signal to drive an LED unit (not shown) in LED tube lamp 500 to emit light. AC power supply 508 may be, e.g., the AC powerline, and lamp driving circuit 505 may be a stabilizer or an electronic ballast.

Figure 24E:
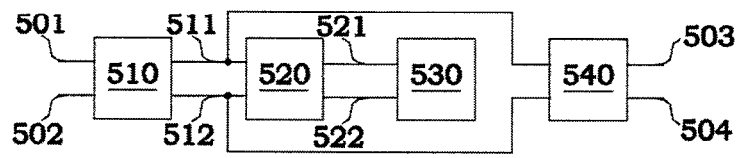
FIG. 24E is a block diagram showing elements of an LED lamp according to some embodiments of the present invention.

FIG. 24E is a block diagram showing components of an LED lamp according to an embodiment of the present invention. Referring to FIG. 24E, the power supply module of the LED lamp includes a rectifying circuit 510, a filtering circuit 520, and a rectifying circuit 540, and may also include some components of an LED lighting module 530. Rectifying circuit 510 is coupled to pins 501 and 502 to receive and then rectify an external driving signal conducted by pins 501 and 502. Rectifying circuit 540 is coupled to pins 503 and 504 to receive and then rectify an external driving signal conducted by pins 503 and 504. Therefore, the power supply module of the LED lamp may include two rectifying circuits 510 and 540 configured to output a rectified signal at output terminals 511 and 512. Filtering circuit 520 is coupled to terminals 511 and 512 to receive and then filter the rectified signal, so as to output a filtered signal at output terminals 521 and 522. LED lighting module 530 is coupled to terminals 521 and 522 to receive the filtered signal and thereby to drive an LED unit (not shown) of LED lighting module 530 to emit light.

The power supply module of the LED lamp in this embodiment of FIG. 24E may be used in LED tube lamp 500 with a dual-end power supply in FIG. 24D. It is worth noting that since the power supply module of the LED lamp comprises rectifying circuits 510 and 540, the power supply module of the LED lamp may be used in LED tube lamps 500 with a single-end power supply in FIGS. 24A and 24B, to receive an external driving signal (such as the AC supply signal or the AC driving signal described above). The power supply module of an LED lamp in this embodiment and other embodiments herein may also be used with a DC driving signal.

Figure 25A:
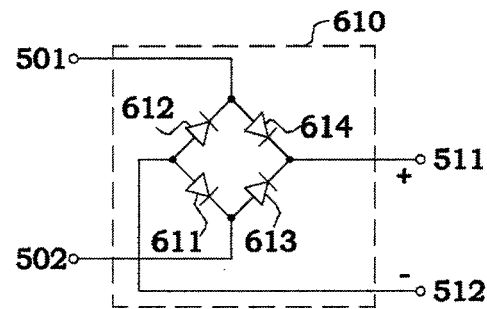
FIG. 25A is a schematic diagram of a rectifying circuit according to some embodiments of the present invention.

FIG. 25A is a schematic diagram of a rectifying circuit according to an embodiment of the present invention. Referring to FIG. 25A, rectifying circuit 610 includes rectifying diodes 611, 612, 613, and 614, configured to full-wave rectify a received signal. Diode 611 has an anode connected to output terminal 512, and a cathode connected to pin 502. Diode 612 has an anode connected to output terminal 512, and a cathode connected to pin 501. Diode 613 has an anode connected to pin 502, and a cathode connected to output terminal 511. Diode 614 has an anode connected to pin 501, and a cathode connected to output terminal 511.

When pins 501 and 502 (generally referred to as terminals) receive an AC signal, rectifying circuit 610 operates as follows. During the connected AC signal's positive half cycle, the AC signal is input through pin 501, diode 614, and output terminal 511 in sequence, and later output through output terminal 512, diode 611, and pin 502 in sequence. During the connected AC signal's negative half cycle, the AC signal is input through pin 502, diode 613, and output terminal 511 in sequence, and later output through output terminal 512, diode 612, and pin 501 in sequence. Therefore, during the connected AC signal's full cycle, the positive pole of the rectified signal produced by rectifying circuit 610 remains at output terminal 511, and the negative pole of the rectified signal remains at output terminal 512. Accordingly, the rectified signal produced or output by rectifying circuit 610 is a full-wave rectified signal.

When pins 501 and 502 are coupled to a DC power supply to receive a DC signal, rectifying circuit 610 operates as follows. When pin 501 is coupled to the anode of the DC supply and pin 502 to the cathode of the DC supply, the DC signal is input through pin 501, diode 614, and output terminal 511 in sequence, and later output through output terminal 512, diode 611, and pin 502 in sequence. When pin 501 is coupled to the cathode of the DC supply and pin 502 to the anode of the DC supply, the DC signal is input through pin 502, diode 613, and output terminal 511 in sequence, and later output through output terminal 512, diode 612, and pin 501 in sequence. Therefore, no matter what the electrical polarity of the DC signal is between pins 501 and 502, the positive pole of the rectified signal produced by rectifying circuit 610 remains at output terminal 511, and the negative pole of the rectified signal remains at output terminal 512.

Therefore, rectifying circuit 610 in this embodiment can output or produce a proper rectified signal regardless of whether the received input signal is an AC or DC signal.

Figure 25B:
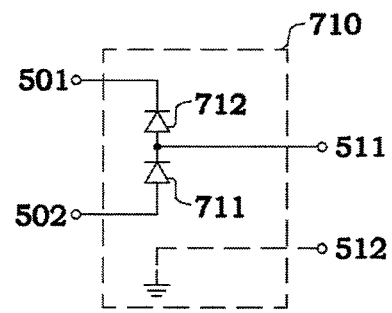
FIG. 25B is a schematic diagram of a rectifying circuit according to some embodiments of the present invention.

FIG. 25B is a schematic diagram of a rectifying circuit according to an embodiment of the present invention. Referring to FIG. 25B, rectifying circuit 710 includes rectifying diodes 711 and 712, configured to half-wave rectify a received signal. Diode 711 has an anode connected to pin 502, and a cathode connected to output terminal 511. Diode 712 has an anode connected to output terminal 511, and a cathode connected to pin 501. Output terminal 512 may be omitted or grounded depending on actual applications.

Next, exemplary operation(s) of rectifying circuit 710 is described as follows.

In one embodiment, during a received AC signal's positive half cycle, the electrical potential at pin 501 is higher than that at pin 502, so diodes 711 and 712 are both in a cutoff state as being reverse-biased, making rectifying circuit 710 not outputting a rectified signal. During a received AC signal's negative half cycle, the electrical potential at pin 501 is lower than that at pin 502, so diodes 711 and 712 are both in a conducting state as being forward-biased, allowing the AC signal to be input through diode 711 and output terminal 511, and later output through output terminal 512, a ground terminal, or another end of the LED tube lamp not directly connected to rectifying circuit 710. Accordingly, the rectified signal produced or output by rectifying circuit 710 is a half-wave rectified signal.

Figure 25C:
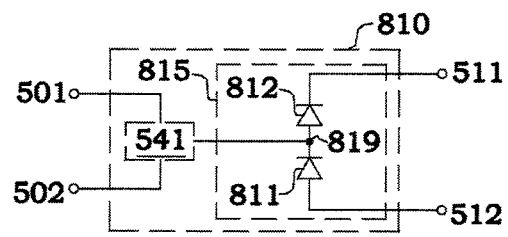
FIG. 25C is a schematic diagram of a rectifying circuit according to some embodiments of the present invention.

FIG. 25C is a schematic diagram of a rectifying circuit according to an embodiment of the present invention. Referring to FIG. 25C, rectifying circuit 810 includes a rectifying unit 815 and a terminal adapter circuit 541. In this embodiment, rectifying unit 815 comprises a half-wave rectifier circuit including diodes 811 and 812 and configured to half-wave rectify. Diode 811 has an anode connected to an output terminal 512, and a cathode connected to a half-wave node 819. Diode 812 has an anode connected to half-wave node 819, and a cathode connected to an output terminal 511. Terminal adapter circuit 541 is coupled to half-wave node 819 and pins 501 and 502, to transmit a signal received at pin 501 and/or pin 502 to half-wave node 819. By means of the terminal adapting function of terminal adapter circuit 541, rectifying circuit 810 includes two input terminals (connected to pins 501 and 502) and two output terminals 511 and 512.

Next, in certain embodiments, rectifying circuit 810 operates as follows.

During a received AC signal's positive half cycle, the AC signal may be input through pin 501 or 502, terminal adapter circuit 541, half-wave node 819, diode 812, and output terminal 511 in sequence, and later output through another end or circuit of the LED tube lamp. During a received AC signal's negative half cycle, the AC signal may be input through another end or circuit of the LED tube lamp, and later output through output terminal 512, diode 811, half-wave node 819, terminal adapter circuit 541, and pin 501 or 502 in sequence.

It's worth noting that terminal adapter circuit 541 may comprise a resistor, a capacitor, an inductor, or any combination thereof, for performing functions of voltage/current regulation or limiting, types of protection, current/voltage regulation, etc. Descriptions of these functions are presented below.

Figure 25D:
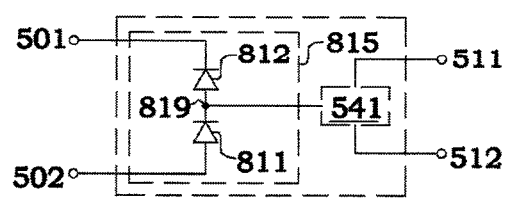
FIG. 25D is a schematic diagram of a rectifying circuit according to some embodiments of the present invention.

In practice, rectifying unit 815 and terminal adapter circuit 541 may be interchanged in position (as shown in FIG. 25D), without altering the function of half-wave rectification. FIG. 25D is a schematic diagram of a rectifying circuit according to an embodiment of the present invention. Referring to FIG. 25D, diode 811 has an anode connected to pin 502 and diode 812 has a cathode connected to pin 501. A cathode of diode 811 and an anode of diode 812 are connected to half-wave node 819. Terminal adapter circuit 541 is coupled to half-wave node 819 and output terminals 511 and 512. During a received AC signal's positive half cycle, the AC signal may be input through another end or circuit of the LED tube lamp, and later output through output terminal 511 or 512, terminal adapter circuit 541, half-wave node 819, diode 812, and pin 501 in sequence. During a received AC signal's negative half cycle, the AC signal may be input through pin 502, diode 811, half-wave node 819, terminal adapter circuit 541, and output node 511 or 512 in sequence, and later output through another end or circuit of the LED tube lamp.

It is worth noting that terminal adapter circuit 541 in embodiments shown in FIGS. 25C and 25D may be omitted and is therefore depicted by a dotted line. If terminal adapter circuit 541 of FIG. 25C is omitted, pins 501 and 502 will be coupled to half-wave node 819. If terminal adapter circuit 541 of FIG. 25D is omitted, output terminals 511 and 512 will be coupled to half-wave node 819.

Rectifying circuit 510 as shown and explained in FIGS. 25A-D can constitute or be the rectifying circuit 540 shown in FIG. 24E, as having pins 503 and 504 for conducting instead of pins 501 and 502.

Next, an explanation follows as to choosing embodiments and their combinations of rectifying circuits 510 and 540, with reference to FIGS. 24C and 24E.

Rectifying circuit 510 in embodiments shown in FIG. 24C may comprise, for example, the rectifying circuit 610 in FIG. 25A.

Rectifying circuits 510 and 540 in embodiments shown in FIG. 24E may each comprise, for example, any one of the rectifying circuits in FIGS. 25A-D, and terminal adapter circuit 541 in FIGS. 25C-D may be omitted without altering the rectification function used in an LED tube lamp. When rectifying circuits 510 and 540 each comprise a half-wave rectifier circuit described in FIGS. 25B-D, during a received AC signal's positive or negative half cycle, the AC signal may be input from one of rectifying circuits 510 and 540, and later output from the other rectifying circuit 510 or 540. Further, when rectifying circuits 510 and 540 each comprise the rectifying circuit described in FIG. 25C or 25D, or when they comprise the rectifying circuits in FIGS. 25C and 25D respectively, only one terminal adapter circuit 541 may be needed for functions of voltage/current regulation or limiting, types of protection, current/voltage regulation, etc. within rectifying circuits 510 and 540, omitting another terminal adapter circuit 541 within rectifying circuit 510 or 540.

Figure 26A:
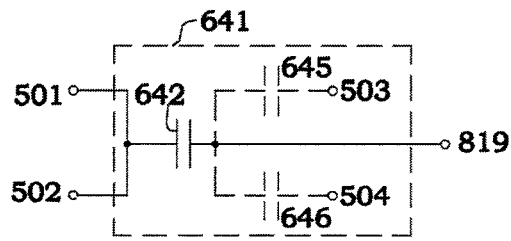
FIG. 26A is a schematic diagram of a terminal adapter circuit according to some embodiments of the present invention.

FIG. 26A is a schematic diagram of a terminal adapter circuit according to an embodiment of the present invention. Referring to FIG. 26A, terminal adapter circuit 641 comprises a capacitor 642 having an end connected to pins 501 and 502, and another end connected to half-wave node 819. In one embodiment, capacitor 642 has an equivalent impedance to an AC signal, which impedance increases as the frequency of the AC signal decreases, and decreases as the frequency increases. Therefore, capacitor 642 in terminal adapter circuit 641 in this embodiment works as a high-pass filter. Further, terminal adapter circuit 641 is connected in series to an LED unit in the LED tube lamp, producing an equivalent impedance of terminal adapter circuit 641 to perform a current/voltage limiting function on the LED unit, thereby preventing damaging of the LED unit by an excessive voltage across and/or current in the LED unit. In addition, choosing the value of capacitor 642 according to the frequency of the AC signal can further enhance voltage/current regulation.

It's worth noting that terminal adapter circuit 641 may further include a capacitor 645 and/or capacitor 646. Capacitor 645 has an end connected to half-wave node 819, and another end connected to pin 503. Capacitor 646 has an end connected to half-wave node 819, and another end connected to pin 504. For example, half-wave node 819 may be a common connective node between capacitors 645 and 646. And capacitor 642 acting as a current regulating capacitor is coupled to the common connective node and pins 501 and 502. In such a structure, series-connected capacitors 642 and 645 exist between one of pins 501 and 502 and pin 503, and/or series-connected capacitors 642 and 646 exist between one of pins 501 and 502 and pin 504. Through equivalent impedances of series-connected capacitors, voltages from the AC signal are divided. Referring to FIGS. 24E and 26A, according to ratios between equivalent impedances of the series-connected capacitors, the voltages respectively across capacitor 642 in rectifying circuit 510, filtering circuit 520, and LED driving module 530 can be controlled, making the current flowing through an LED module coupled to LED driving module 530 being limited within a current rating, and then protecting/preventing filtering circuit 520 and LED module from being damaged by excessive voltages.

Figure 26B:
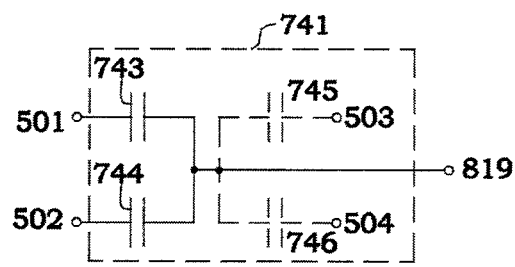
FIG. 26B is a schematic diagram of a terminal adapter circuit according to some embodiments of the present invention.

FIG. 26B is a schematic diagram of the terminal adapter circuit according to an embodiment of the present invention. Referring to FIG. 26B, terminal adapter circuit 741 comprises capacitors 743 and 744. Capacitor 743 has an end connected to pin 501, and another end connected to half-wave node 819. Capacitor 744 has an end connected to pin 502, and another end connected to half-wave node 819. Compared to terminal adapter circuit 641 in FIG. 26A, terminal adapter circuit 741 has capacitors 743 and 744 in place of capacitor 642. Capacitance values of capacitors 743 and 744 may be the same as each other, or may differ from each other depending on the magnitudes of signals to be received at pins 501 and 502.

Similarly, terminal adapter circuit 741 may further comprise a capacitor 745 and/or a capacitor 746, respectively connected to pins 503 and 504. Thus, each of pins 501 and 502 and each of pins 503 and 504 may be connected in series to a capacitor, to achieve the functions of voltage division and other protections.

Figure 26C:
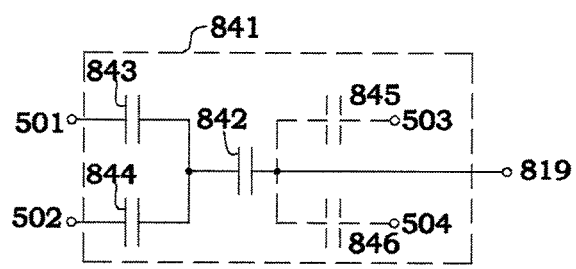
FIG. 26C is a schematic diagram of a terminal adapter circuit according to some embodiments of the present invention.

FIG. 26C is a schematic diagram of the terminal adapter circuit according to an embodiment of the present invention. Referring to FIG. 26C, terminal adapter circuit 841 comprises capacitors 842, 843, and 844. Capacitors 842 and 843 are connected in series between pin 501 and half-wave node 819. Capacitors 842 and 844 are connected in series between pin 502 and half-wave node 819. In such a circuit structure, if any one of capacitors 842, 843, and 844 is shorted, there is still at least one capacitor (of the other two capacitors) between pin 501 and half-wave node 819 and between pin 502 and half-wave node 819, which performs a current-limiting function. Therefore, in the event that a user accidentally gets an electric shock, this circuit structure will prevent an excessive current flowing through and then seriously hurting the body of the user.

Similarly, terminal adapter circuit 841 may further comprise a capacitor 845 and/or a capacitor 846, respectively connected to pins 503 and 504. Thus, each of pins 501 and 502 and each of pins 503 and 504 may be connected in series to a capacitor, to achieve the functions of voltage division and other protections.

Figure 26D:
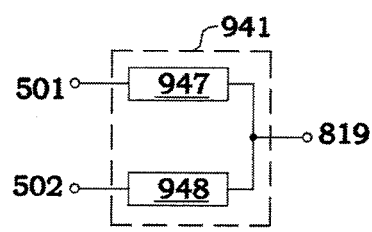
FIG. 26D is a schematic diagram of a terminal adapter circuit according to some embodiments of the present invention.

FIG. 26D is a schematic diagram of the terminal adapter circuit according to an embodiment of the present invention. Referring to FIG. 26D, terminal adapter circuit 941 comprises fuses 947 and 948. Fuse 947 has an end connected to pin 501, and another end connected to half-wave node 819. Fuse 948 has an end connected to pin 502, and another end connected to half-wave node 819. With the fuses 947 and 948, when the current through each of pins 501 and 502 exceeds a current rating of a corresponding connected fuse 947 or 948, the corresponding fuse 947 or 948 will accordingly melt and then break the circuit to achieve overcurrent protection. The terminal adapter circuits described above may be described as current limiting circuits, and/or voltage limiting circuits.

Each of the embodiments of the terminal adapter circuits as described in rectifying circuits 510 and 810 coupled to pins 501 and 502 and shown and explained above can be used or included in the rectifying circuit 540 shown in FIG. 24E, to be connected to conductive pins 503 and 504 in a similar manner as described above in connection with conductive pins 501 and 502.

Capacitance values of the capacitors in the embodiments of the terminal adapter circuits shown and described above are in some embodiments in the range, for example, of about 100 pF-100 nF. Also, a capacitor used in embodiments may be equivalently replaced by two or more capacitors connected in series or parallel. For example, each of capacitors 642 and 842 may be replaced by two series-connected capacitors, one having a capacitance value chosen from the range, for example of about 1.0 nF to about 2.5 nF and which may be in some embodiments preferably 1.5 nF, and the other having a capacitance value chosen from the range, for example of about 1.5 nF to about 3.0 nF, and which is in some embodiments about 2.2 nF.

Figure 27A:
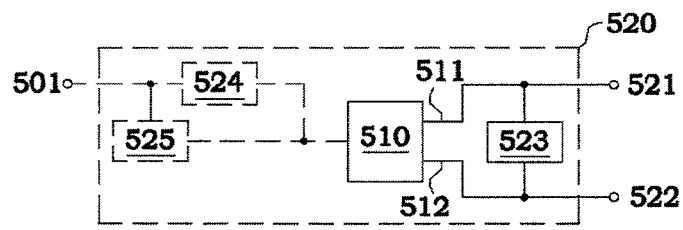
FIG. 27A is a block diagram of a filtering circuit according to some embodiments of the present invention.

FIG. 27A is a block diagram of the filtering circuit according to an embodiment of the present invention. Rectifying circuit 510 is shown in FIG. 27A for illustrating its connection with other components, without intending filtering circuit 520 to include rectifying circuit 510. Referring to FIG. 27A, filtering circuit 520 includes a filtering unit 523 coupled to rectifying output terminals 511 and 512 to receive, and to filter out ripples of a rectified signal from rectifying circuit 510, thereby outputting a filtered signal whose waveform is smoother than the rectified signal. Filtering circuit 520 may further comprise another filtering unit 524 coupled between a rectifying circuit and a pin, which are for example rectifying circuit 510 and pin 501, rectifying circuit 510 and pin 502, rectifying circuit 540 and pin 503, or rectifying circuit 540 and pin 504. Filtering unit 524 is for filtering of a specific frequency, in order to filter out a specific frequency component of an external driving signal. In this embodiment of FIG. 27A, filtering unit 524 is coupled between rectifying circuit 510 and pin 501. Filtering circuit 520 may further comprise another filtering unit 525 coupled between one of pins 501 and 502 and a diode of rectifying circuit 510, or between one of pins 503 and 504 and a diode of rectifying circuit 540, for reducing or filtering out electromagnetic interference (EMI). In this embodiment, filtering unit 525 is coupled between pin 501 and a diode (not shown in FIG. 27A) of rectifying circuit 510. Since filtering units 524 and 525 may be present or omitted depending on actual circumstances of their uses, they are depicted by a dotted line in FIG. 27A. Filtering units 523, 524, and 525 may be referred to herein as filtering sub-circuits of filtering circuit 520, or may be generally referred to as a filtering circuit.

Figure 27B:
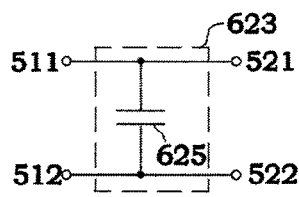
FIG. 27B is a schematic diagram of a filtering unit according to some embodiments of the present invention.

FIG. 27B is a schematic diagram of a filtering unit according to one embodiment of the present invention. Referring to FIG. 27B, filtering unit 623 includes a capacitor 625 having an end coupled to output terminal 511 and a filtering output terminal 521 and another end coupled to output terminal 512 and a filtering output terminal 522, and is configured to low-pass filter a rectified signal from output terminals 511 and 512, so as to filter out high-frequency components of the rectified signal and thereby output a filtered signal at output terminals 521 and 522.

Figure 27C:
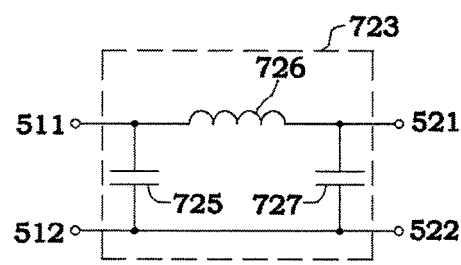
FIG. 27C is a schematic diagram of a filtering unit according to some embodiments of the present invention.

FIG. 27C is a schematic diagram of a filtering unit according to one embodiment of the present invention. Referring to FIG. 27C, filtering unit 723 comprises a pi filter circuit including a capacitor 725, an inductor 726, and a capacitor 727. As is well known, a pi filter circuit looks like the symbol π in its shape or structure. Capacitor 725 has an end connected to output terminal 511 and coupled to output terminal 521 through inductor 726, and has another end connected to output terminals 512 and 522. Inductor 726 is coupled between output terminals 511 and 521. Capacitor 727 has an end connected to output terminal 521 and coupled to output terminal 511 through inductor 726, and has another end connected to output terminals 512 and 522.

As seen between output terminals 511 and 512 and output terminals 521 and 522, filtering unit 723 compared to filtering unit 623 in FIG. 27B additionally has inductor 726 and capacitor 727, which are like capacitor 725 in performing low-pass filtering. Therefore, filtering unit 723 in this embodiment compared to filtering unit 623 in FIG. 27B has a better ability to filter out high-frequency components to output a filtered signal with a smoother waveform.

Inductance values of inductor 726 in the embodiment described above are chosen in some embodiments in the range of about 10 nH to about 10 mH. And capacitance values of capacitors 625, 725, and 727 in the embodiments described above are chosen in some embodiments in the range, for example, of about 100 pF to about 1 uF.

Figure 27D:
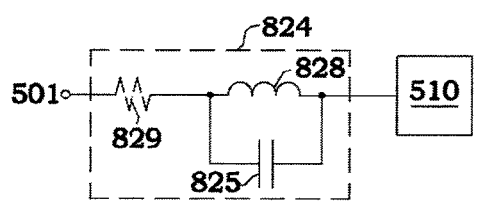
FIG. 27D is a schematic diagram of a filtering unit according to some embodiments of the present invention.

FIG. 27D is a schematic diagram of a filtering unit according to one embodiment of the present invention. Referring to FIG. 27D, filtering unit 824 includes a capacitor 825 and an inductor 828 connected in parallel. Capacitor 825 has an end coupled to pin 501, and another end coupled to rectifying output terminal 511 (not shown), and is configured to high-pass filter an external driving signal input at pin 501, so as to filter out low-frequency components of the external driving signal. Inductor 828 has an end coupled to pin 501 and another end coupled to rectifying output terminal 511, and is configured to low-pass filter an external driving signal input at pin 501, so as to filter out high-frequency components of the external driving signal. Therefore, the combination of capacitor 825 and inductor 828 works to present high impedance to an external driving signal at one or more specific frequencies. Thus, the parallel-connected capacitor and inductor work to present a peak equivalent impedance to the external driving signal at a specific frequency.

Through appropriately choosing a capacitance value of capacitor 825 and an inductance value of inductor 828, a center frequency f on the high-impedance band may be set at a specific value given by $$f = \frac{1}{2\pi)LC},$$

where L denotes inductance of inductor 828 and C denotes capacitance of capacitor 825. The center frequency is in some embodiments in the range of about 20~30 kHz, and may be preferably about 25 kHz. And an LED lamp with filtering unit 824 is able to be certified under safety standards, for a specific center frequency, as provided by Underwriters Laboratories (UL).

It's worth noting that filtering unit 824 may further comprise a resistor 829, coupled between pin 501 and filtering output terminal 511. In FIG. 27D, resistor 829 is connected in series to the parallel-connected capacitor 825 and inductor 828. For example, resistor 829 may be coupled between pin 501 and parallel-connected capacitor 825 and inductor 828, or may be coupled between filtering output terminal 511 and parallel-connected capacitor 825 and inductor 828. In this embodiment, resistor 829 is coupled between pin 501 and parallel-connected capacitor 825 and inductor 828. Further, resistor 829 is configured for adjusting the quality factor (Q) of the LC circuit comprising capacitor 825 and inductor 828, to better adapt filtering unit 824 to application environments with different quality factor requirements. Since resistor 829 is an optional component, it is depicted in a dotted line in FIG. 27D.

Capacitance values of capacitor 825 are in some embodiments in the range of about 10 nF-2 uF. Inductance values of inductor 828 are in some embodiments smaller than 2 mH, and may be preferably smaller than 1 mH. Resistance values of resistor 829 are in some embodiments larger than 50 ohms, and are may be preferably larger than 500 ohms.

Besides the filtering circuits shown and described in the above embodiments, traditional low-pass or band-pass filters can be used as the filtering unit in the filtering circuit in the present invention.

Figure 27E:
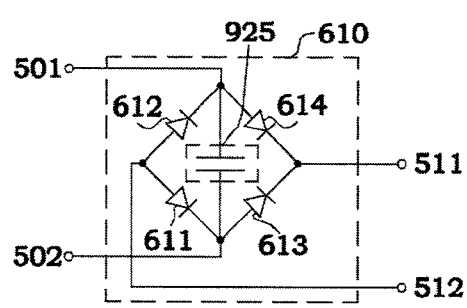
FIG. 27E is a schematic diagram of a filtering unit according to some embodiments of the present invention.

FIG. 27E is a schematic diagram of a filtering unit according to an embodiment of the present invention. Referring to FIG. 27E, in this embodiment filtering unit 925 is disposed in rectifying circuit 610 as shown in FIG. 25A, and is configured for reducing the EMI (Electromagnetic interference) caused by rectifying circuit 610 and/or other circuits. In this embodiment, filtering unit 925 includes an EMI-reducing capacitor coupled between pin 501 and the anode of rectifying diode 613, and also between pin 502 and the anode of rectifying diode 614, to reduce the EMI associated with the positive half cycle of the AC driving signal received at pins 501 and 502. The EMI-reducing capacitor of filtering unit 925 is also coupled between pin 501 and the cathode of rectifying diode 611, and between pin 502 and the cathode of rectifying diode 612, to reduce the EMI associated with the negative half cycle of the AC driving signal received at pins 501 and 502. In some embodiments, rectifying circuit 610 comprises a full-wave bridge rectifier circuit including four rectifying diodes 611, 612, 613, and 614. The full-wave bridge rectifier circuit has a first filtering node connecting an anode and a cathode respectively of two diodes 613 and 611 of the four rectifying diodes 611, 612, 613, and 614, and a second filtering node connecting an anode and a cathode respectively of the other two diodes 614 and 612 of the four rectifying diodes 611, 612, 613, and 614. And the EMI-reducing capacitor of the filtering unit 925 is coupled between the first filtering node and the second filtering node.

Similarly, with reference to FIGS. 25C, and 26A-26C, each capacitor in each of the circuits in FIGS. 26A-26C may be coupled between pins 501 and 502 (or pins 503 and 504) and any diode in FIG. 25C, so any or each capacitor in FIGS. 26A-26C can work as an EMI-reducing capacitor to achieve the function of reducing EMI. For example, rectifying circuit 510 in FIGS. 24C and 24E may comprise a half-wave rectifier circuit including two rectifying diodes and having a half-wave node connecting an anode and a cathode respectively of the two rectifying diodes, and any or each capacitor in FIGS. 26A-26C may be coupled between the half-wave node and at least one of the first pin and the second pin. And rectifying circuit 540 in FIG. 24E may comprise a half-wave rectifier circuit including two rectifying diodes and having a half-wave node connecting an anode and a cathode respectively of the two rectifying diodes, and any or each capacitor in FIGS. 26A-26C may be coupled between the half-wave node and at least one of the third pin and the fourth pin.

It's worth noting that the EMI-reducing capacitor in the embodiment of FIG. 27E may also act as capacitor 825 in filtering unit 824, so that in combination with inductor 828 the capacitor 825 performs the functions of reducing EMI and presenting high impedance to an external driving signal at specific frequencies. For example, when the rectifying circuit comprises a full-wave bridge rectifier circuit, capacitor 825 of filtering unit 824 may be coupled between the first filtering node and the second filtering node of the full-wave bridge rectifier circuit. When the rectifying circuit comprises a half-wave rectifier circuit, capacitor 825 of filtering unit 824 may be coupled between the half-wave node of the half-wave rectifier circuit and at least one of the first pin and the second pin.

Figure 28A:
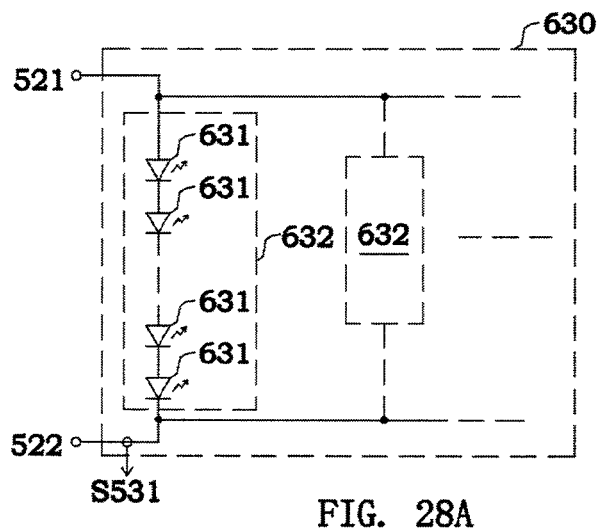
FIG. 28A is a schematic diagram of an LED module according to some embodiments of the present invention.

FIG. 28A is a schematic diagram of an LED module according to an embodiment of the present invention. Referring to FIG. 28A, LED module 630 has an anode connected to the filtering output terminal 521, has a cathode connected to the filtering output terminal 522, and comprises at least one LED unit 632. When two or more LED units are included, they are connected in parallel. An anode of each LED unit 632 forms the anode of LED module 630 and is connected to output terminal 521, and a cathode of each LED unit 632 forms the cathode of LED module 630 and is connected to output terminal 522. Each LED unit 632 includes at least one LED 631. When multiple LEDs 631 are included in an LED unit 632, they are connected in series, with the anode of the first LED 631 forming the anode of the LED unit 632 that it is a part of, and the cathode of the first LED 631 connected to the next or second LED 631. And the anode of the last LED 631 in this LED unit 632 is connected to the cathode of a previous LED 631, with the cathode of the last LED 631 forming the cathode of the LED unit 632 that it is a part of.

It's worth noting that LED module 630 may produce a current detection signal S531 reflecting a magnitude of current through LED module 630 and used for controlling or detecting current on the LED module 630. As described herein, an LED unit may refer to a single string of LEDs arranged in series, and an LED module may refer to a single LED unit, or a plurality of LED units connected to a same two nodes (e.g., arranged in parallel). For example, the LED light strip 2 described above may be an LED module and/or LED unit.

Figure 28B:
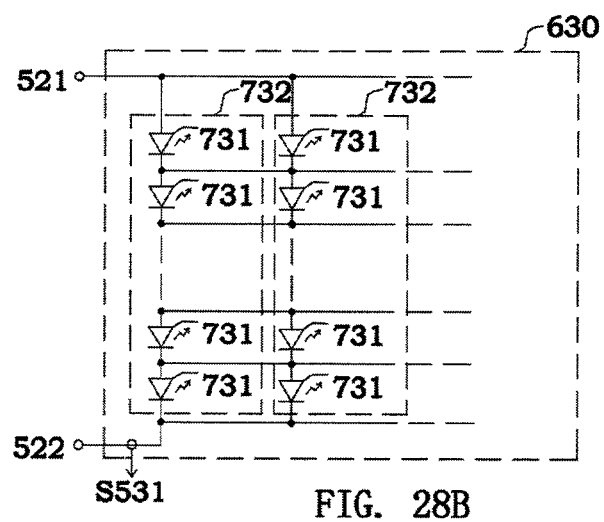
FIG. 28B is a schematic diagram of an LED module according to some embodiments of the present invention.

FIG. 28B is a schematic diagram of an LED module according to an embodiment of the present invention. Referring to FIG. 28B, LED module 630 has an anode connected to the filtering output terminal 521, has a cathode connected to the filtering output terminal 522, and comprises at least two LED units 732, with an anode of each LED unit 732 forming the anode of LED module 630, and a cathode of each LED unit 732 forming the cathode of LED module 630. Each LED unit 732 includes at least two LEDs 731 connected in the same way as described in FIG. 28A. For example, the anode of the first LED 731 in an LED unit 732 forms the anode of the LED unit 732 that it is a part of, the cathode of the first LED 731 is connected to the anode of the next or second LED 731, and the cathode of the last LED 731 forms the cathode of the LED unit 732 that it is a part of. Further, LED units 732 in an LED module 630 are connected to each other in this embodiment. All of the n-th LEDs 731 respectively of the LED units 732 are connected by every anode of every n-th LED 731 in the LED units 732, and by every cathode of every n-th LED 731, where n is a positive integer. In this way, the LEDs in LED module 630 in this embodiment are connected in the form of a mesh.

Compared to the embodiments of FIGS. 29A-29G, LED driving module 530 of the above embodiments includes LED module 630, but doesn't include a driving circuit for the LED module 630 (e.g., does not include an LED driving module or LED driving unit for the LED module or LED unit).

Similarly, LED module 630 in this embodiment may produce a current detection signal S531 reflecting a magnitude of current through LED module 630 and used for controlling or detecting current on the LED module 630.

In actual practice, the number of LEDs 731 included by an LED unit 732 is in some embodiments in the range of 15-25, and is may be preferably in the range of 18-22.

Figure 28C:
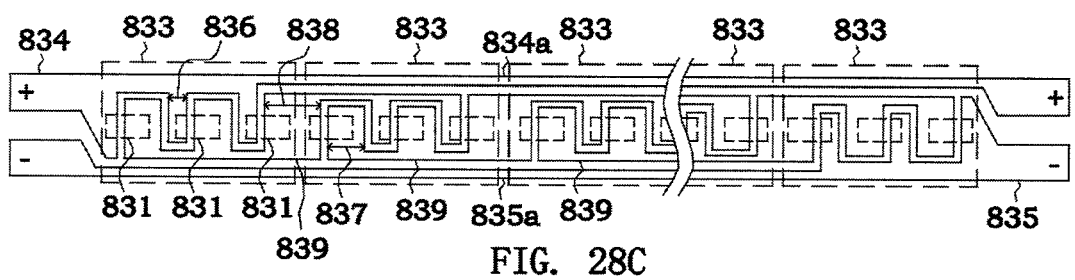
FIG. 28C is a plan view of a circuit layout of an LED module according to some embodiments of the present invention.

FIG. 28C is an exemplary plan view of a circuit layout of an LED module according to certain embodiments of the present invention. Referring to FIG. 28C, in this embodiment LEDs 831 are connected in the same way as described in FIG. 28B, and three LED units are assumed in LED module 630 and described as follows for illustration. A positive conductive line 834 and a negative conductive line 835 are to receive a driving signal, for supplying power to the LEDs 831. For example, positive conductive line 834 may be coupled to the filtering output terminal 521 of the filtering circuit 520 described above, and negative conductive line 835 coupled to the filtering output terminal 522 of the filtering circuit 520, to receive a filtered signal. For the convenience of illustration, all three of the n-th LEDs 831 respectively of the three LED units are grouped as an LED set 833 in FIG. 28C.

Positive conductive line 834 connects the three first LEDs 831 respectively of the three LED units, at the anodes on the left sides of the three first LEDs 831 as shown in the leftmost LED set 833 of FIG. 28C. The three first LEDs 831 may be the leftmost LEDs for each LED unit respectively. Negative conductive line 835 connects the three last LEDs 831 respectively of the three LED units, at the cathodes on the right sides of the three last LEDs 831 as shown in the rightmost LED set 833 of FIG. 28C. The three last LEDs 831 may be the rightmost LEDs for each LED unit respectively. For the three LED units, the cathodes of the three first LEDs 831, the anodes of the three last LEDs 831, and the anodes and cathodes of all the remaining LEDs 831 are connected by conductive lines or parts 839.

For example, the anodes of the three LEDs 831 in the leftmost LED set 833 may be connected together by positive conductive line 834, and their cathodes may be connected together by a leftmost conductive part 839. The anodes of the three LEDs 831 in the second leftmost LED set 833 are also connected together by the leftmost conductive part 839, whereas their cathodes are connected together by a second leftmost conductive part 839. Since the cathodes of the three LEDs 831 in the leftmost LED set 833 and the anodes of the three LEDs 831 in the second leftmost LED set 833 are connected together by the same leftmost conductive part 839, in each of the three LED units the cathode of the first LED 831 is connected to the anode of the next or second LED 831, with the remaining LEDs 831 also being connected in the same way. Accordingly, all the LEDs 831 of the three LED units are connected to form the mesh as shown in FIG. 28B. The LED module shown in FIG. 28C may form an LED light strip 2 such as described above.

It's worth noting that in the embodiment shown in FIG. 28C, the length 836 (e.g., length along a first direction that is a length direction of the LED light strip 2 and lamp tube 1) of a portion of each conductive part 839 that immediately connects to the anode of an LED 831 is smaller than the length 837 of another portion of each conductive part 839 that immediately connects to the cathode of an LED 831, making the area of the latter portion immediately connecting to the cathode larger than that of the former portion immediately connecting to the anode. The length 837 may be smaller than a length 838 of a portion of each conductive part 839 that immediately connects the cathode of an LED 831 and the anode of the next LED 831, making the area of the portion of each conductive part 839 that immediately connects a cathode and an anode larger than the area of any other portion of each conductive part 839 that immediately connects to only a cathode or an anode of an LED 831. Due to the length differences and area differences, this layout structure improves heat dissipation of the LEDs 831.

In some embodiments, positive conductive line 834 includes a lengthwise portion 834a, and negative conductive line 835 includes a lengthwise portion 835a, which are conducive to making the LED module have a positive "+" connective portion and a negative "−" connective portion at each of the two ends of the LED module, as shown in FIG. 28C. Such a layout structure allows for coupling certain of the various circuits of the power supply module of the LED lamp, including e.g. filtering circuit 520 and rectifying circuits 510 and 540, to the LED module through the positive connective portion and/or the negative connective portion at each or both ends of the LED lamp. Thus the layout structure increases the flexibility in arranging actual circuits in the LED lamp.

Figure 28D:
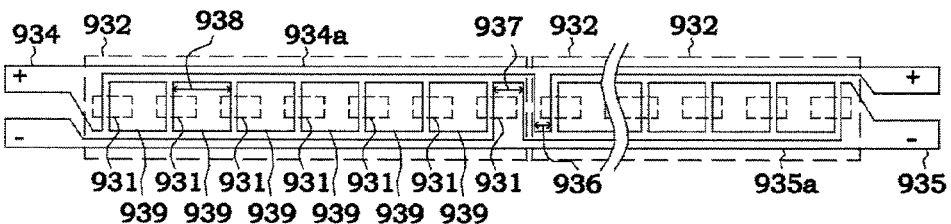
FIG. 28D is a plan view of a circuit layout of an LED module according to some embodiments of the present invention.

FIG. 28D is a plan view of a circuit layout of an LED module according to another embodiment of the present invention. Referring to FIG. 28D, in this embodiment LEDs 931 are connected in the same way as described in FIG. 28A, and three LED units each including 7 LEDs 931 are assumed in LED module 630 and described as follows for illustration. A positive conductive line 934 and a negative conductive line 935 are to receive a driving signal, for supplying power to the LEDs 931. For example, positive conductive line 934 may be coupled to the filtering output terminal 521 of the filtering circuit 520 described above, and negative conductive line 935 coupled to the filtering output terminal 522 of the filtering circuit 520, to receive a filtered signal. For the convenience of illustration, all seven LEDs 931 of each of the three LED units are grouped as an LED set 932 in FIG. 28D. Thus there are three LED sets 932 corresponding to the three LED units.

Positive conductive line 934 connects to the anode on the left side of the first or leftmost LED 931 of each of the three LED sets 932. Negative conductive line 935 connects to the cathode on the right side of the last or rightmost LED 931 of each of the three LED sets 932. In each LED set 932, of two consecutive LEDs 931 the LED 931 on the left has a cathode connected by a conductive part 939 to an anode of the LED 931 on the right. By such a layout, the LEDs 931 of each LED set 932 are connected in series.

It's also worth noting that a conductive part 939 may be used to connect an anode and a cathode respectively of two consecutive LEDs 931. Negative conductive line 935 connects to the cathode of the last or rightmost LED 931 of each of the three LED sets 932. And positive conductive line 934 connects to the anode of the first or leftmost LED 931 of each of the three LED sets 932. Therefore, as shown in FIG. 28D, the length (and thus area) of the conductive part 939 is larger than that of the portion of negative conductive line 935 immediately connecting to a cathode, which length (and thus area) is then larger than that of the portion of positive conductive line 934 immediately connecting to an anode. For example, the length 938 of the conductive part 939 may be larger than the length 937 of the portion of negative conductive line 935 immediately connecting to a cathode of an LED 931, which length 937 is then larger than the length 936 of the portion of positive conductive line 934 immediately connecting to an anode of an LED 931. Such a layout structure improves heat dissipation of the LEDs 931 in LED module 630.

Positive conductive line 934 may include a lengthwise portion 934a, and negative conductive line 935 may include a lengthwise portion 935a, which are conducive to making the LED module have a positive "+" connective portion and a negative "−" connective portion at each of the two ends of the LED module, as shown in FIG. 28D. Such a layout structure allows for coupling certain of the various circuits of the power supply module of the LED lamp, including e.g. filtering circuit 520 and rectifying circuits 510 and 540, to the LED module through the positive connective portion 934a and/or the negative connective portion 935a at each or both ends of the LED lamp.

The positive conductive lines (834 or 934) may be characterized as including two end terminals at opposite ends, a plurality of pads between the two end terminals and for contacting and/or supplying power to LEDs (e.g., anodes of LEDs), and a wire portion, which may be an elongated conducive line extending along a length of an LED light strip and electrically connecting the two end terminals to the plurality of pads. Similarly, the negative conductive lines (835 or 935) may be characterized as including two end terminals at opposite ends, a plurality of pads between the two end terminals and for contacting and/or supplying power to LEDs (e.g., cathodes of LEDs), and a wire portion, which may be an elongated conducive line extending along a length of an LED light strip and electrically connecting the two end terminals to the plurality of pads. Thus the layout structures shown above increase the flexibility in arranging actual circuits in the LED lamp.

Further, the circuit layouts as shown in FIGS. 28C and 28D may be implemented with a bendable circuit sheet or substrate, which may be a flexible circuit board. The circuit layouts may be implemented for one of the exemplary LED light strips described previously, for example, to serve as a circuit board or sheet for the LED light strip on which the LED light sources are disposed. For example, the bendable circuit sheet may comprise one conductive layer where positive conductive line 834, including positive lengthwise portion 834a, negative conductive line 835, including negative lengthwise portion 835a, and conductive parts 839 shown in FIG. 28C, and positive conductive line 934, including positive lengthwise portion 934a, negative conductive line 935, including negative lengthwise portion 935a, and conductive parts 939 shown in FIG. 28D are formed. For example, the different conductive patterns may be formed by an etching method.

Figure 28E:
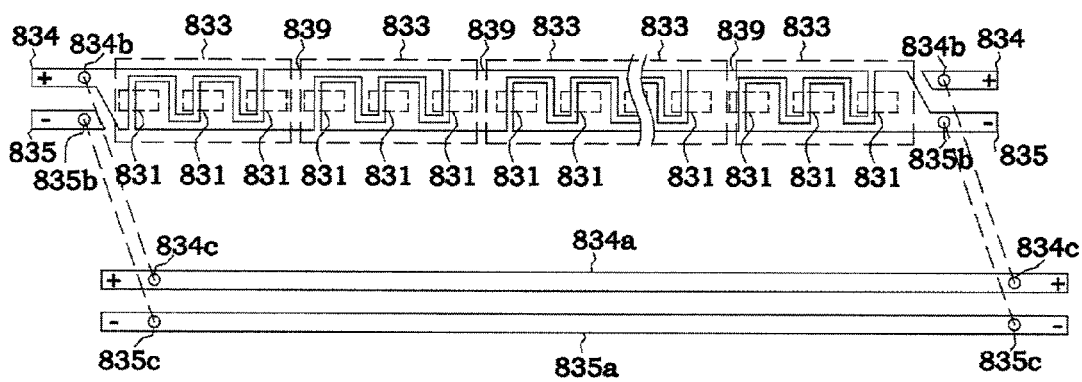
FIG. 28E is a plan view of a circuit layout of an LED module according to some embodiments of the present invention.

FIG. 28E is a plan view of a circuit layout of an LED module according to another embodiment. The layout structures of the LED module in FIGS. 28E and 28C each correspond to the same way of connecting LEDs 831 as that shown in FIG. 28B, but the layout structure in FIG. 28E comprises two conductive layers, instead of only one conductive layer for forming the circuit layout as shown in FIG. 28C. Referring to FIG. 28E, the main difference from the layout in FIG. 28C is that positive conductive line 834 and negative conductive line 835 have a lengthwise portion 834a and a lengthwise portion 835a, respectively, that are formed in a second conductive layer instead. This type of structure may be used to implement the embodiments that include two conductive layers such as discussed previously (e.g., as described in connection with FIG. 23). The difference is elaborated as follows.

Referring to FIG. 28E, the bendable circuit sheet of the LED module comprises a first conductive layer 2a and a second conductive layer 2c electrically insulated from each other by a dielectric layer 2b (not shown). Of the two conductive layers, positive conductive line 834, negative conductive line 835, and conductive parts 839 in FIG. 28E are formed in first conductive layer 2a by the method of etching for electrically connecting the plurality of LED components 831 e.g. in a form of a mesh, whereas positive lengthwise portion 834a and negative lengthwise portion 835a are formed in second conductive layer 2c (e.g., by etching) for electrically connecting to (e.g., the filtering output terminal of) the filtering circuit. Further, positive conductive line 834 and negative conductive line 835 in first conductive layer 2a have via points 834b and via points 835b, respectively, for connecting to second conductive layer 2c. And positive lengthwise portion 834a and negative lengthwise portion 835a in second conductive layer 2c have via points 834c and via points 835c, respectively. Via points 834b are positioned corresponding to via points 834c, for connecting positive conductive line 834 and positive lengthwise portion 834a. Via points 835b are positioned corresponding to via points 835c, for connecting negative conductive line 835 and negative lengthwise portion 835a. One exemplary way of connecting the two conductive layers is to form a hole connecting each via point 834b and a corresponding via point 834c, and to form a hole connecting each via point 835b and a corresponding via point 835c, with the holes extending through the two conductive layers and the dielectric layer in-between. Positive conductive line 834 and positive lengthwise portion 834a can be electrically connected, for example, by welding metallic part(s) through the connecting hole(s), and negative conductive line 835 and negative lengthwise portion 835a can be electrically connected, for example, by welding metallic part(s) through the connecting hole(s).

Similarly, the layout structure of the LED module in FIG. 28D may alternatively have positive lengthwise portion 934a and negative lengthwise portion 935a disposed in a second conductive layer, to constitute a two-layer layout structure.

It's worth noting that the thickness of the second conductive layer of a two-layer bendable circuit sheet is in some embodiments larger than that of the first conductive layer, in order to reduce the voltage drop or loss along each of the positive lengthwise portion and the negative lengthwise portion disposed in the second conductive layer. Compared to a one-layer bendable circuit sheet, since a positive lengthwise portion and a negative lengthwise portion are disposed in a second conductive layer in a two-layer bendable circuit sheet, the width (between two lengthwise sides) of the two-layer bendable circuit sheet is or can be reduced. On the same fixture or plate in a production process, the maximum number of bendable circuit sheets each with a shorter width that can be laid together is larger than the maximum number of bendable circuit sheets each with a longer width that can be laid together. Thus adopting a bendable circuit sheet with a shorter width can increase the efficiency of production of the LED module. And reliability in the production process, such as the accuracy of welding position when welding (materials on) the LED components, can also be improved, because a two-layer bendable circuit sheet can better maintain its shape.

As a variant of the above embodiments, an exemplary LED tube lamp may have at least some of the electronic components of its power supply module disposed on an LED light strip of the LED tube lamp. For example, the technique of printed electronic circuit (PEC) can be used to print, insert, or embed at least some of the electronic components onto the LED light strip (e.g., as opposed to being on a separate circuit board connected to the LED light strip).

In one embodiment, all electronic components of the power supply module are disposed directly on the LED light strip. For example, the production process may include or proceed with the following steps: preparation of the circuit substrate (e.g. preparation of a flexible printed circuit board); ink jet printing of metallic nano-ink; ink jet printing of active and passive components (as of the power supply module); drying/sintering; ink jet printing of interlayer bumps; spraying of insulating ink; ink jet printing of metallic nano-ink; ink jet printing of active and passive components (to sequentially form the included layers); spraying of surface bond pad(s); and spraying of solder resist against LED components. The production process may be different, however, and still result in some or all electronic components of the power supply module being disposed directly on the LED light strip.

In certain embodiments, if all electronic components of the power supply module are disposed on the light strip, electrical connection between terminal pins of the LED tube lamp and the light strip may be achieved by connecting the pins to conductive lines which are welded with ends of the light strip. In this case, another substrate for supporting the power supply module is not required, thereby allowing of an improved design or arrangement in the end cap(s) of the LED tube lamp. In some embodiments, (components of) the power supply module are disposed at two ends of the light strip, in order to significantly reduce the impact of heat generated from the power supply module's operations on the LED components. Since no substrate other than the light strip is used to support the power supply module in this case, the total amount of welding or soldering can be significantly reduced, improving the general reliability of the power supply module. If no additional substrate is used, the electronic components of the power supply module disposed on the light strip may still be positioned in the end caps of the LED tube lamp, or they may be positioned partly or wholly inside the lamp tube but not in the end caps.

Another case is that some of all electronic components of the power supply module, such as some resistors and/or smaller size capacitors, are printed onto the light strip, and some bigger size components, such as some inductors and/or electrolytic capacitors, are disposed on another substrate, for example in the end cap(s). The production process of the light strip in this case may be the same as that described above. And in this case disposing some of all electronic components on the light strip is conducive to achieving a reasonable layout of the power supply module in the LED tube lamp, which may allow of an improved design in the end cap(s).

As a variant embodiment of the above, electronic components of the power supply module may be disposed on the light strip by a method of embedding or inserting, e.g. by embedding the components onto a bendable or flexible light strip. In some embodiments, this embedding may be realized by a method using copper-clad laminates (CCL) for forming a resistor or capacitor; a method using ink related to silkscreen printing; or a method of ink jet printing to embed passive components, wherein an ink jet printer is used to directly print inks to constitute passive components and related functionalities to intended positions on the light strip. Then through treatment by ultraviolet (UV) light or drying/sintering, the light strip is formed where passive components are embedded. The electronic components embedded onto the light strip include for example resistors, capacitors, and inductors. In other embodiments, active components also may be embedded. Through embedding some components onto the light strip, a reasonable layout of the power supply module can be achieved to allow of an improved design in the end cap(s), because the surface area on a printed circuit board used for carrying components of the power supply module is reduced or smaller, and as a result the size, weight, and thickness of the resulting printed circuit board for carrying components of the power supply module is also smaller or reduced. Also in this situation since welding points on the printed circuit board for welding resistors and/or capacitors if they were not to be disposed on the light strip are no longer used, the reliability of the power supply module is improved, in view of the fact that these welding points are very liable to (cause or incur) faults, malfunctions, or failures. Further, the length of conductive lines needed for connecting components on the printed circuit board is therefore also reduced, which allows of a more compact layout of components on the printed circuit board and thus improving the functionalities of these components.

Next, methods to produce embedded capacitors and resistors are explained as follows.

Usually, methods for manufacturing embedded capacitors employ or involve a concept called distributed or planar capacitance. The manufacturing process may include the following step(s). On a substrate of a copper layer a very thin insulation layer is applied or pressed, which is then generally disposed between a pair of layers including a power conductive layer and a ground layer. The very thin insulation layer makes the distance between the power conductive layer and the ground layer very short. A capacitance resulting from this structure can also be realized by a conventional technique of a plated-through hole. Basically, this step is used to create this structure comprising a big parallel-plate capacitor on a circuit substrate.

Of products of high electrical capacity, certain types of products employ distributed capacitances, and other types of products employ separate embedded capacitances. Through putting or adding a high dielectric-constant material such as barium titanate into the insulation layer, the high electrical capacity is achieved.

A usual method for manufacturing embedded resistors employ conductive or resistive adhesive. This may include, for example, a resin to which conductive carbon or graphite is added, which may be used as an additive or filler. The additive resin is silkscreen printed to an object location, and is then after treatment laminated inside the circuit board. The resulting resistor is connected to other electronic components through plated-through holes or microvias. Another method is called Ohmega-Ply, by which a two metallic layer structure of a copper layer and a thin nickel alloy layer constitutes a layer resistor relative to a substrate. Then through etching the copper layer and nickel alloy layer, different types of nickel alloy resistors with copper terminals can be formed. These types of resistor are each laminated inside the circuit board.

In one embodiment, conductive wires/lines are directly printed in a linear layout on an inner surface of the LED glass lamp tube, with LED components directly attached on the inner surface and electrically connected by the conductive wires. In some embodiments, the LED components in the form of chips are directly attached over the conductive wires on the inner surface, and connective points are at terminals of the wires for connecting the LED components and the power supply module. After being attached, the LED chips may have fluorescent powder applied or dropped thereon, for producing white light or light of other color by the operating LED tube lamp.

In some embodiments, luminous efficacy of the LED or LED component is 80 lm/W or above, and in some embodiments, it may be preferably 120 lm/W or above. Certain more optimal embodiments may include a luminous efficacy of the LED or LED component of 160 lm/W or above. White light emitted by an LED component may be produced by mixing fluorescent powder with the monochromatic light emitted by a monochromatic LED chip. The white light in its spectrum has major wavelength ranges of 430-460 nm and 550-560 nm, or major wavelength ranges of 430-460 nm, 540-560 nm, and 620-640 nm.

Figure 29A:
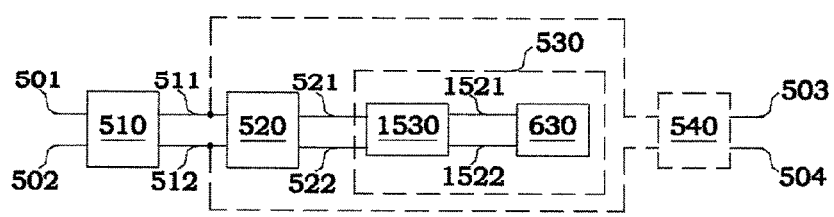
FIG. 29A is a block diagram of an LED lamp according to some embodiments of the present invention.

FIG. 29A is a block diagram showing components of an LED lamp (e.g., an LED tube lamp) according to one embodiment. As shown in FIG. 29A, the power supply module of the LED lamp includes rectifying circuits 510 and 540, a filtering circuit 520, and an LED driving circuit 1530, wherein an LED lighting module 530 includes the driving circuit 1530 and an LED module 630. According to the above description in FIG. 24E, driving circuit 1530 in FIG. 29A comprises a DC-to-DC converter circuit, and is coupled to filtering output terminals 521 and 522 to receive a filtered signal and then perform power conversion for converting the filtered signal into a driving signal at driving output terminals 1521 and 1522. The LED module 630 is coupled to driving output terminals 1521 and 1522 to receive the driving signal for emitting light. In some embodiments, the current of LED module 630 is stabilized at an objective current value. Exemplary descriptions of this LED module 630 are the same as those provided above with reference to FIGS. 28A-28D.

It's worth noting that rectifying circuit 540 is an optional element and therefore can be omitted, so it is depicted in a dotted line in FIG. 29A. Therefore, the power supply module of the LED lamp in this embodiment can be used with a single-end power supply coupled to one end of the LED lamp, and can be used with a dual-end power supply coupled to two ends of the LED lamp. With a single-end power supply, examples of the LED lamp include an LED light bulb, a personal area light (PAL), etc.

Figure 29B:
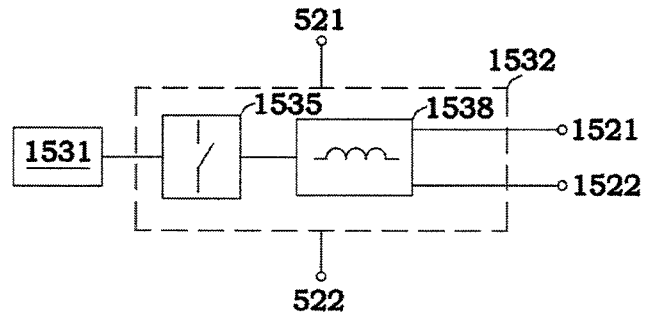
FIG. 29B is a block diagram of a driving circuit according to some embodiments of the present invention.

FIG. 29B is a block diagram of an exemplary driving circuit according to one embodiment. Referring to FIG. 29B, the driving circuit includes a controller 1531, and a conversion circuit 1532 for power conversion based on a current source, for driving the LED module to emit light. Conversion circuit 1532 includes a switching circuit 1535 and an energy storage circuit 1538. Conversion circuit 1532 is coupled to filtering output terminals 521 and 522 to receive and then convert a filtered signal, under the control by controller 1531, into a driving signal at driving output terminals 1521 and 1522 for driving the LED module. Under the control by controller 1531, the driving signal output by conversion circuit 1532 comprises a steady current, making the LED module emitting steady light.

Figure 29C:
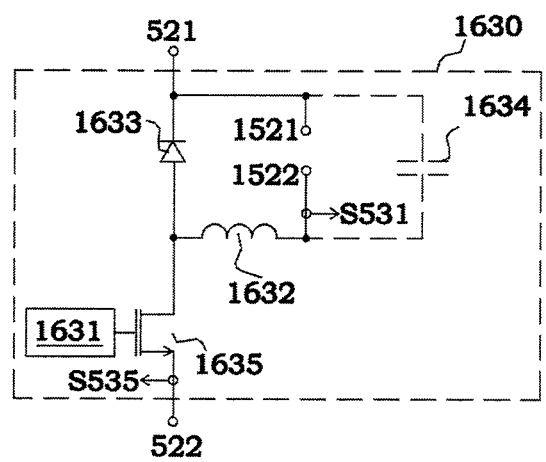
FIG. 29C is a schematic diagram of a driving circuit according to some embodiments of the present invention.

FIG. 29C is a schematic diagram of a driving circuit according to one embodiment. Referring to FIG. 29C, a driving circuit 1630 in this embodiment comprises a buck DC-to-DC converter circuit having a controller 1631 and a converter circuit. The converter circuit includes an inductor 1632, a diode 1633 for "freewheeling" of current, a capacitor 1634, and a switch 1635. Driving circuit 1630 is coupled to filtering output terminals 521 and 522 to receive and then convert a filtered signal into a driving signal for driving an LED module connected between driving output terminals 1521 and 1522.

In this embodiment, switch 1635 comprises a metal-oxide-semiconductor field-effect transistor (MOSFET) and has a first terminal coupled to the anode of freewheeling diode 1633, a second terminal coupled to filtering output terminal 522, and a control terminal coupled to controller 1631 used for controlling current conduction or cutoff between the first and second terminals of switch 1635. Driving output terminal 1521 is connected to filtering output terminal 521, and driving output terminal 1522 is connected to an end of inductor 1632, which has another end connected to the first terminal of switch 1635. Capacitor 1634 is coupled between driving output terminals 1521 and 1522, to stabilize the voltage between driving output terminals 1521 and 1522. Freewheeling diode 1633 has a cathode connected to driving output terminal 1521.

Next, a description follows as to an exemplary operation of driving circuit 1630.

Controller 1631 is configured for determining when to turn switch 1635 on (in a conducting state) or off (in a cutoff state), according to a current detection signal S535 and/or a current detection signal S531. For example, in some embodiments, controller 1631 is configured to control the duty cycle of switch 1635 being on and switch 1635 being off, in order to adjust the size or magnitude of the driving signal. Current detection signal S535 represents the magnitude of current through switch 1635. Current detection signal S531 represents the magnitude of current through the LED module coupled between driving output terminals 1521 and 1522. The controller 1631 may control the duty cycle of the switch 1635 being on and off, based on, for example, a magnitude of a current detected based on current detection signal S531 or S535. As such, when the magnitude is above a threshold, the switch may be off (cutoff state) for more time, and when magnitude goes below the threshold, the switch may be on (conducting state) for more time. According to any of current detection signal S535 and current detection signal S531, controller 1631 can obtain information on the magnitude of power converted by the converter circuit. When switch 1635 is switched on, a current of a filtered signal is input through filtering output terminal 521, and then flows through capacitor 1634, driving output terminal 1521, the LED module, inductor 1632, and switch 1635, and then flows out from filtering output terminal 522. During this flowing of current, capacitor 1634 and inductor 1632 are performing storing of energy. On the other hand, when switch 1635 is switched off, capacitor 1634 and inductor 1632 perform releasing of stored energy by a current flowing from freewheeling capacitor 1633 to driving output terminal 1521 to make the LED module continuing to emit light.

It's worth noting that capacitor 1634 is an optional element, so it can be omitted and is thus depicted in a dotted line in FIG. 29C. In some application environments, the natural characteristic of an inductor to oppose instantaneous change in electric current passing through the inductor may be used to achieve the effect of stabilizing the current through the LED module, thus omitting capacitor 1634.

Figure 29D:
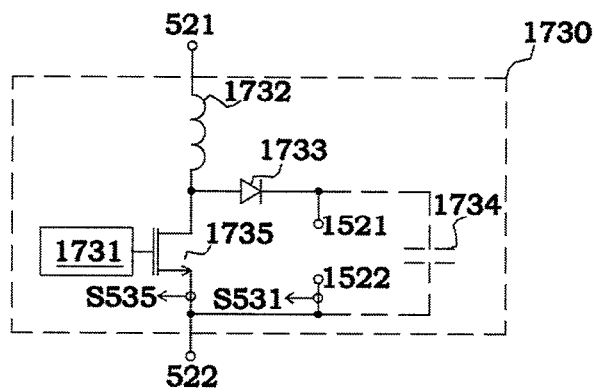
FIG. 29D is a schematic diagram of a driving circuit according to some embodiments of the present invention.

FIG. 29D is a schematic diagram of an exemplary driving circuit according to one embodiment of the present invention. Referring to FIG. 29D, a driving circuit 1730 in this embodiment comprises a boost DC-to-DC converter circuit having a controller 1731 and a converter circuit. The converter circuit includes an inductor 1732, a diode 1733 for "freewheeling" of current, a capacitor 1734, and a switch 1735. Driving circuit 1730 is configured to receive and then convert a filtered signal from filtering output terminals 521 and 522 into a driving signal for driving an LED module coupled between driving output terminals 1521 and 1522.

Inductor 1732 has an end connected to filtering output terminal 521, and another end connected to the anode of freewheeling diode 1733 and a first terminal of switch 1735, which has a second terminal connected to filtering output terminal 522 and driving output terminal 1522. Freewheeling diode 1733 has a cathode connected to driving output terminal 1521. And capacitor 1734 is coupled between driving output terminals 1521 and 1522.

Controller 1731 is coupled to a control terminal of switch 1735, and is configured for determining when to turn switch 1735 on (in a conducting state) or off (in a cutoff state), according to a current detection signal S535 and/or a current detection signal S531. When switch 1735 is switched on, a current of a filtered signal is input through filtering output terminal 521, and then flows through inductor 1732 and switch 1735, and then flows out from filtering output terminal 522. During this flowing of current, the current through inductor 1732 increases with time, with inductor 1732 being in a state of storing energy, while capacitor 1734 enters a state of releasing energy, making the LED module continuing to emit light. On the other hand, when switch 1735 is switched off, inductor 1732 enters a state of releasing energy as the current through inductor 1732 decreases with time. In this state, the current through inductor 1732 then flows through freewheeling diode 1733, capacitor 1734, and the LED module, while capacitor 1734 enters a state of storing energy.

It's worth noting that capacitor 1734 is an optional element, so it can be omitted and is thus depicted in a dotted line in FIG. 29D. When capacitor 1734 is omitted and switch 1735 is switched on, the current of inductor 1732 does not flow through the LED module, making the LED module not emit light; but when switch 1735 is switched off, the current of inductor 1732 flows through freewheeling diode 1733 to reach the LED module, making the LED module emit light. Therefore, by controlling the time that the LED module emits light, and the magnitude of current through the LED module, the average luminance of the LED module can be stabilized to be above a defined value, thus also achieving the effect of emitting a steady light.

Figure 29E:
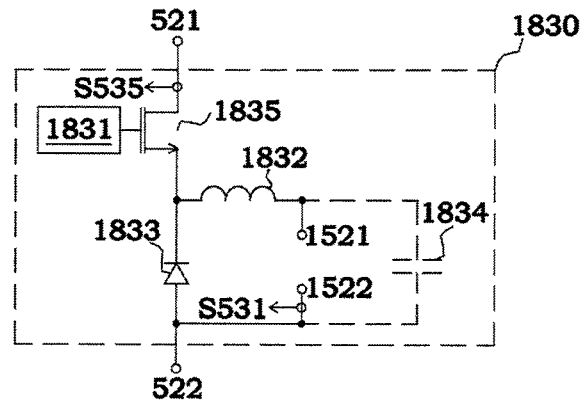
FIG. 29E is a schematic diagram of a driving circuit according to some embodiments of the present invention.

FIG. 29E is a schematic diagram of an exemplary driving circuit according to another embodiment. Referring to FIG. 29E, a driving circuit 1830 in this embodiment comprises a buck DC-to-DC converter circuit having a controller 1831 and a converter circuit. The converter circuit includes an inductor 1832, a diode 1833 for "freewheeling" of current, a capacitor 1834, and a switch 1835. Driving circuit 1830 is coupled to filtering output terminals 521 and 522 to receive and then convert a filtered signal into a driving signal for driving an LED module connected between driving output terminals 1521 and 1522.

Switch 1835 has a first terminal coupled to filtering output terminal 521, a second terminal coupled to the cathode of freewheeling diode 1833, and a control terminal coupled to controller 1831 to receive a control signal from controller 1831 for controlling current conduction or cutoff between the first and second terminals of switch 1835. The anode of freewheeling diode 1833 is connected to filtering output terminal 522 and driving output terminal 1522. Inductor 1832 has an end connected to the second terminal of switch 1835, and another end connected to driving output terminal 1521. Capacitor 1834 is coupled between driving output terminals 1521 and 1522, to stabilize the voltage between driving output terminals 1521 and 1522.

Controller 1831 is configured for controlling when to turn switch 1835 on (in a conducting state) or off (in a cutoff state), according to a current detection signal S535 and/or a current detection signal S531. When switch 1835 is switched on, a current of a filtered signal is input through filtering output terminal 521, and then flows through switch 1835, inductor 1832, and driving output terminals 1521 and 1522, and then flows out from filtering output terminal 522. During this flowing of current, the current through inductor 1832 and the voltage of capacitor 1834 both increase with time, so inductor 1832 and capacitor 1834 are in a state of storing energy. On the other hand, when switch 1835 is switched off, inductor 1832 is in a state of releasing energy and thus the current through it decreases with time. In this case, the current through inductor 1832 circulates through driving output terminals 1521 and 1522, freewheeling diode 1833, and back to inductor 1832.

It's worth noting that capacitor 1834 is an optional element, so it can be omitted and is thus depicted in a dotted line in FIG. 29E. When capacitor 1834 is omitted, no matter whether switch 1835 is turned on or off, the current through inductor 1832 will flow through driving output terminals 1521 and 1522 to drive the LED module to continue emitting light.

Figure 29F:
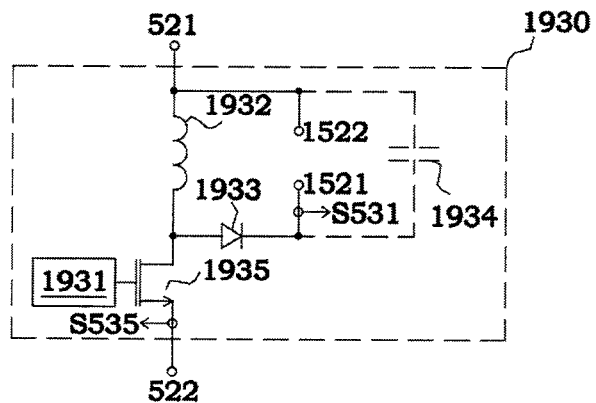
FIG. 29F is a schematic diagram of a driving circuit according to some embodiments of the present invention.

FIG. 29F is a schematic diagram of an exemplary driving circuit according to another embodiment. Referring to FIG. 29F, a driving circuit 1930 in this embodiment comprises a buck DC-to-DC converter circuit having a controller 1931 and a converter circuit. The converter circuit includes an inductor 1932, a diode 1933 for "freewheeling" of current, a capacitor 1934, and a switch 1935. Driving circuit 1930 is coupled to filtering output terminals 521 and 522 to receive and then convert a filtered signal into a driving signal for driving an LED module connected between driving output terminals 1521 and 1522.

Inductor 1932 has an end connected to filtering output terminal 521 and driving output terminal 1522, and another end connected to a first end of switch 1935. Switch 1935 has a second end connected to filtering output terminal 522, and a control terminal connected to controller 1931 to receive a control signal from controller 1931 for controlling current conduction or cutoff of switch 1935. Freewheeling diode 1933 has an anode coupled to a node connecting inductor 1932 and switch 1935, and a cathode coupled to driving output terminal 1521. Capacitor 1934 is coupled to driving output terminals 1521 and 1522, to stabilize the driving of the LED module coupled between driving output terminals 1521 and 1522.

Controller 1931 is configured for controlling when to turn switch 1935 on (in a conducting state) or off (in a cutoff state), according to a current detection signal S531 and/or a current detection signal S535. When switch 1935 is turned on, a current is input through filtering output terminal 521, and then flows through inductor 1932 and switch 1935, and then flows out from filtering output terminal 522. During this flowing of current, the current through inductor 1932 increases with time, so inductor 1932 is in a state of storing energy; but the voltage of capacitor 1934 decreases with time, so capacitor 1934 is in a state of releasing energy to keep the LED module continuing to emit light. On the other hand, when switch 1935 is turned off, inductor 1932 is in a state of releasing energy and its current decreases with time. In this case, the current through inductor 1932 circulates through freewheeling diode 1933, driving output terminals 1521 and 1522, and back to inductor 1932. During this circulation, capacitor 1934 is in a state of storing energy and its voltage increases with time.

It's worth noting that capacitor 1934 is an optional element, so it can be omitted and is thus depicted in a dotted line in FIG. 29F. When capacitor 1934 is omitted and switch 1935 is turned on, the current through inductor 1932 doesn't flow through driving output terminals 1521 and 1522, thereby making the LED module not emit light. On the other hand, when switch 1935 is turned off, the current through inductor 1932 flows through freewheeling diode 1933 and then the LED module to make the LED module emit light. Therefore, by controlling the time that the LED module emits light, and the magnitude of current through the LED module, the average luminance of the LED module can be stabilized to be above a defined value, thus also achieving the effect of emitting a steady light.

Figure 29G:
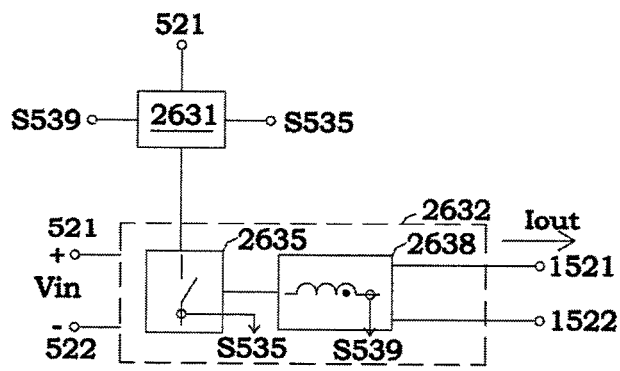
FIG. 29G is a block diagram of a driving circuit according to some embodiments of the present invention.

FIG. 29G is a block diagram of an exemplary driving circuit according to one embodiment. Referring to FIG. 29G, the driving circuit includes a controller 2631, and a conversion circuit 2632 for power conversion based on an adjustable current source, for driving the LED module to emit light. Conversion circuit 2632 includes a switching circuit 2635 and an energy storage circuit 2638. And conversion circuit 2632 is coupled to filtering output terminals 521 and 522 to receive and then convert a filtered signal, under the control by controller 2631, into a driving signal at driving output terminals 1521 and 1522 for driving the LED module. Controller 2631 is configured to receive a current detection signal S535 and/or a current detection signal S539, for controlling or stabilizing the driving signal output by conversion circuit 2632 to be above an objective current value. Current detection signal S535 represents the magnitude of current through switching circuit 2635. Current detection signal S539 represents the magnitude of current through energy storage circuit 2638, which current may be e.g. an inductor current in energy storage circuit 2638 or a current output at driving output terminal 1521. Any of current detection signal S535 and current detection signal S539 can represent the magnitude of current Iout provided by the driving circuit from driving output terminals 1521 and 1522 to the LED module. Controller 2631 is coupled to filtering output terminal 521 for setting the objective current value according to the voltage Vin at filtering output terminal 521. Therefore, the current Iout provided by the driving circuit or the objective current value can be adjusted corresponding to the magnitude of the voltage Vin of a filtered signal output by a filtering circuit.

It's worth noting that current detection signals S535 and S539 can be generated by measuring current through a resistor or induced by an inductor. For example, a current can be measured according to a voltage drop across a resistor in conversion circuit 2632 the current flows through, or which arises from a mutual induction between an inductor in conversion circuit 2632 and another inductor in its energy storage circuit 2638.

The above driving circuit structures are especially suitable for an application environment in which the external driving circuit for the LED tube lamp includes electronic ballast. An electronic ballast is equivalent to a current source whose output power is not constant. In an internal driving circuit as shown in each of FIGS. 29C-29F, power consumed by the internal driving circuit relates to or depends on the number of LEDs in the LED module, and could be regarded as constant. When the output power of the electronic ballast is higher than power consumed by the LED module driven by the driving circuit, the output voltage of the ballast will increase continually, causing the level of an AC driving signal received by the power supply module of the LED lamp to continually increase, so as to risk damaging the ballast and/or components of the power supply module due to their voltage ratings being exceeded. On the other hand, when the output power of the electronic ballast is lower than power consumed by the LED module driven by the driving circuit, the output voltage of the ballast and the level of the AC driving signal will decrease continually so that the LED tube lamp fails to normally operate.

It's worth noting that the power needed for an LED lamp to work is typically already lower than that needed for a fluorescent lamp to work. If a conventional control mechanism of e.g. using a backlight module to control the LED luminance is used with a conventional driving system of e.g. a ballast, a problem will probably arise of mismatch or incompatibility between the output power of the external driving system and the power needed by the LED lamp. This problem may even cause damaging of the driving system and/or the LED lamp. To prevent and/or protect against this problem, using e.g. the power/current adjustment method described above in FIG. 29G enables the LED (tube) lamp to be better compatible with traditional fluorescent lighting systems.

Figure 29H:
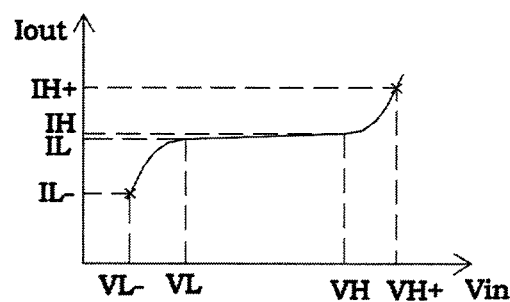
FIG. 29H is a graph illustrating the relationship between the voltage Vin and the objective current Iout according to certain embodiments of the present invention.

FIG. 29H is a graph illustrating the relationship between the voltage Vin and the objective current value Iout according to an embodiment of the present invention. In FIG. 29H, the variable Vin is on the horizontal axis, and the variable Iout is on the vertical axis. In some cases, when the level of the voltage Vin of a filtered signal is between the upper voltage limit VH and the lower voltage limit VL, the objective current value Iout will be approximately an initial objective current value. The upper voltage limit VH is higher than the lower voltage limit VL. When the voltage Vin increases to be higher than the upper voltage limit VH, the objective current value Iout will increase with the increasing of the voltage Vin. During this stage, a situation that may be preferable is that the slope of the relationship curve increases with the increasing of the voltage Vin. When the voltage Vin of a filtered signal decreases to be below the lower voltage limit VL, the objective current value Iout will decrease with the decreasing of the voltage Vin. During this stage, a situation that may be preferable is that the slope of the relationship curve decreases with the decreasing of the voltage Vin. For example, during the stage when the voltage Vin is higher than the upper voltage limit VH or lower than the lower voltage limit VL, the objective current value Iout is in some embodiments a function of the voltage Vin to the power of 2 or above, in order to make the rate of increase/decrease of the consumed power higher than the rate of increase/decrease of the output power of the external driving system. Thus, adjustment of the objective current value Iout is in some embodiments a function of the filtered voltage Vin to the power of 2 or above.

In another case, when the voltage Vin of a filtered signal is between the upper voltage limit VH and the lower voltage limit VL, the objective current value Iout of the LED lamp will vary, increase or decrease, linearly with the voltage Vin. During this stage, when the voltage Vin is at the upper voltage limit VH, the objective current value Iout will be at the upper current limit IH. When the voltage Vin is at the lower voltage limit VL, the objective current value Iout will be at the lower current limit IL. The upper current limit IH is larger than the lower current limit IL. And when the voltage Vin is between the upper voltage limit VH and the lower voltage limit VL, the objective current value Iout will be a function of the voltage Vin to the power of 1.

With the designed relationship in FIG. 29H, when the output power of the ballast is higher than the power consumed by the LED module driven by the driving circuit, the voltage Vin will increase with time to exceed the upper voltage limit VH. When the voltage Vin is higher than the upper voltage limit VH, the rate of increase of the consumed power of the LED module is higher than that of the output power of the electronic ballast, and the output power and the consumed power will be balanced or equal when the voltage Vin is at a high balance voltage value VH+ and the current Iout is at a high balance current value IH+. In this case, the high balance voltage value VH+ is larger than the upper voltage limit VH, and the high balance current value IH+ is larger than the upper current limit IH. On the other hand, when the output power of the ballast is lower than the power consumed by the LED module driven by the driving circuit, the voltage Vin will decrease to be below the lower voltage limit VL. When the voltage Vin is lower than the lower voltage limit VL, the rate of decrease of the consumed power of the LED module is higher than that of the output power of the electronic ballast, and the output power and the consumed power will be balanced or equal when the voltage Vin is at a low balance voltage value VL− and the objective current value Iout is at a low balance current value IL−. In this case, the low balance voltage value VL− is smaller than the lower voltage limit VL, and the low balance current value IL− is smaller than the lower current limit IL.

In some embodiments, the lower voltage limit VL is defined to be around 90% of the lowest output power of the electronic ballast, and the upper voltage limit VH is defined to be around 110% of its highest output power. Taking a common AC powerline with a voltage range of 100-277 volts and a frequency of 60 Hz as an example, the lower voltage limit VL may be set at 90 volts (=100*90%), and the upper voltage limit VH may be set at 305 volts (=277*110%).

With reference back to FIGS. 19 and 20, a short circuit board 253 includes a first short circuit substrate and a second short circuit substrate respectively connected to two terminal portions of a long circuit sheet 251, and electronic components of the power supply module are respectively disposed on the first short circuit substrate and the second short circuit substrate. The first short circuit substrate may be referred to as a first power supply substrate, or first end cap substrate. The second short circuit substrate may be referred to as a second power supply substrate, or second end cap substrate. The first power supply substrate and second power substrate may be separate substrates at different ends of an LED tube lamp.

The first short circuit substrate and the second short circuit substrate may have roughly the same length, or different lengths. In some embodiments, a first short circuit substrate (e.g. the right circuit substrate of short circuit board 253 in FIG. 19 and the left circuit substrate of short circuit board 253 in FIG. 20) has a length that is about 30%-80% of the length of the second short circuit substrate (i.e. the left circuit substrate of short circuit board 253 in FIG. 19 and the right circuit substrate of short circuit board 253 in FIG. 20). In some embodiments the length of the first short circuit substrate is about ⅓~⅔ of the length of the second short circuit substrate. For example, in one embodiment, the length of the first short circuit substrate may be about half the length of the second short circuit substrate. The length of the second short circuit substrate may be, for example in the range of about 15 mm to about 65 mm, depending on actual application occasions. In certain embodiments, the first short circuit substrate is disposed in an end cap at an end of the LED tube lamp, and the second short circuit substrate is disposed in another end cap at the opposite end of the LED tube lamp.

In some embodiments, capacitors of the driving circuit, such as capacitors 1634, 1734, 1834, and 1934 in FIGS. 29C~29F, in practical use may include two or more capacitors connected in parallel. Some or all capacitors of the driving circuit in the power supply module may be arranged on the first short circuit substrate of short circuit board 253, while other components such as the rectifying circuit, filtering circuit, inductor(s) of the driving circuit, controller(s), switch(es), diodes, etc. are arranged on the second short circuit substrate of short circuit board 253. Since inductors, controllers, switches, etc. are electronic components with higher temperature, arranging some or all capacitors on a circuit substrate separate or away from the circuit substrate (s) of high-temperature components helps prevent the working life of capacitors (especially electrolytic capacitors) from being negatively affected by the high-temperature components, thus improving the reliability of the capacitors. Further, the physical separation between the capacitors and both the rectifying circuit and filtering circuit also contributes to reducing the problem of EMI.

In some embodiments, the driving circuit has power conversion efficiency of 80% or above, which may preferably be 90% or above, and may even more preferably be 92% or above. Therefore, without the driving circuit, luminous efficacy of the LED lamp according to some embodiments may preferably be 120 lm/W or above, and may even more preferably be 160 lm/W or above. On the other hand, with the driving circuit in combination with the LED component(s), luminous efficacy of the LED lamp in the invention may preferably be, in some embodiments, 120 lm/W*90%=108 lm/W or above, and may even more preferably be, in some embodiments 160 lm/W*92%=147.2 lm/W or above.

In view of the fact that the diffusion film or layer in an LED tube lamp generally has light transmittance of 85% or above, luminous efficacy of the LED tube lamp in some embodiments is 108 lm/W*85%=91.8 lm/W or above, and may be, in some more effective embodiments, 147.2 lm/W*85%=125.12 lm/W.

Figure 30A:
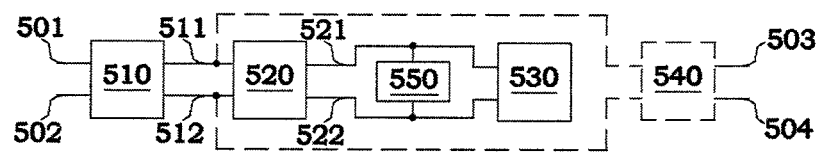
FIG. 30A is a block diagram of an exemplary LED lamp according to some embodiments of the present invention.

FIG. 30A is a block diagram showing an exemplary LED lamp according to one embodiment. Its operation will be described as well. Compared to FIG. 29A, the embodiment of FIG. 30A includes rectifying circuits 510 and 540, and a filtering circuit 520, and further includes an anti-flickering circuit 550, wherein the power supply module may also include some components of an LED lighting module 530. The anti-flickering circuit 550 may be coupled between filtering circuit 520 and LED lighting module 530. For example, the anti-flickering circuit 550 may be coupled between filtering circuit 520 and an LED driving circuit connected to an LED module, or if no LED driving circuit is used, may be coupled to the LED module without an LED driving circuit therebetween. It's noted that rectifying circuit 540 may be omitted and is thus depicted in a dotted line in FIG. 30A.

Anti-flickering circuit 550 is coupled to filtering output terminals 521 and 522, to receive a filtered signal, and under specific circumstances to consume partial energy of the filtered signal so as to reduce (the incidence of) ripples of the filtered signal disrupting or interrupting the light emission of the LED module. In general, filtering circuit 520 has such filtering components as resistor(s) and/or inductor(s), and/or parasitic capacitors and inductors, which may form resonant circuits. Upon breakoff or stop of an AC power signal, as when the power supply of the LED lamp is turned off by a user, the amplitude(s) of resonant signals in the resonant circuits will decrease with time. But LEDs in the LED module of the LED lamp are unidirectional conduction devices and generally require a minimum conduction voltage for the LED module. When a resonant signal's trough value is lower than the minimum conduction voltage of the LED module, but its peak value is still higher than the minimum conduction voltage, the flickering phenomenon will occur in light emission of the LED module. In this case anti-flickering circuit 550 is configured to allow a current matching a defined flickering current value of the LED component to flow through, consuming partial energy of the filtered signal which should be higher than the energy difference of the resonant signal between its peak and trough values, so as to reduce the flickering phenomenon. In certain embodiments, a preferred occasion for anti-flickering circuit 550 to work is when the filtered signal's voltage approaches (and is still higher than) the minimum conduction voltage.

It's worth noting that anti-flickering circuit 550 may be more suitable for the situation in which LED lighting module 530 doesn't include driving circuit 1530, for example, when LED module 630 of LED lighting module 530 is (directly) driven to emit light by a filtered signal from a filtering circuit. In this case, the light emission of LED module 630 will directly reflect variation in the filtered signal due to its ripples. In this situation, the introduction of anti-flickering circuit 550 will prevent the flickering phenomenon from occurring in the LED lamp upon the breakoff of power supply to the LED lamp.

Figure 30B:
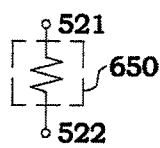
FIG. 30B is a schematic diagram of an anti-flickering circuit according to some embodiments of the present invention.

FIG. 30B is a schematic diagram of an exemplary anti-flickering circuit according to one embodiment. Referring to FIG. 30B, anti-flickering circuit 650 includes at least a resistor, such as two resistors connected in series, between filtering output terminals 521 and 522. In this embodiment, anti-flickering circuit 650 in use consumes partial energy of a filtered signal continually. When in normal operation of the LED lamp, this partial energy is far lower than the energy consumed by LED driving module 530. But upon a breakoff or stop of the power supply, when the voltage level of the filtered signal decreases to approach the minimum conduction voltage of LED module 630, this partial energy is still consumed by anti-flickering circuit 650 in order to offset the impact of the resonant signals which may cause the flickering of light emission of LED module 630. In some embodiments, a current equal to or larger than an anti-flickering current level may be set to flow through anti-flickering circuit 650 when LED module 630 is supplied by the minimum conduction voltage, and then an equivalent anti-flickering resistance of anti-flickering circuit 650 can be determined based on the set current.

Figure 31A:
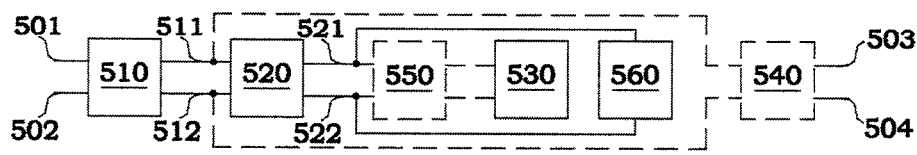
FIG. 31A is a block diagram of an exemplary LED lamp according to some embodiments of the present invention.

FIG. 31A is a block diagram of an LED lamp according to an exemplary embodiment. Compared to FIG. 30A, the embodiment of FIG. 31A includes rectifying circuits 510 and 540, a filtering circuit 520, an LED lighting module 530, and an anti-flickering circuit 550, and further includes a protection circuit 560. Protection circuit 560 is coupled to filtering output terminals 521 and 522, to detect the filtered signal from filtering circuit 520 for determining whether to enter a protection state. Upon entering a protection state, protection circuit 560 works to limit, restrain, or clamp down on the level of the filtered signal, preventing damaging of components in LED lighting module 530. In some embodiments, rectifying circuit 540 and anti-flickering circuit 550 may be omitted and are thus depicted using a dotted line in FIG. 31A.

Figure 31B:
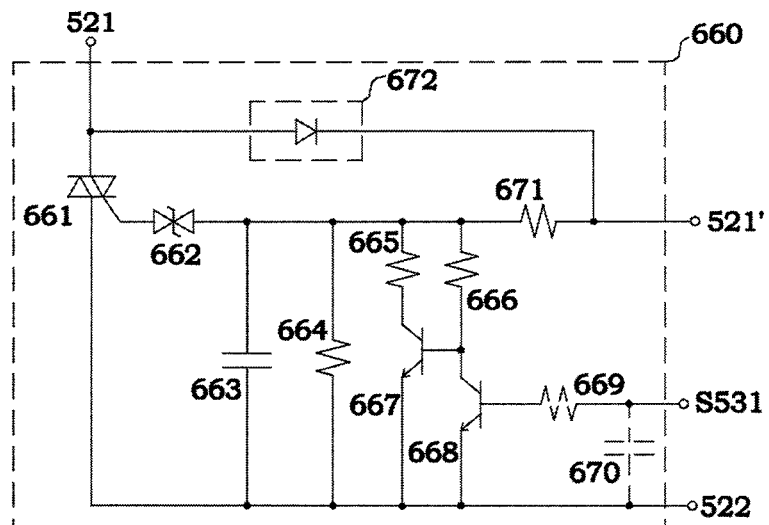
FIG. 31B is a schematic diagram of a protection circuit according to some embodiments of the present invention.

FIG. 31B is a schematic diagram of the protection circuit according to an embodiment of the present invention. Referring to FIG. 31B, a protection circuit 660 includes a voltage clamping circuit, a voltage division circuit, capacitors 663 and 670 (e.g., first and second capacitors), resistor 669, and a diode 672, for entering a protection state when a current and/or voltage of the LED module is/are or might be excessively high, thus preventing damaging of the LED module. The voltage clamping circuit includes a bidirectional triode thyristor (TRIAC) 661 and a DIAC or symmetrical trigger diode 662. The voltage division circuit includes bipolar junction transistors (BJT) 667 and 668 (e.g., first and second BJTs, also described as first and second electronic switches) and resistors 664, 665, 666, and 671 (e.g., first through fourth resistors).

Bidirectional triode thyristor 661 has a first terminal connected to filtering output terminal 521, a second terminal connected to filtering output terminal 522, and a control terminal connected to a first terminal of symmetrical trigger diode 662, which has a second terminal connected to an end of capacitor 663, which capacitor 663 has another end connected to filtering output terminal 522. Resistor 664 (e.g., third resistor) is in parallel to capacitor 663, and has an end connected to the second terminal of symmetrical trigger diode 662 and another end connected to filtering output terminal 522. Resistor 665 (e.g., first resistor) has an end connected to the second terminal of symmetrical trigger diode 662 and another end connected to the collector terminal of BJT 667, whose emitter terminal is connected to filtering output terminal 522. Resistor 666 (e.g., second resistor) has an end connected to the second terminal of symmetrical trigger diode 662 and another end connected to the collector terminal of BJT 668 and the base terminal of BJT 667. The emitter terminal of BJT 668 is connected to filtering output terminal 522. Resistor 669 has an end connected to the base terminal of BJT 668 and another end connected to an end of capacitor 670, which has another end connected to filtering output terminal 522. Resistor 671 (e.g., fourth resistor) has an end connected to the second terminal of symmetrical trigger diode 662 and another end connected to the cathode of diode 672, whose anode is connected to filtering output terminal 521.

It's worth noting that according to some embodiments, the resistance of resistor 665 is smaller than that of resistor 666.

Next, an exemplary operation of protection circuit 660 in overcurrent protection is described as follows.

The node connecting resistor 669 and capacitor 670 receive a current detection signal S531, which represents and may indicate the magnitude of current through the LED module. One end of resistor 671 (e.g., fourth resistor) is a voltage terminal 521'. In certain embodiments concerning overcurrent protection, voltage terminal 521' may be coupled to a biasing voltage source, or be connected through diode 672 to filtering output terminal 521, as shown in FIG. 31B, to receive a filtered signal as a biasing voltage source. If voltage terminal 521' is coupled to an external biasing voltage source, diode 672 may be omitted, so it is depicted in a dotted line in FIG. 31B. The combination of resistor 669 and capacitor 670 can work to filter out high frequency components of the current detection signal S531, and then input the filtered current detection signal S531 to the base terminal of BJT 668 for controlling current conduction and cutoff of BJT 668. The filtering function of resistor 669 and capacitor 670 can prevent misoperation of BJT 668 due to noise. In practical use, resistor 669 and capacitor 670 may be omitted, so they are each depicted in a dotted line in FIG. 31B. When they are omitted, current detection signal S531 is input directly to the base terminal of BJT 668.

When the LED lamp is operating normally and the current of the LED module is within a normal range (e.g., current detection signal S531 has a value, such as a voltage level, below a particular threshold amount), BJT 668 is in a cutoff state, and resistor 666 (e.g., second resistor) operates to pull up the base voltage of BJT 667, which therefore enters a conducting state. In this state, the electric potential at the second terminal of symmetrical trigger diode 662 is determined based on the voltage at voltage terminal 521' of the biasing voltage source and voltage division ratios between resistor fourth 671 and parallel-connected third and first resistors 664 and 665. In certain embodiments, the resistance of first resistor 665 is relatively small, so voltage share for first resistor 665 is smaller and the electric potential at the second terminal of symmetrical trigger diode 662 is therefore pulled down. Then, the electric potential at the control terminal of bidirectional triode thyristor 661 is in turn pulled down by symmetrical trigger diode 662, causing bidirectional triode thyristor 661 to enter a cutoff state, which cutoff state makes protection circuit 660 not being in a protection state. It should be noted that typical or actual values of the normal range, an overcurrent value, and an overvoltage value mentioned above or below are dependent on the types of products being used. For example, a normal or typical voltage or current for a particular product may depend on system configurations, ways of interconnection, the number of and device characteristics (such as voltage-current relationships) of LED light sources or components that are to be used in specific circumstances or applications, etc. Certain products may be designated to operate within a particular range of voltage, current, and/or power, such that operations within that range are considered normal operations, and operations that are outside of that range are considered to be not normal. A product's specification may indicate which voltages and/or currents constitute overvoltage or overcurrent values (e.g., and thus are not within the normal range).

Examples of certain ranges for different models of LED tube lamps may be based on certain optimal values such described as follows:

| Model | Lumens | Ref. Power | Number of LED (pcs) | Driving voltage/current |
|---|---|---|---|---|
| A | 1150 | 9 | 46 (2 * 23:2 LED strings connected in parallel; each LED string has 23 LEDs in series) | DC 66 V/150 mA |
| B | 1450 | 11 | 56 (2 * 28) | DC 82 V/155 mA |
| C | 1800 | 12 | 80 (2 * 40) | DC 115 V/122 mA |
| D | 1800 | 14 | 70 (2 * 35) | DC 98 V/139 mA |
| E | 2200 | 17 | 80 (2 * 40) | DC 115 V/143 mA |

For example, for each different model of product, a normal voltage or current range may be a certain range above and below these optimal values, which may be designated in a product specification. The range may extend, in some embodiments between 0.7 times and 1.3 times the designated value. The minimum value in the range, regarding voltages, may represent a minimum driving voltage, and the maximum value in the range may represent a maximum driving voltage. A driving voltage below the minimum driving voltage or above the maximum voltage may be considered outside of the normal range, and may trigger certain measures. Driving currents may be treated similarly. For example, in some embodiments, an overvoltage protection value may be designated to have a value at least 1.3 times the highest voltage value in the table above, or at least about 150V. In some embodiments, an overvoltage protection value may be greater than 1.3 times a voltage value designated as the desired operational voltage for the device or relevant circuit within the device.

When the current of the LED module exceeds an overcurrent value, the level of current detection signal S531 will increase significantly (e.g., to have a higher value, such as a higher voltage level, above a particular threshold amount) to cause BJT 668 to enter a conducting state and then pull down the base voltage of BJT 667, which thereby enters a cutoff state. In this case, the electric potential at the second terminal of symmetrical trigger diode 662 is determined based on the voltage at voltage terminal 521' of the biasing voltage source and voltage division ratios between fourth resistor 671 and parallel-connected third and second resistors 664 and 666. Since the resistance of second resistor 666 is relatively high, voltage share for second resistor 666 is larger and the electric potential at the second terminal of symmetrical trigger diode 662 is therefore higher. Then the electric potential at the control terminal of bidirectional triode thyristor 661 is in turn pulled up by symmetrical trigger diode 662, causing bidirectional triode thyristor 661 to enter a conducting state, which conducting state works to restrain or clamp down on the voltage between filtering output terminals 521 and 522 and thus makes protection circuit 660 being in a protection state.

In this embodiment, the voltage at voltage terminal 521' of the biasing voltage source is determined based on the trigger voltage of bidirectional triode thyristor 661, and voltage division ratio between resistor 671 and parallel-connected resistors 664 and 665, or voltage division ratio between resistor 671 and parallel-connected resistors 664 and 666. In certain embodiments, through voltage division between resistor 671 and parallel-connected resistors 664 and 665, the voltage from voltage terminal 521' at symmetrical trigger diode 662 will be lower than the trigger voltage of bidirectional triode thyristor 661. Otherwise, through voltage division between resistor 671 and parallel-connected resistors 664 and 666, the voltage from voltage terminal 521' at symmetrical trigger diode 662 will be higher than the trigger voltage of bidirectional triode thyristor 661. For example, in some embodiments, when the current of the LED module exceeds an overcurrent value, the voltage division circuit is adjusted to the voltage division ratio between resistor 671 and parallel-connected resistors 664 and 666, causing a higher portion of the voltage at voltage terminal 521' to result at symmetrical trigger diode 662, achieving a hysteresis function. Specifically, BJTs 667 and 668 as switches are respectively connected in series to resistors 665 and 666, which determine the voltage division ratios. The voltage division circuit is configured to control turning on one of BJTs 667 and 668 and leaving the other off for determining the relevant voltage division ratio, according to whether the current of the LED module exceeds an overcurrent value. And the clamping circuit determines whether to restrain or clamp down on the voltage of the LED module according to the applying voltage division ratio.

Next, an exemplary operation of protection circuit 660 in overvoltage protection is described as follows.

The node connecting resistor 669 and capacitor 670 may receive a current detection signal S531, which represents, for example, the magnitude of current through the LED module. As described above, protection circuit 660 is configured to provide overcurrent protection. One end of resistor 671 is connected to a voltage terminal 521'. In this embodiment concerning overvoltage protection, voltage terminal 521' is coupled to the positive terminal of the LED module to detect the voltage of the LED module. Taking previously described embodiments for example, in embodiments of FIGS. 28A and 28B, in some instances, LED lighting module 530 doesn't include driving circuit 1530, and the voltage terminal 521' would be coupled to filtering output terminal 521. Whereas in embodiments of FIGS. 29A-29G, LED driving module 530 includes driving circuit 1530, and the voltage terminal 521' would be coupled to driving output terminal 1521. In this embodiment, voltage division ratios between resistor 671 and parallel-connected resistors 664 and 665, and voltage division ratios between resistor 671 and parallel-connected resistors 664 and 666 will be adjusted according to the voltage at voltage terminal 521', for example, the voltage at driving output terminal 1521 or filtering output terminal 521. Therefore, normal overcurrent protection can still be provided by protection circuit 660.

In some embodiments, when the LED lamp is operating normally, assuming overcurrent condition doesn't occur, the electric potential at the second terminal of symmetrical trigger diode 662 is determined based on the voltage at voltage terminal 521' and voltage division ratios between resistor 671 and parallel-connected resistors 664 and 665, and is insufficient to trigger bidirectional triode thyristor 661. Then bidirectional triode thyristor 661 is in a cutoff state, making protection circuit 660 not being in a protection state. On the other hand, when the LED module is operating abnormally with the voltage at the positive terminal of the LED module exceeding an overvoltage value, the electric potential at the second terminal of symmetrical trigger diode 662 is sufficiently high to trigger bidirectional triode thyristor 661 when the voltage at the first terminal of symmetrical trigger diode 662 is larger than the trigger voltage of bidirectional triode thyristor 661. Then bidirectional triode thyristor 661 enters a conducting state, making protection circuit 660 being in a protection state to restrain or clamp down on the level of the filtered signal.

As described above, protection circuit 660 provides one or two of the functions of overcurrent protection and overvoltage protection.

In some embodiments, protection circuit 660 may further include a zener diode connected to resistor 664 in parallel, which zener diode is used to limit or restrain the voltage across resistor 664. The breakdown voltage of the zener diode is in some embodiments in the range of about 25~50 volts, and may preferably be about 36 volts.

Further, a silicon controlled rectifier may be substituted for bidirectional triode thyristor 661, without negatively affecting the protection functions. Using a silicon controlled rectifier instead of a bidirectional triode thyristor 661 has a lower voltage drop across itself in conduction than that across bidirectional triode thyristor 661 in conduction.

In one embodiment, values of the parameters of protection circuit 660 may be set as follows. Resistance of resistor 669 may be about 10 ohms. Capacitance of capacitor 670 may be about 1 nF. Capacitance of capacitor 633 may be about 10 nF. The (breakover) voltage of symmetrical trigger diode 662 may be in the range of about 26~36 volts. Resistance of fourth resistor 671 may be in the range of about 300 k~600 k ohms, and may preferably be, in some embodiments, about 540 k ohms. Resistance of second resistor 666 is in some embodiments in the range of about 100 k~300 k ohms, and may preferably be, in some embodiments, about 220 k ohms. Thus, the resistance of the second resistor 666 may be lower, and in some cases less than half of the resistance of the fourth resistor 671. Resistance of first resistor 665 is in some embodiments in the range of about 30 k-100 k ohms, and may preferably be, in some embodiments about 40 k ohms. Thus, the resistance of the first resistor 665 may be lower, and in some cases less than half of the resistance of the second resistor 666. Resistance of third resistor 664 is in some embodiments in the range of about 100 k~300 k ohms, and may preferably be, in some embodiments about 220 k ohms. Thus, in some embodiments, resistance of third resistor 664 is the same as resistance of the second resistor 666.

Figure 32A:
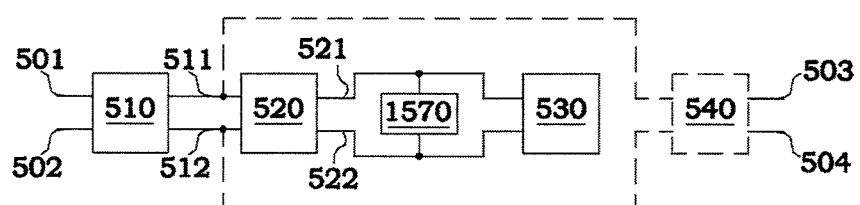
FIG. 32A is a block diagram of an exemplary LED tube lamp according to some embodiments of the present invention.

FIG. 32A is a block diagram of an LED tube lamp according to an embodiment of the present invention. Compared to that shown in FIG. 24E, the present embodiment comprises the rectifying circuits 510 and 540, the filtering circuit 520, and the LED lighting module 530, and further comprises an over voltage protection (OVP) circuit 1570. The OVP circuit 1570 is coupled to the filtering output terminals 521 and 522 for detecting the filtered signal. The OVP circuit 1570 clamps the level of the filtered signal when determining the level thereof higher than a defined OVP value. Hence, the OVP circuit 1570 protects the LED driving module 530 from damage due to an OVP condition. The rectifying circuit 540 may be omitted and is therefore depicted by a dotted line.

Figure 32B:
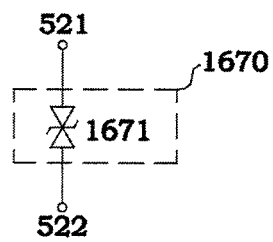
FIG. 32B is a schematic diagram of an OVP circuit according to an embodiment of the present invention.

FIG. 32B is a schematic diagram of an overvoltage protection (OVP) circuit according to an embodiment of the present invention. The OVP circuit 1670 comprises a voltage clamping diode 1671, such as zener diode, coupled to the filtering output terminals 521 and 522. The voltage clamping diode 1671 is configured to clamp a voltage difference at a breakdown voltage when the voltage difference of the filtering output terminals 521 and 522 (i.e., the level of the filtered signal) reaches the breakdown voltage.

In some embodiments, the breakdown voltage may be in a range of about 40 V to about 100 V, and in other embodiments, more specifically in a range of about 55 V to about 75V.

Figure 33:
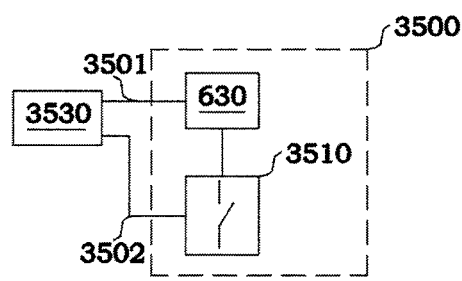
FIG. 33 is a block diagram of an exemplary power supply module in an LED tube lamp according to some embodiments of the present invention.

FIG. 33 is a block diagram of a power supply system for an LED tube lamp according to an embodiment of the present invention. Compared to the above mentioned embodiments, in the embodiment depicted in FIG. 33, the circuits for driving the LED module are installed outside of the LED tube lamp. For example, the LED tube lamp 3500 is driven to emit light by an external driving power 3530 through external driving terminals 3501 and 3502. The LED tube lamp 3500 comprises the LED module 630 and a current control circuit 3510, and does not comprise the rectifying circuit, filtering circuit and the driving circuit. In the embodiment of FIG. 33, the external driving terminals 3501 and 3502 serve as the pins 501 and 502 shown in FIG. 24A and FIG. 24B.

The external driving power 3530 may be directly connected with the commercial power or the ballast for receiving power and converting into an external driving signal to input into the LED tube lamp 3500 through the external driving terminals 3501 and 3502. The external driving signal may be a DC signal, and may preferably be a stable DC current signal. Under a normal condition, the current control circuit 3510 conducts to have a current flowing through and driving the LED module 630 to emit light. The current control circuit 3510 may further detect the current of the LED module 630 for performing a steady current or voltage control, and have a function of ripple filter. Under an abnormal condition, the current control circuit 3510 is cut off to stop inputting the power of the external driving power 3530 into the LED module 630 and enters into a protection state.

When the current control circuit 3510 determines that the current of the LED module 630 is lower than a defined current or a minimum current of a defined current range, the current control circuit 3510 is completely conducted, i.e., the impedance of the current control circuit 3510 comes down a minimum value.

When the current control circuit 3510 determines that the current of the LED module 630 is higher than a defined current or a maximum current of a defined current range, the current control circuit 3510 is cutoff to stop inputting power into the LED tube lamp 3500. The maximum current of a defined current range is in some embodiments set at a value about 30% higher than a rated current of the LED module 630. Thereby, the current control circuit 3510 can keep the brightness of the LED lamp as much as possible when a driving capability of the external driving power 3530 is reduced. Furthermore, the current control circuit 3510 can prevent the LED module 630 from over current when the driving capability of the external driving power 3530 is abnormally increased. Hence, the current control circuit 3510 has a function of over-current protection.

It is worth noting that the external driving power 3530 may be a DC voltage signal. Under a normal condition, the current control circuit 3510 stabilizes the current of the LED module 630 or controls the current linearly, e.g, the current of the LED module 630 is varied linearly with a level of the DC voltage signal. For controlling the current of the LED module at a current value or linearly, a voltage across the current control circuit 3510 is increased with the level of the DC voltage signal provided by the external driving power 3530 and a power consumption thereof is also increased. The current control circuit 3510 may have a temperature detector. When the level of the DC voltage signal provided by the external driving power 3530 is over a high threshold, the current control circuit 3510 enters into a state of over temperature protection to stop inputting power of the external driving power 3530 into the LED tube lamp 3500. For example, when the temperature detector detects the temperature of the current control circuit 3510 at 120° C., the current control circuit 3510 enters into the state of over temperature protection. Thereby, the current control circuit 3510 has both over temperature and over voltage protections.

In some embodiments, due to the external driving power, the length of the end caps are shortened. For ensuring the total length of the LED tube lamp to conform to a standard for a fluorescent lamp, a length of the lamp tube is lengthened to compensate the shortened length of the end caps. Due to the lengthened length of the lamp tube, the LED light string is correspondingly lengthened. Therefore, the interval of adjacent two LEDs disposed on the LED light string becomes greater under the same illuminance requirement. The greater interval increases the heat dissipation of the LEDs and so the operation temperature of the LEDs is lowered and the life-span of the LED tube lamp is extended.

The LED tube lamps according to various different embodiments of the present invention are described as above. With respect to an entire LED tube lamp, the features including for example "adopting the bendable circuit sheet as the LED light strip" and "utilizing the circuit board assembly to connect the LED light strip and the power supply" may be applied in practice singly or integrally such that only one of the features is practiced or a number of the features are simultaneously practiced.

Furthermore, any of the features such as "adopting the bendable circuit sheet as the LED light strip", "utilizing the circuit board assembly (including a long circuit sheet and a short circuit board) to connect the LED light strip and the power supply", "a rectifying circuit", "a filtering circuit", "a driving circuit", "a terminal adapter circuit", "an anti-flickering circuit", "a protection circuit", and "an overvoltage protection circuit" includes any related technical points and their variations and any combination thereof as described in the abovementioned embodiments of the present invention.

As an example, the feature "adopting the bendable circuit sheet as the LED light strip" may include "the connection between the bendable circuit sheet and the power supply is by way of wire bonding or soldering bonding; the bendable circuit sheet includes a wiring layer and a dielectric layer arranged in a stacked manner; the bendable circuit sheet has a circuit protective layer made of ink to reflect light and has widened part along the circumferential direction of the lamp tube to function as a reflective film."

As an example, the feature "utilizing the circuit board assembly to connect the LED light strip and the power supply" may include "the circuit board assembly has a long circuit sheet and a short circuit board that are adhered to each other with the short circuit board being adjacent to the side edge of the long circuit sheet; the short circuit board is provided with a power supply module to form the power supply; the short circuit board is stiffer than the long circuit sheet."

According to the design of the power supply module, the external driving signal may be low frequency AC signal (e.g., commercial power), high frequency AC signal (e.g., that provided by a ballast), or a DC signal (e.g., that provided by a battery), input into the LED tube lamp through a drive architecture of single-end power supply or dual-end power supply. For the drive architecture of dual-end power supply, the external driving signal may be input by using only one end thereof as single-end power supply.

The LED tube lamp may omit the rectifying circuit when the external driving signal is a DC signal.

According to the design of the rectifying circuit in the power supply module, in certain embodiments, there may be a single rectifying circuit, or dual rectifying circuits. First and second rectifying circuits of the dual rectifying circuit may be respectively coupled to the two end caps disposed on two ends of the LED tube lamp. The single rectifying circuit is applicable to the drive architecture of signal-end power supply, and the dual rectifying circuit is applicable to the drive architecture of dual-end power supply. Furthermore, the LED tube lamp having at least one rectifying circuit is applicable to the drive architecture of low frequency AC signal, high frequency AC signal or DC signal.

The single rectifying circuit may be a half-wave rectifier circuit or full-wave bridge rectifying circuit. The dual rectifying circuit may comprise two half-wave rectifier circuits, two full-wave bridge rectifying circuits or one half-wave rectifier circuit and one full-wave bridge rectifying circuit.

According to the design of the pin in the power supply module, in certain embodiments, there may be two pins in a single end (the other end has no pin), two pins in corresponding ends of two ends, or four pins in corresponding ends of two ends. The designs of two pins in single end two pins in corresponding ends of two ends are applicable to signal rectifying circuit design of the of the rectifying circuit. The design of four pins in corresponding ends of two ends is applicable to dual rectifying circuit design of the of the rectifying circuit, and the external driving signal can be received by two pins in only one end or in two ends.

According to the design of the filtering circuit of the power supply module, in certain embodiments, there may be a single capacitor, or π filter circuit. The filtering circuit filters the high frequency component of the rectified signal for providing a DC signal with a low ripple voltage as the filtered signal. The filtering circuit also further comprises the LC filtering circuit having a high impedance for a specific frequency for conforming to current limitations in specific frequencies of the UL standard. Moreover, the filtering circuit according to some embodiments further comprises a filtering unit coupled between a rectifying circuit and the pin(s) for reducing the EMI.

According to the design of the LED lighting module according to some embodiments, the LED lighting module may comprise the LED module and the driving circuit or only the LED module. The LED module may be connected with a voltage stabilization circuit. The LED module may be connected with a voltage stabilization circuit for preventing the LED module from over voltage. The voltage stabilization circuit may be a voltage clamping circuit, such as zener diode, DIAC and so on. When the rectifying circuit has a capacitive circuit, in some embodiments, two capacitors are respectively coupled between corresponding two pins in two end caps and so the two capacitors and the capacitive circuit as a voltage stabilization circuit perform a capacitive voltage divider.

If there is only the LED module in the LED lighting module and the external driving signal is a high frequency AC signal, a capacitive circuit may be in at least one rectifying circuit and the capacitive circuit may be connected in series with a half-wave rectifier circuit or a full-wave bridge rectifying circuit of the rectifying circuit and may serve as a current modulation circuit to modulate the current of the LED module since the capacitor acts as a resistor for a high frequency signal. Thereby, even when different ballasts provide high frequency signals with different voltage levels, the current of the LED module can be modulated into a defined current range for preventing overcurrent. In addition, an energy-releasing circuit is connected in parallel with the LED module. When the external driving signal is no longer supplied, the energy-releasing circuit releases the energy stored in the filtering circuit to lower a resonance effect of the filtering circuit and other circuits for restraining the flicker of the LED module.

In some embodiments, if there are the LED module and the driving circuit in the LED lighting module, the driving circuit may be a buck converter, a boost converter, or a buck-boost converter. The driving circuit stabilizes the current of the LED module at a defined current value, and the defined current value may be modulated based on the external driving signal. For example, the defined current value may be increased with the increasing of the level of the external driving signal and reduced with the reducing of the level of the external driving signal. Moreover, a mode switching circuit may be added between the LED module and the driving circuit for switching the current from the filtering circuit directly or through the driving circuit inputting into the LED module.

A protection circuit may be additionally added to protect the LED module. The protection circuit detects the current and/or the voltage of the LED module to determine whether to enable corresponding overcurrent and/or overvoltage protection.

According to some embodiments, the LED module comprises plural strings of LEDs connected in parallel with each other, wherein each LED may have a single LED chip or plural LED chips emitting different spectrums. Each LEDs in different LED strings may be connected with each other to form a mesh connection.

The above-mentioned features can be accomplished in any combination to improve the LED tube lamp, and the above embodiments are described by way of example only. The present invention is not herein limited, and many variations are possible without departing from the spirit of the present invention and the scope as defined in the appended claims.

What is claimed is:

1. An LED tube lamp with overcurrent and/or overvoltage protection capabilities, comprising:
    a lamp tube;
    a first pin and a second pin coupled to the lamp tube, for receiving an external driving signal;
    a first rectifying circuit, coupled to the first and second pins, for rectifying the external driving signal to produce a rectified signal;
    a filtering circuit, coupled to the first rectifying circuit, for filtering the rectified signal to produce a filtered signal;
    an LED lighting module, coupled to the filtering circuit and including an LED module, the LED lighting module configured to receive the filtered signal and produce a driving signal, and the LED module for receiving the driving signal for emitting light; and
    a protection circuit, coupled to the filtering circuit, and configured to determine whether to enter a protection state, wherein:
        the protection circuit is configured such that, upon entering the protection state, the protection circuit limits or restrains a level of the filtered signal;
        the protection circuit includes a voltage clamping circuit and a voltage division circuit;
        the voltage clamping circuit is coupled to the filtering circuit;
        the voltage division circuit is coupled to the voltage clamping circuit and the filtering circuit, and is configured to be coupled to a biasing voltage; and
        the voltage division circuit is configured to receive a current detection signal, which represents a magnitude of current through the LED module.

2. The LED tube lamp according to claim 1, wherein the voltage division circuit is also coupled to a positive terminal of the LED module to detect a voltage of the LED module, and when a current of the LED module is within a normal range but the voltage at the positive terminal of the LED module exceeds an overvoltage value, the voltage division circuit causes the voltage clamping circuit to enter a conducting state, causing the protection circuit to be in the protection state in which the voltage between a first filtering output terminal and a second filtering output terminal of the filtering circuit is restrained or clamped down on.

3. The LED tube lamp according to claim 1, wherein the voltage division circuit is also coupled to a positive terminal of the LED module to detect a voltage of the LED module, and when a current of the LED module is within a normal range but the voltage at the positive terminal of the LED module is below an overvoltage value, the voltage division circuit causes the voltage clamping circuit to be in a cutoff state between a first filtering output terminal and a second filtering output terminal of the filtering circuit, causing the protection circuit to not be in the protection state.

4. The LED tube lamp according to claim 1, wherein the filtering circuit has a first filtering output terminal and a second filtering output terminal; the protection circuit further comprises a capacitor, and the voltage clamping circuit comprises a thyristor and a symmetrical trigger diode; the thyristor has a first terminal connected to the first filtering output terminal, a second terminal connected to the second filtering output terminal, and a control terminal connected to a first terminal of the symmetrical trigger diode; the symmetrical trigger diode has a second terminal connected to an end of the capacitor, which has another end connected to the second filtering output terminal; and the voltage division circuit is connected to the second terminal of the symmetrical trigger diode.

5. The LED tube lamp according to claim 4, wherein the thyristor comprises a bidirectional triode thyristor or a silicon controlled rectifier.

6. The LED tube lamp according to claim 4, wherein the voltage division circuit comprises a first electronic switch, a second electronic switch, a first resistor, a second resistor, a third resistor, and a fourth resistor, wherein the third resistor has an end connected to the second terminal of the symmetrical trigger diode and another end connected to the second filtering output terminal; the first resistor has an end connected to the second terminal of the symmetrical trigger diode and another end connected to the first electronic switch, which is connected to the second filtering output terminal; the second resistor has an end connected to the second terminal of the symmetrical trigger diode and another end connected to the second electronic switch and first electronic switch; the second electronic switch is connected to the second filtering output terminal and is configured to receive the current detection signal; and the fourth resistor has an end connected to the second terminal of the symmetrical trigger diode and another end connected to a positive terminal of the LED module.

7. The LED tube lamp according to claim 6, wherein resistance of the first resistor is smaller than that of the second resistor, and when a current of the LED module is within a normal range but the voltage at the positive terminal of the LED module exceeds an overvoltage value, the second electronic switch enters a cutoff state and the first electronic switch enters a conducting state, causing the thyristor to enter a cutoff state by an electric potential at the second terminal of the symmetrical trigger diode, thus causing the protection circuit to be in the protection state to restrain or clamp down on the level of the filtered signal between the first filtering output terminal and the second filtering output terminal.

8. The LED tube lamp according to claim 6, wherein the resistance of the first resistor is smaller than that of the second resistor, and when a current of the LED module is within a normal range but the voltage at the positive terminal of the LED module is below an overvoltage value, the second electronic switch enters a cutoff state and the first electronic switch enters a conducting state, causing the thyristor to enter a cutoff state by an electric potential at the second terminal of the symmetrical trigger diode, thus causing the protection circuit to not be in the protection state.

9. An LED tube lamp with overcurrent and/or overvoltage protection capabilities, comprising:
 a lamp tube;
 a first pin and a second pin coupled to the lamp tube, for receiving an external driving signal;
 a first rectifying circuit, coupled to the first and second pins, for rectifying the external driving signal to produce a rectified signal;
 a filtering circuit, coupled to the first rectifying circuit, for filtering the rectified signal to produce a filtered signal, wherein the filtering circuit has a first filtering output terminal and a second filtering output terminal;
 an LED driving circuit, coupled to the filtering circuit and an LED module, the LED driving circuit being configured to receive the filtered signal to produce a driving signal, and the LED module for receiving the driving signal for emitting light; and
 a protection circuit, coupled to the filtering circuit, and configured to determine whether to enter a protection state, wherein upon entering the protection state, the protection circuit limits or restrains a voltage and/or current level of the filtered signal, and wherein:
  the protection circuit includes a voltage clamping circuit and a voltage division circuit:
  the voltage clamping circuit is coupled to the first filtering output terminal and the second filtering output terminal, and the voltage division circuit is coupled to the voltage clamping circuit, the second filtering output terminal, and a biasing voltage source; and
  the voltage division circuit is configured to receive a current detection signal, which represents a magnitude of current through the LED module.

10. The LED tube lamp according to claim 9, wherein when the LED tube lamp is operating normally and a current of the LED module is within a normal range, the voltage division circuit causes the voltage clamping circuit to be in a cutoff state between the first filtering output terminal and the second filtering output terminal, causing the protection circuit to not be in the protection state.

11. The LED tube lamp according to claim 9, wherein when a current of the LED module exceeds an overcurrent value, the voltage division circuit causes the voltage clamping circuit to enter a conducting state between the first filtering output terminal and the second filtering output terminal, causing the protection circuit to be in the protection state in which to restrain or clamp down on the voltage between the first filtering output terminal and the second filtering output terminal.

12. The LED tube lamp according to claim 9, wherein the filtering circuit provides the biasing voltage source at the first filtering output terminal, and the protection circuit further comprises a diode, which has an anode coupled to the biasing voltage source and has a cathode coupled to the voltage division circuit.

13. The LED tube lamp according to claim 9, wherein the protection circuit further comprises a capacitor, and the voltage clamping circuit comprises a thyristor and a symmetrical trigger diode; the thyristor has a first terminal connected to the first filtering output terminal, a second terminal connected to the second filtering output terminal, and a control terminal connected to a first terminal of the symmetrical trigger diode; the symmetrical trigger diode has a second terminal connected to an end of the capacitor, which has another end connected to the second filtering output terminal; and the voltage division circuit is connected to the second terminal of the symmetrical trigger diode.

14. The LED tube lamp according to claim 13, wherein the thyristor comprises a bidirectional triode thyristor (TRIAC) or a silicon controlled rectifier (SCR).

15. The LED tube lamp according to claim 13, wherein the voltage division circuit comprises a first electronic switch, a second electronic switch, a first resistor, a second resistor, a third resistor, and a fourth resistor, wherein the third resistor has an end connected to the second terminal of the symmetrical trigger diode and another end connected to the second filtering output terminal; the first resistor has an end connected to the second terminal of the symmetrical trigger diode and another end connected to the first electronic switch, which is connected to the second filtering output terminal; the second resistor has an end connected to the second terminal of the symmetrical trigger diode and another end connected to the second electronic switch and first electronic switch; the second electronic switch is connected to the second filtering output terminal and is configured to receive the current detection signal; and the fourth resistor has an end connected to the second terminal of the symmetrical trigger diode and another end connected to the biasing voltage source.

16. The LED tube lamp according to claim 15, wherein the first electronic switch comprises a first bipolar junction transistor (BJT), and the second electronic switch comprises a second bipolar junction transistor, wherein the other end of the first resistor is connected to the collector terminal of the first bipolar junction transistor, whose emitter terminal is connected to the second filtering output terminal; the other end of the second resistor is connected to the collector terminal of the second bipolar junction transistor and the base terminal of the first bipolar junction transistor; and the second bipolar junction transistor has its emitter terminal connected to the second filtering output terminal and its base terminal configured to receive the current detection signal.

17. The LED tube lamp according to claim 15, wherein the resistance of the first resistor is smaller than that of the second resistor, and when the LED tube lamp is operating normally and a current of the LED module is within a normal range, the second electronic switch enters a cutoff state and the first electronic switch enters a conducting state, causing the thyristor to enter a cutoff state by an electric potential at the second terminal of the symmetrical trigger diode, thus causing the protection circuit to not be in the protection state.

18. The LED tube lamp according to claim 15, wherein the resistance of the first resistor is smaller than that of the second resistor, and when a current of the LED module exceeds an overcurrent value, the second electronic switch enters a conducting state and the first electronic switch enters a cutoff state, causing the thyristor to enter a conducting state by an electric potential at the second terminal of the symmetrical trigger diode, thus causing the protection circuit to be in the protection state in which the voltage between the first filtering output terminal and the second filtering output terminal is restrained or clamped down on.

19. The LED tube lamp according to claim 15, wherein the protection circuit further includes a zener diode connected to the third resistor in parallel, which zener diode is used to limit or restrain the voltage across the third resistor.

20. The LED tube lamp according to claim 15, wherein the protection circuit further includes another capacitor and another resistor, a node connecting said another capacitor and said another resistor is to receive the current detection signal, said another resistor has one end connected to the voltage division circuit, and said another capacitor has one end connected to the second filtering output terminal.

21. The LED tube lamp according to claim 9, the protection circuit further includes a diode coupled to the first filtering output terminal and the second filtering output terminal, wherein the diode enters a conducting state when a level of the filtered signal between the first filtering output terminal and the second filtering output terminal reaches a breakdown voltage of the diode.

22. The LED tube lamp according to claim 9, further comprising an anti-flickering circuit coupled between the filtering circuit and the LED driving module, for receiving and consuming partial energy of the filtered signal so as to reduce the incidence of ripples of the filtered signal disrupting or interrupting light emission of the LED module.

23. The LED tube lamp according to claim 22, wherein the anti-flickering circuit includes at least a resistor connected between the first filtering output terminal and the second filtering output terminal.

24. The LED tube lamp of claim 1, wherein:
the protection circuit is connected to a first terminal and second terminal of the LED lighting module, and is configured to control whether or not to enter the protection state based on a voltage across and/or a current passing between the first terminal and second terminal.

25. The LED tube lamp of claim 1, wherein:
the protection circuit is connected to a first terminal and second terminal of the LED lighting module, and is configured to limit or restrain the voltage across and/or current passing between the first terminal and second terminal.

26. The LED tube lamp according to claim 1, wherein:
the protection circuit is configured such that when a current passing through the LED module is within a predetermined range below a particular threshold value, the voltage division circuit causes the voltage clamping circuit to be in a cutoff state, causing the protection circuit to not be in the protection state.

27. The LED tube lamp according to claim 26, wherein:
the protection circuit is configured such that, when the current passing through the LED module exceeds the particular threshold value, the voltage division circuit causes the voltage clamping circuit to enter a conducting state, causing the protection circuit to be in the protection state.

28. The LED tube lamp according to claim 1, wherein the biasing voltage is provided by the filtering circuit.

29. The LED tube lamp according to claim 4, wherein the voltage division circuit comprises a first electronic switch, a second electronic switch, a first resistor, a second resistor, a third resistor, and a fourth resistor, wherein the third resistor has an end connected to the second terminal of the symmetrical trigger diode and another end connected to the second filtering output terminal; the first resistor has an end connected to the second terminal of the symmetrical trigger diode and another end connected to the first electronic switch, which is connected to the second filtering output terminal; the second resistor has an end connected to the second terminal of the symmetrical trigger diode and another end connected to the second electronic switch and first electronic switch; the second electronic switch is connected to the second filtering output terminal and is configured to receive the current detection signal; and the fourth resistor has an end connected to the second terminal of the symmetrical trigger diode and another end configured to be connected to the biasing voltage.

\* \* \* \* \*